United States Patent [19]
Matsumoto et al.

[11] Patent Number: 5,376,231
[45] Date of Patent: Dec. 27, 1994

[54] SUBSTRATE FOR RECORDING HEAD, RECORDING HEAD AND METHOD FOR PRODUCING SAME

[75] Inventors: Shigeyuki Matsumoto, Atsugi; Yasuhiro Naruse, Kanagawa; Genzo Monma, Hiratsuka; Kei Fujita, Sagamihara; Seiji Kamei, Hiratsuka; Yutaka Akino, Isehara; Yasuhiro Sekine, Yokohama; Yukihiro Hayakawa, Atsugi, all of Japan

[73] Assignee: Canon Kabushiki Kaisha, Tokyo, Japan

[21] Appl. No.: 871,188

[22] Filed: Apr. 20, 1992

[30] Foreign Application Priority Data

| Apr. 20, 1991 | [JP] | Japan | 3-115222 |
| Apr. 20, 1991 | [JP] | Japan | 3-115223 |
| Apr. 20, 1991 | [JP] | Japan | 3-115228 |
| Apr. 20, 1991 | [JP] | Japan | 3-115238 |
| Apr. 20, 1991 | [JP] | Japan | 3-115239 |
| Apr. 20, 1991 | [JP] | Japan | 3-115240 |
| Apr. 20, 1991 | [JP] | Japan | 3-115241 |

[51] Int. Cl.$^5$ .................. H01L 21/306; B44C 1/22; C23F 1/00
[52] U.S. Cl. .................. 156/656; 156/657; 156/659.1; 346/140.1
[58] Field of Search .............. 156/633, 634, 643, 655, 156/656, 657, 659.1, 662, 668; 252/79.1, 79.5; 346/1.1, 140 R; 430/329, 15, 30, 81, 228, 229, 238, 241, 245, 187; 427/569, 579

[56] References Cited

U.S. PATENT DOCUMENTS

| 4,313,124 | 1/1982 | Hara | 346/140 R |
| 4,345,262 | 8/1982 | Shirato et al. | 346/140 R |
| 4,429,321 | 1/1984 | Matsumoto | 346/140 R |
| 4,459,600 | 7/1984 | Sato et al. | 346/140 R |
| 4,463,359 | 7/1984 | Ayata et al. | 346/1.1 |
| 4,558,333 | 12/1985 | Sugitani et al. | 346/140 R |
| 4,723,129 | 2/1988 | Endo et al. | 346/1.1 |
| 4,740,796 | 4/1988 | Endo et al. | 346/1.1 |
| 4,957,592 | 9/1990 | O'Neill | 156/644 |
| 4,968,992 | 11/1990 | Komuro | 346/1.1 |
| 5,007,984 | 4/1991 | Tsutsumi et al. | 156/656 |

FOREIGN PATENT DOCUMENTS

| 0159621 | 10/1985 | European Pat. Off. |
| 0268021 | 5/1988 | European Pat. Off. |
| 0378439 | 7/1990 | European Pat. Off. |
| 54-056847 | 5/1979 | Japan |
| 57-072867 | 5/1982 | Japan |
| 59-123670 | 7/1984 | Japan |
| 59-138461 | 8/1984 | Japan |
| 60-071260 | 4/1985 | Japan |
| WO850928 | 2/1985 | WIPO |

OTHER PUBLICATIONS

Journal of the Electrochemical Society, White, "Bi-layer Taper Etching of Field Oxides and Passivation Layers" vol. 127, No. 12, pp. 2687–2693, Dec. 1980.

Primary Examiner—William A. Powell
Attorney, Agent, or Firm—Fitzpatrick, Cella, Harper & Scinto

[57] ABSTRACT

A method for producing a substrate for a recording head wherein a plurality of electro-thermal converting elements, a plurality of driving functional elements for respectively driving the electro-thermal converting elements and a plurality of wiring electrodes for respectively connecting each of the driving functional elements and each of the electro-thermal converting elements are formed on a supporting member by photolithography comprises forming the wiring electrodes by etching a material layer for the wiring electrodes while etchingwise removing a photoresist for masking the material layer for the wiring electrodes.

54 Claims, 33 Drawing Sheets

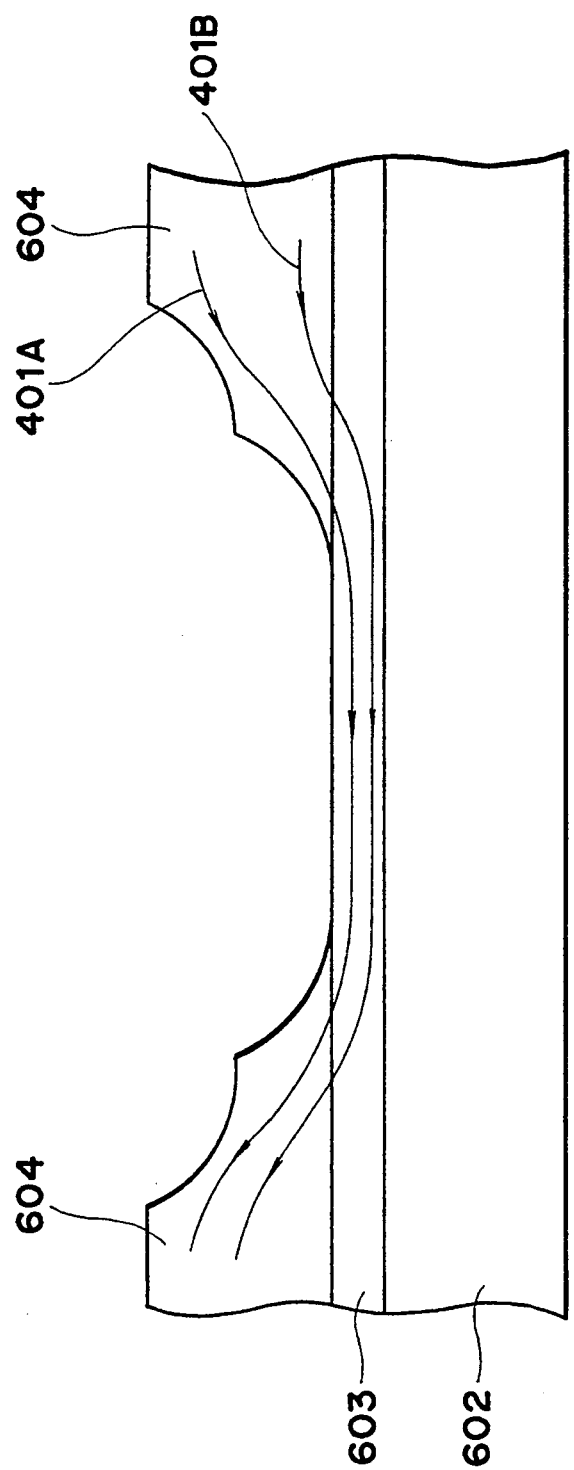

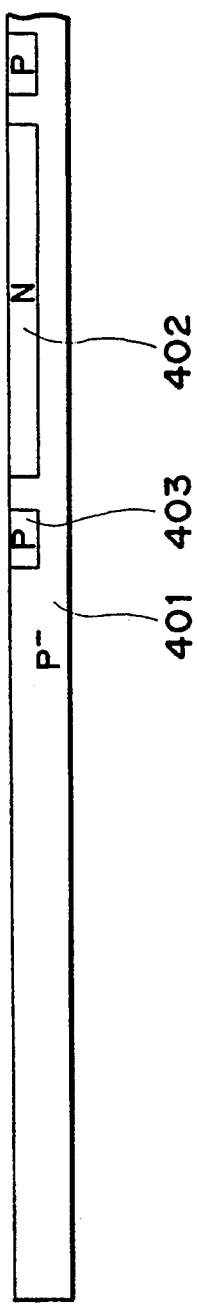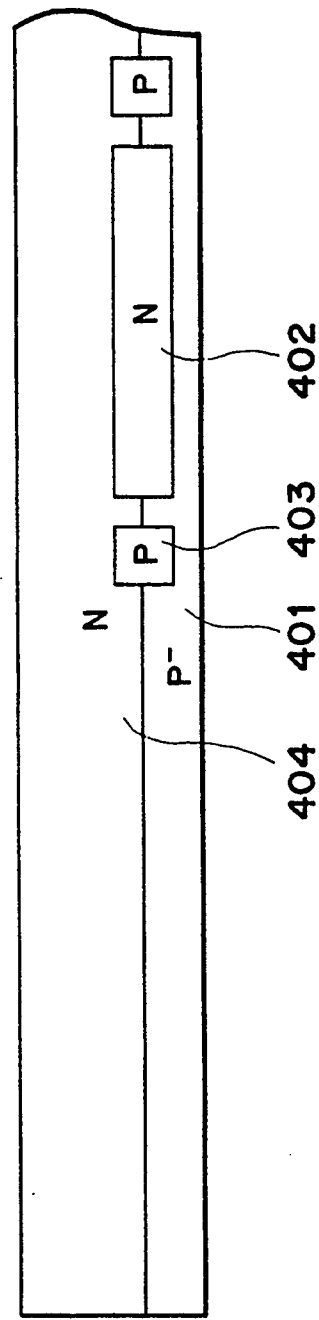

SUBSTRATE FOR RECORDING HEAD, RECORDING HEAD AND METHOD FOR PRODUCING SAME

BACKGROUND OF THE INVENTION

1. Field of the Invention

The present invention relates to a method of producing a substrate for a recording head wherein an electrothermal converting element and a recording function element are formed on a supporting member and to a method of producing a recording head employing the substrate for a recording head. Particularly the present invention relates to a method for producing a recording head and a substrate used for the recording head which are utilized in a recording head apparatus for a copying machine, a facsimile, a word processor, an out-put printer of a host computer and an out-put printer for video apparatus.

2. Related Background Art

Conventionally, a recording head comprises an electro-thermal converting element formed on a supporting member of single-crystal silicon and a driving functional element for driving the electro-thermal converting element such as a transistor array and so forth disposed out of the supporting member, wherein connecting of the electro-thermal converting element and the transistor array is carried out by a flexible wire or wire bonding.

An ink discharging recording head having an electro-thermal converting element and a driving functional element formed on the same supporting member for simplifying the structure of the aforementioned head constitution and reducing a defect generated in the manufacturing process and also for uniforming and improving the reproducibility of the characteristics of each element, which is proposed in Japanese Patent Application Laid-Open No. 57-72867 (corresponding to U.S. Pat. No. 4,429,321), is known.

FIG. 25 is a cross-sectional view of a part of a substrate for a recording head according to the aforementioned constitution. Numeral 901 is a semiconductor supporting member composed of a single-crystal silicon. 904 is an epitaxial region of n-type semiconductor and 911 is an ohmic contact region of a n-type semiconductor with high concentration of impurity. 905 is a base region of a p-type semiconductor, 910 is an emitter region of a n-type semiconductor with high concentration of impurity and a bipolar transistor. 930 is composed thereby. 921 is a heat accumulating layer and 922 is an oxidized silicon layer as an interlaminar insulating layer. 923 is a heat-generating resistance layer, 924 is a wiring electrode of aluminum (Al) and 925 is an oxidized silicon layer as a protecting layer and a substrate 900 for a recording head is composed of these. Here, 920 acts as a heat generating portion. A recording head is completed by forming a ceiling plate and liquid pathes on the substrate 900.

Thus the bipolar transistor 930 has a n-p-n transistor structure comprising two high concentration n-type collector regions 911 formed on a n-type collector buried region 902 and the p-type silicon supporting member 901 through the n-type collector buried region 102, two high concentration p-type base region 908 formed inside of the high concentration n-type collector 911 on the n-type collector buried region 902 and through a p-type base buried region 905, and the high concentration n-type emitter region 910 formed between a high concentration p-type base regions 908 through the p-type base region 905 and on the n-type collector buried region. The bipolar transistor 930 acts as a diode by connecting the high concentration n-type collector region 911 and the high concentration p-type base region 908 with a collector base common electrode 912. Further a p-type isolation buried region 903 as an element separating region, a p-type isolation region 906 and a high concentration p-type isolation region 909 are formed successively. A heat generating layer 923 is formed on the p-type silicon supporting member 901 through a n-type epitaxial region 904, a heat accumulating layer 921 and an interlaminar layer 922. By cutting a wiring electrode 924 formed on the heat resistance layer 923, a heat generating member 920 is formed. Further the top surface of the supporting member 900 for an ink discharging recording head is covered by a first protective film 925 and the first protective film 925 covering the range from the high concentration n-type emitter region 910 of the bipolar transistor 930 to the heat generating member 920 is covered further by a second protective film 926. An ink jet recording head substrate 900 having a structure as above mentioned can be manufactured by a process for a semiconductor utilizing a known photolithographic technique.

Although the aforementioned structure shows improved performances, in order to satisfy requirements to be demanded strongly for a recording apparatus such as a high speed driving, energy saving, high density integration, cost reduction and higher reliability, still further developments are necessary.

FIGS. 26A to 26E are illustrative views of processes of etching of a material layer 824 for wiring electrode on the heat generating member 920. A material layer 824 for a wiring electrode (for example, Al) is formed entirely on the heat generating resistance layer 923, a photoresist for masking 1000 is coated entirely on the material layer 824. After exposing the photoresist 1000 by light with a mask and developing to remove the photoresist corresponding to the portion to be etched of the material layer 824 for the wiring electrode (FIG. 26A). Then the material layer 824 for the electrode is etched by an etching liquid, and at the portion of material layer for the electrode where the photoresist for masking 1000 is removed an electrode for wiring 924 is etched slowly and successively is formed by cutting the material layer for wiring 824 (FIGS. 26B to 26D). The remained photoresist for masking 1000 is removed after forming the electrode 924 (FIG. 26E).

However, in the aforementioned substrate 900 for an ink jet recording head, since the edge part 924-1 of the wiring electrode 924 on the heat generating portion 920 may tend to form near perpendicular shape as shown in FIG. 26E, the problem described below is taken place.

(1) When an electric current is sent from the high concentration n-type emitter portion 910 to the wiring electrode 924, the current of electricity is concentrated in the lower part of 924-1 as shown by arrows in FIG. 27. That is, according to an experimental result the current density of edge part 924-1 reaches to $8.2 \times 10^7$ A/cm$^2$ and it is outstandingly large value compared with $1.7 \times 10^6$ A/cm$^2$ of that in the wiring electrode 924 and $1.03 \times 10^7$ A/cm$^2$ of that of the central part of the heat generating resistance layer 923. It has been considered that the concentration of the current in the lower part of the edge part 924-1 results breaking of a part of the heat generating resistance layer 923 and may deteriorates the life time of a liquid discharging recording head.

In general, in a conventional substrate for recording head, when the wiring material such as Al, etc. is removed by a wetting treatment, since the Al is removed isotropically the material may be mostly formed to a shape of electric resistance member namely a heat generating member as shown in FIG. 27. While if wiring electrode 908 is removed by a dry etching method such as RIE method as so on, the edge part 910 as the connecting portion of Al will tend to shape more perpendicularly. When thus shaped electric-thermal converting element is driven, the current passes by applying with electric voltage as an arrows as shown in FIG. 27. As a result, the concentration of the current density in edge part 907A or 907B of the heat generating resistance layer may break a part of the heat generating resistance layer 907.

(2) For improvement the coverage of the heat generating portion 920, since a thickness of a first protective film 925 is necessary to provide for example, about 1.0 $\mu$m, and the protective layer 925 acts a heat resistance layer against to heat conduction of the heat energy from the heat generating portion 920 to a liquid (ink) to be discharged, the driving power for the heat resistance layer 923 has to be large and a deterioration of a frequency characteristics caused by the delay of heat conduction may occur and as a result, this is one of factors to prevent from the saving consumption of energy and the developing higher performance apparatus.

In more detail, there is necessity to make the thickness of the interlaminar layer 906 and the protective film 909 to be about 1.25 $\mu$m and about 1.0 $\mu$m respectively for well step-covering because the edge part 910 for the connection surface of the electrode and the each wall is stood perpendicularly.

The thickness as about 1.25 $\mu$m, relatively thick for the interlaminar layer, deteriorates remarkably the through put of an apparatus and is a bottle necking for the cost reduction.

The too much thickness of about 1.0 $\mu$m as a protective film acts as a heat resistance against the heat conduction of the heat generated at the heat generating portion 940 to an ink, therefore the driving power for the resistance member has to be large and a deterioration of a frequency characteristics caused by the delay of heat conduction may occur.

The existing of the relatively thick film as insulating film has prohibit from making higher the performance of a conventional heat and saving electricity consumption.

Furthermore, conventionally an interlaminar film 906 and a protective film 909 and etc. have formed by a method such as a normal pressure CVD or PCVD utilizing PSG (phosphoric silicate glass: $SiO_2$ film containing phosphorus (P); formed from $PH_3 + SiH_4 + O_2$), BPSG (boron phosphoric silicate glass: $SiO_2$ film containing boron (B) and phosphorus (P); formed from $B_2H_6 + PH_3 + SiH_4 + O_2$), SiO, $SiO_2$, SiON and SiN at 0°–450° C. At this temperature range, on a wiring, an electrode, etc. made of Al, etc., when the film is deposited (grown) by CVD method, a rising made of Al and etc., named hillrock, (often the height and diameter are about 2 $\mu$m) is generated and grown, finally the irregularity of the hillrock 204 may make short-circuit, for example, between the emitter electrode 201 and the wiring electrode 202 or between these wirings and a protective film made of Ta (for example a protective film 926 shown in FIG. 25) and may result a fault of the action and lowers the efficiency of the production.

SUMMARY OF THE INVENTION

An object of the present invention is to provide a method for manufacturing a substrate for recording head and a recording head employing the substrate with long life time and durability at low cost and at high efficiency by solving the technological problems as before mentioned.

Another object of the present invention is to provide a method for manufacturing a substrate for a recording head and a recording head employing the substrate, capable of high speed recording and recording with a high resolution.

Still another object of the present invention is to provide a method for manufacturing an energy saving type substrate for a recording head and a recording head employing the substrate with less electricity consumption.

According to a first aspect of the present invention, there is provided a method for producing a substrate for a recording head wherein a plurality of electro-thermal converting elements, a plurality of driving functional elements for respectively driving said electro-thermal converting elements, and a plurality of wiring electrodes for respectively connecting said driving functional elements and said electro-thermal converting elements are formed on a supporting member by photolithography, which comprises forming said wiring electrodes by etching a material layer for said wiring electrodes while etchingwise removing a photoresist for masking said material layer for said wiring electrodes.

According to a second aspect of the present invention, there is provided a method for producing a recording head including the step of forming a substrate for said recording head by forming a plurality of electro-thermal converting elements, a plurality of driving functional elements for respectively driving said electro-thermal converting elements and a plurality of wiring electrodes for respectively connecting each of said electro-thermal converters and each of said driving functional elements on a supporting member by photolithography and the step of forming an ink discharging portion having a plurality of ink discharging openings for discharging an ink on said substrate for said recording head, which comprises a wiring electrode etching step of forming said wiring electrodes by etching a material layer for said wiring electrodes while etchingwise removing a photoresist for masking said material layer for said wiring electrodes in the step of forming said substrate.

According to a third aspect of the present invention, there is provided a method for producing a substrate for an ink jet recording head wherein a group of electro-thermal converting elements, a group of functional elements for respectively driving each of the group of electro-thermal converting elements, and a group of wiring electrodes for connecting each of the group of functional elements and the electro-thermal converting elements are formed on a supporting member by photolithography, which comprises a wiring electrode group etching step of forming stepwise the connecting face of each electrode of the group of wiring electrodes by etching of plural times while etchingwise removing a photoresist for masking.

According to a fourth aspect of the present invention, there is provided a method for producing an ink jet recording head including a substrate forming step of forming a substrate by forming a group of electro-thermal converting elements, a group of functional elements for respectively driving each of the group of electro-thermal converting elements, and a group of wiring electrodes for connecting each of the group of functional elements and the electro-thermal converting elements on a supporting member and an ink discharge portion forming step of forming an ink discharging portion having a plurality of ink discharging openings for discharging an ink on the substrate by photolithography, which comprises a wiring electrode group etching step of forming stepwise the connecting face of each electrode of the group of wiring electrodes by etching of plural times while etchingwise removing a photoresist for masking in the substrate forming step.

According to a fifth aspect of the present invention, there is provided a method for producing a substrate for a recording head wherein a plurality of electro-thermal converting elements, driving functional elements for respectively driving the electro-thermal converting elements, a plurality of wiring electrodes for respectively connecting each of the driving functional elements and each of the electro-thermal converting elements and an electrical isolation film formed on the wiring elements are formed on a supporting member by photolithography, which comprises forming the electrical isolation film by depositing a material for the electrical isolation film on the wiring electrodes while changing the temperature of the supporting member from a low temperature to a high temperature.

According to a sixth aspect of the present invention, there is provided a method for producing a substrate for a recording head comprising a plurality of electro-thermal converting elements and driving functional elements for driving each of the electro-thermal converting element, the method comprising forming a P-type semiconductor layer by epitaxial growth on a P-type semiconductor supporting member and forming the driving functional elements utilizing said P-type semiconductor.

According to a seventh aspect of the present invention, there is provided a method for producing a recording head including a substrate forming step of forming a substrate for the recording head by forming a plurality of electro-thermal converting elements, driving functional elements for driving each of the electro-thermal converting element, a plurality of wiring electrodes for connecting each driving functional element and the electro-thermal converting element and an electrical isolation film provided on the wiring electrodes on a supporting member and an ink discharge portion forming step of forming an ink discharging portion having a plurality of ink discharging openings for discharging an ink on the substrate for the recording head, which comprises a deposition step of forming the electrical isolation film by depositing a material for the electrical isolation film on the wiring electrodes while changing the temperature of the supporting member from a low temperature to a high temperature in the substrate forming step.

In according to the present invention, an electric current concentration in the edge portion of an electro-thermal converting element can be largely relaxed because of contacting the electro-thermal converting element with the connecting edge part of the wiring electrode by inclined faces mutually.

And also in according to the present invention, since the connected edge part of a wiring electrode of the base member has inclined surface, an unevenness generated by forming of the wiring electrode can be formed flatly and it has sufficient step-coverage, to make thin both the inter-layer film and the protecting film can be achieved.

Thus, by thinning films, the thermal conductive effectivity is improved and as a result, a recording head with low electric energy consumption and good responsibility to frequency can be accomplished at a low cost. And also by relaxation of the electric current concentration a support for a recording head and a recording head can be obtained with elonged life and uniform characteristics.

As a result, in according to the present invention, a support for a recording head and recording head with high reliability and high uniform quality can be manufactured at a low cost.

And also, the present invention provides a recording head and an ink jet recording apparatus with an improved liquid discharging characteristics since high speed action is achieved, switching property is fast, transition characteristics is improved and a proper thermal energy can be provided to a liquid to be discharged because of less parastic effect.

And further, according to the present invention, because an electrical isolation film is deposited on the wiring electrode with varying the temperature of the supporting member from low temperature to high temperature, a growing of hillock can be suppressed.

By integrating the above mentioned effects according to the present invention, the yield of the manufacture of a substrate for a recording head and a recording head can be improved.

BRIEF DESCRIPTION OF THE DRAWINGS

FIG. 31 is a schematic cross-sectional view illustrating an embodiment of a flow of electric current in a heat-generating resistance member of a substrate for a recording head according to the present invention.

FIG. 33 is a schematic cross-sectional view illustrating an embodiment of a step of the manufacturing method of a substrate for an ink jet recording head and an ink jet recording head according to the present invention.

FIG. 34 is a schematic cross-sectional view illustrating an embodiment of a step of the manufacturing method of a substrate for an ink jet recording head and an ink jet recording head according to the present invention.

EMBODIMENTS

As follows the present invention will be described in detail referring the drawings and the present invention is not limited by the following examples and include any way to achieve the object of the present invention.

Figure 1:
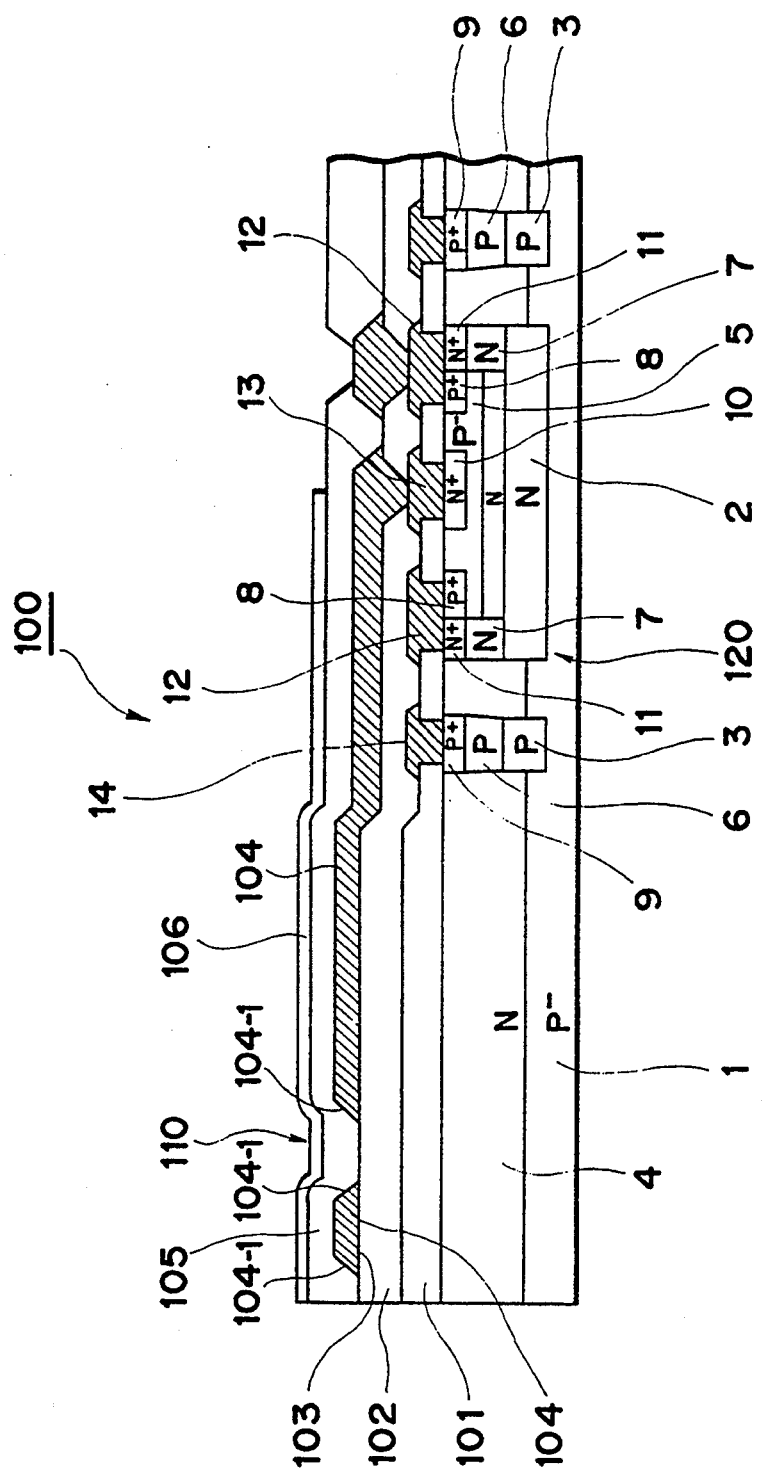
FIG. 1 is a schematic cross-sectional view of an embodiment of a substrate for a recording head according to the present invention.

FIG. 1 is a schematic cross-sectional view of a substrate for a recording head manufactured according to the present invention.

A substrate 100 as a substrate for a recording head comprises a heat generating portion as an electro-thermal converting element 110 and a bipolar type n-p-n transistor 120 as a driving functional element formed on a p-type silicon supporting member.

In FIG. 1, 1 is a p-type silicon supporting member, 2 is a n-type collector buried region for constructing of a functional element, 3 is a p-type isolation buried region for separating the functional element, 4 is a n-type epitaxial region, 5 is a p-type base region for forming the functional element, 6 is a p-type isolation buried region for separating the element, 7 is a n-type collector buried region for constructing an element, 8 is a high concentration p-type base region for constructing an element, 9 is a high concentration p-type isolation region, 10 is a n-type emitter region for constructing an element, 11 is a high concentration n-type collector region for constructing an element, 12 is a common electrode for the collector and the base, 13 is an emitter electrode, 14 is an isolation electrode. Thereon a n-p-n transistor 120 is formed and the collector portions of 2, 4, 7 and 11 are formed so as to surround entirely the emitter region 10 and the base regions of 5 and 8. The each cell is separated electrically surrounded by p-type isolation buried region, p-type isolation region 7 and the high concentration p-type isolation region as the portion for separating elements.

In the above constitution, the n-p-n transistor 120 comprising a n-type buried region 2 and two high concentration n-type collector regions formed on a p-type silicon supporting member a n-type collector buried region 2, the n-type collector buried region 2 and two high concentration p-type base regions 8 formed inside of the high concentration n-type collector region 11 through a p-type base buried region 5, and the n-type collector buried region 2 and the high concentration n-type emitter region 10 formed between a high concentration p-type base region 8 through the p-type base region 5. It acts as a diode by connecting the high concentration n-type collector region 11 and the high concentration p-type base region 8 with a collector base common electrode 12. Further a p-type isolation buried region 3 as an element separating region, a p-type isolation region 6 and a high concentration p-type isolation region are formed in the vicinity of the n-p-n transistor 120 successively. And a heat generating resistance layer 103 is formed on the p-type silicon supporting member 1 through a n-type epitaxial region 4, a heat accumulating layer 101 and an interlayer film 102 formed integratedly with said heat accumulating layer 101. By cutting a wiring electrode 104 formed on 103 the heat resistance layer, a heat generating portion 110 is constructed by forming two edge parts $104_1$ as the connecting surfaces.

Figure 2:
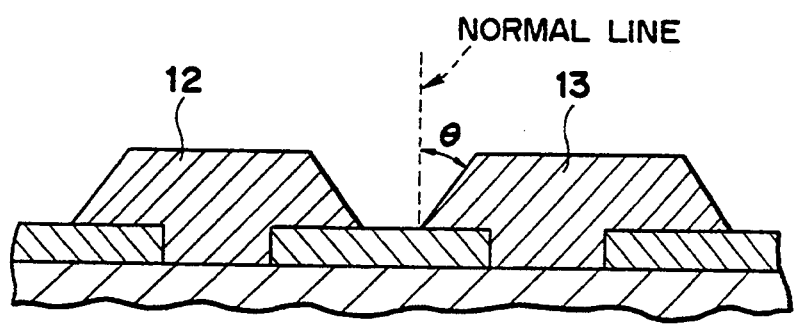
FIG. 2 is a schematic cross-sectional view of an electrode of a substrate for a recording head.

The aforementioned substrate 100 for a recording head is covered entirely on the surface by a heat accumulating layer 101 made of heat oxidized film and etc. and each electrode 12, 13 and 14 from the each element is formed by Al and etc. The electrodes 13 and 14 as shown in FIG. 2 and enlarged views (electrode 14, emitter and base are not shown) in FIG. 3 has side surface (wall) inclined angle of theta (at least 30 to up to 75 degree) to the normal line. Further the top surface of the supporting member 100 of this embodiment comprising the heat accumulating layer 101 thereon formed a collector base common electrode 12, the emitter electrode 13 and the isolation electrode covering the p-type silicon supporting member 1 bearing the above mentioned driving portion (functional element) thereon is covered by an interlayer film 102 composed of silicon oxide film and etc. made by a normal pressure CVD method, PCVD method or spattering method and etc. Since a step coverage capability is sufficient by the causing of that the portion made of the material such as Al constructing each electrode 12, 13 and 14 have inclined side wall, the interlayer film 102 can be formed thinner than that of a conventional method lest the accumulating effect should be lost. Next by partly through holing on the interlayer film and by connecting electrically with the collector base common electrode 12, the emitter electrode 13 and the isolation electrode 14 and a wiring electrode 104 for forming an electrical circuit on the interlayer film 104 is provided. After through holing partly the interlayer film 102, an electrothermal converting element comprising a heat-generating resistance layer 103 of $HfB_2$ and etc. by spattering method and a wiring electrode 104 made of Al and etc. by vapor deposition method or spattering method is provided. The material comprising the heat-generating resistance layer include Ta, $ZrB_2$, Ti—W, Ni—Cr, Ta—Al, Ta—Si, Ta—Mo, Ta—W, Ta—Cu, Ta—Ni, Ta—Ni—Al, Ta—Mo—Al, Ta—Mo—Ni, Ta—W—Ni, Ta—Si—Al, Ta—W—Al—Ni and etc.

Figure 4:
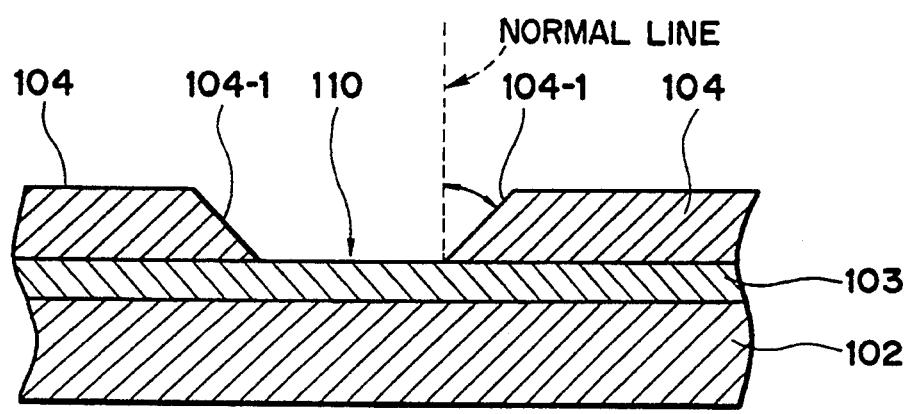
FIG. 4 is a schematic cross-sectional view of an electro-thermal converting element of a substrate for a recording head.
Figure 5:
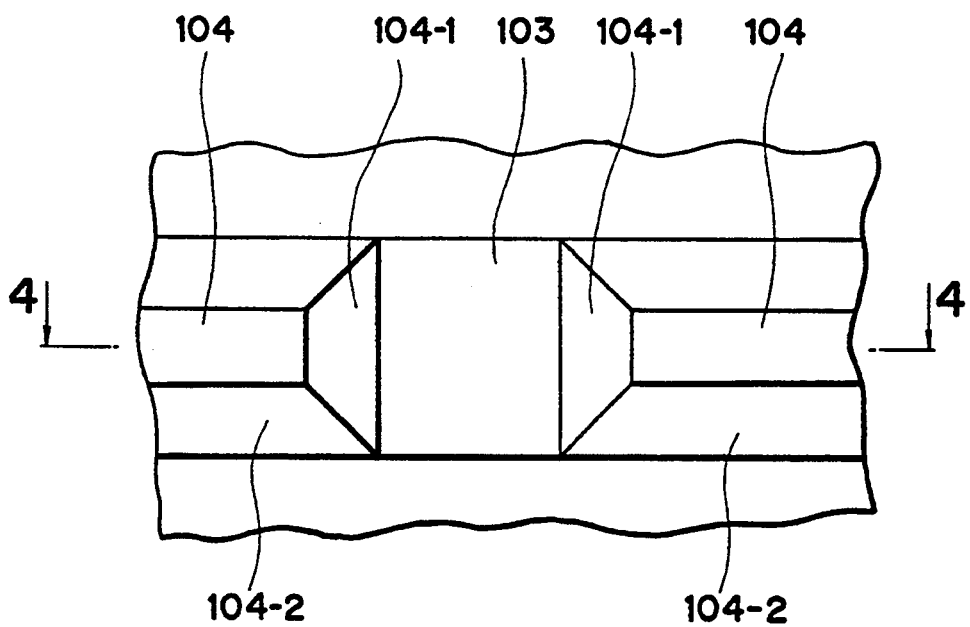
FIG. 5 is a schematic plan view of an electro-thermal converting element of a substrate for a recording head.

FIG. 4 is an enlarged schematic cross-sectional view of an electro-thermal converting element and FIG. 5 is an enlarged schematic plan view of an electro-thermal converting element.

The wiring electrode made 104 of Al and etc. has an edge part $104_1$ and side wall $104_2$ as a connecting surface inclined at least 30 degree to the normal line. As shown in FIG. 1, on a heat generating portion 110 of the electro-thermal converting element a protecting film 105 made of SiO, $SiO_2$, SiN, SiON and etc. and a protecting film 106 made of Ta are formed integratedly with the interlayer film 102 by spattering method or CVD method.

Figure 3:
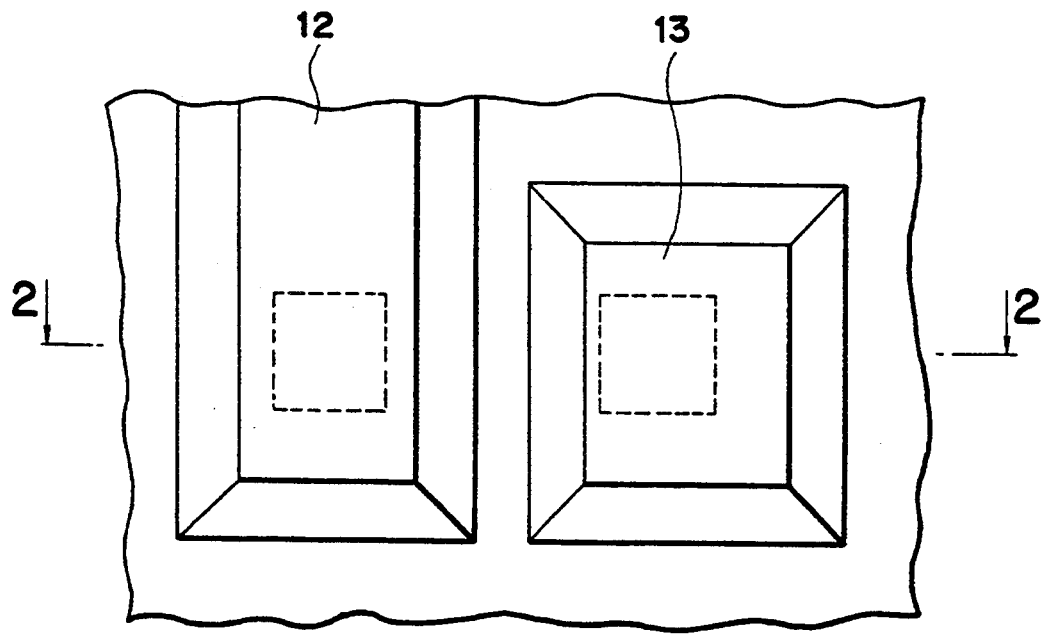
FIG. 3 is a schematic plan view of an electrode of a substrate for a recording head.

Furthermore, it is noted that the substrate 100 has the edge part 104-1 of the wiring electrode 104 being linear tapered and the both side walls 104 (Rf. FIG. 5) which are tapered linearly and the shapes of the collector base common electrode 12, the emitter electrode 13 and the isolation electrode 14 are linear tapered as shown in FIG. 2 and FIG. 3.

Figure 6:
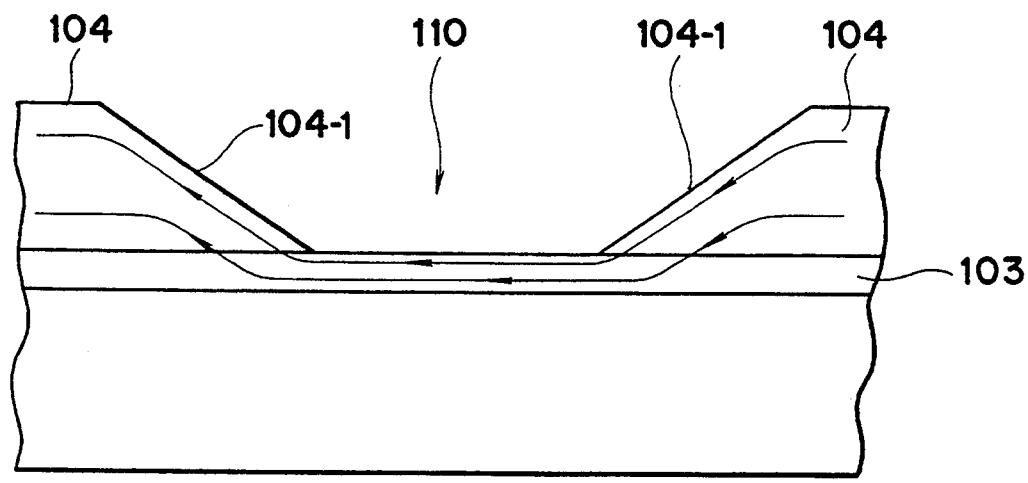
FIG. 6 is a schematic cross-sectional view illustrating a flow of current in a heat-generating resistance member of a substrate for a recording head manufactured according to the present invention.

Therefore, in the substrate 100, electric current in the heat generating portion 110 is not concentrated in lower portion of edge part of 104-1 of the wiring electrode 104 as shown in FIG. 6.

In according to an experimental result, $8.2 \times 10^7$ A/cm$^2$ of the electric current density in the case of the edge part 104-1 of the wiring electrode 104 being nearly perpendicular shape can be reduced to $2.6 \times 10^7$ A/cm$^2$ by forming the tapered shaped edge of the electrode. By the effect, since the heat-generating resistance layer 23 can be prevented from partly shorting, on an experimental example a durability of a recording head mounting this support member 100 can be elonged remarkably to $1\times10^7$ pulses from $7\times10^9$ pulses for a conventional one.

Since a step coverage capability in the first protecting film 105 is improved markedly, thickness of the first protecting film 105 can be thinned (for example, from 1.0 μm to 0.6 μm) compared with the case of the perpendicular shape of the edge part 104-1. Consequently the heat energy generated at the heat generating portion 110 can be conducted effectively and speedy to an ink to be discharged and the through put of an apparatus for forming the protecting film 105 increased to about two times.

Furthermore, on formation of the interlayer film 102 and the protecting film 105 and etc. made of SiO, SiON or SiN and etc. by PCVD method a method where at the initial stage of film formation after the lower layer of the film is formed at low temperature as 150°–250° C. and then the upper layer of the film is grown thereon at 250°–450° C. is conducted. In this method, since the layer formed at lower temperature tends to suppress a grow of a hillock the above mentioned shorting of wiring by a hillock is reduced compared with the case of the film forming one time at 250°–450° C. and the yield of production is remarkably improved. Hereinafter regarding other electrode than the wiring electrode, edge part (connecting surface) is also represented as a side wall.

Figure 7:
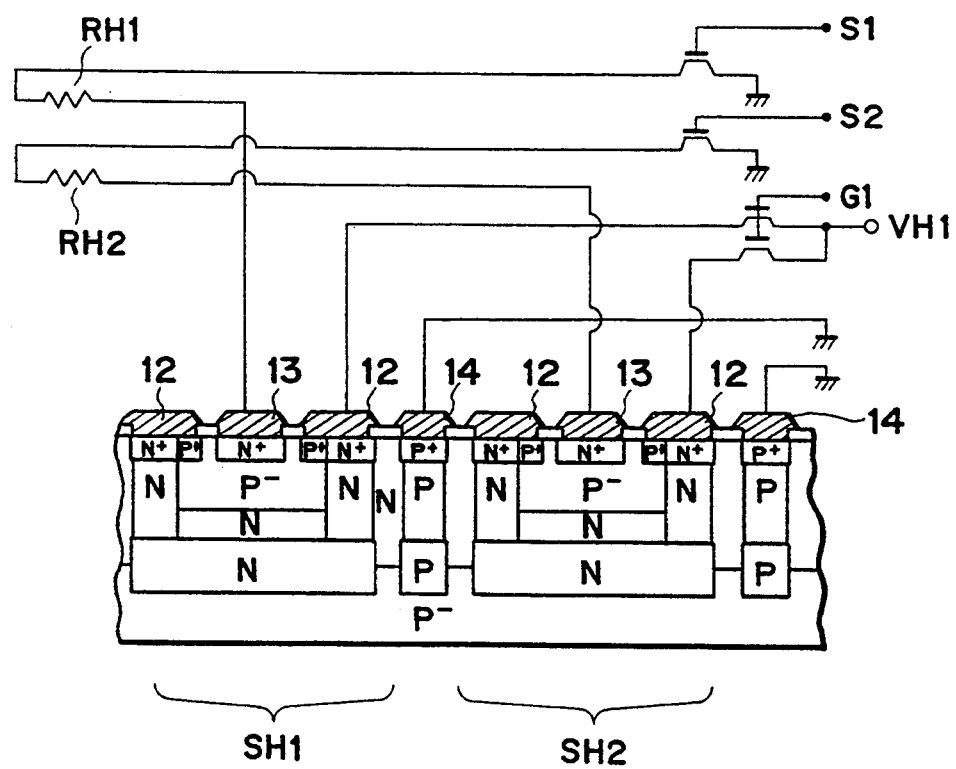
FIG. 7 is a schematic view illustrating the driving method of a recording head manufactured according to the present invention.

Next, a principal action of the functional element (driving portion) will be described as follows. FIG. 7 is a schematic view illustrating the driving manner of the substrate 100 in FIG. 1.

In this example, the collector-base common electrode 12 as shown in FIG. 1 and FIG. 7 corresponds to the anode electrode of the diode and the emitter electrode 13 corresponds to the cathode electrode of the diode. Namely, by applying the collector-base common electrode positive bias potential ($V_{HI}$) NPN transistor in the cell (SH1, SH2) turns on and the bias current as a collector current and a base current flows from the emitter electrode 13. By the combined constitution of the base and the collector, the temperature rising and falling characteristics of the electro-thermal converting element (RH1 and RH2) is improved and subsequently the occurrence of film boiling thereby controlling of the growth and contract of bubble is also improved and consequentoy the ink discharging is conducted stably. This fact suggests that the relevancy between the characteristics of transistor and the characteristics of film boiling is strong in a ink jet recording head utilizing thermal energy and since accumulation of minor carrier in a transistor is less, the switching characteristics becomes to faster and the rising characteristics is improved more than those expected. Also since a parasitic effect is relatively low and scattering among elements is small, driving current is obtained stably.

In this example, furthermore the construction so that by earthing the isolation electrode, flowing of a charge into other neighbor cell and wrong action of the other element should be prevented is provided.

In such semiconducter device, to keep the concentration of the N type buried region 2 to be at least $1\times10^{18}$ cm$^{-3}$, to keep the concentration of the P type base region 5 to be $5\times10^{14}$ to $5\times10^{17}$ cm$^{-3}$ to keep small the area of connection between the high concentration base region 8 and the electrode are desired. By employing the construction as above described, a leakage of current from the NPN transistor to the P type silicon supporting member 1 and a leakage of current through the isolation region to the ground are prevented.

The driving method of the above substrate will be described more in detail below.

Although only two semiconductor functional elements (cells) is shown in FIG. 7, actually the same numbers of the functional elements like this corresponding to the number (for example 128) of the electric-thermal converting element are disposed at regular intervals and are connected electrically as matrix so as to enable a block driving. To brief explanation hereinafter the driving of the electric-thermal converting element RH1 and RH2 as two segments for one group will be described.

To drive the electric-thermal converting element RH1, by a switching signal S1 the group is selected and simultaneously the electric-thermal converting element RH1 is selected. Then the diode cell SH1 comprising transistor constitution is supplied electric current by a positive bias consequently the electric-thermal converting element RH1 generates heat. This thermal energy gives rise the change of state of a liquid and makes bubble to discharge liquid through an orifice.

Similarly, to drive the electric-thermal converting element RH2, by switching signals G1 and S2 the electric-thermal converting element RH2 is selected and the diode cell SH2 is driven, consequently current is supplied to the electric-thermal converting element.

In this case, the P type silicon supporting member 1 is earthed through the isolation region 3, 6 and 9. By disposing the isolating regions 3, 6 and 9 of each semiconductor in this manner the wrong action by electric interference between each semiconductor is prevented.

The substrate 100 thus constructed is able to make a recording head 510 of ink discharging recording system by disposing a sidewall member of liquid path 501 comprising a photosensitive resin and etc. to form liquid path 505 communicated with plural orifices 500 and by disposing a plate member 502 providing an ink supply opening 503. In this case ink supplied from the ink supply opening 503 is storaged in inner common chamber 504 and then the ink is supplied to each liquid path 505 and at the state by driving the heat generating portion 110 of the substrate 100 the ink is discharged from the orifice 500.

Next, the process of manufacturing of the recording head 510 will be described.

Figure 9:
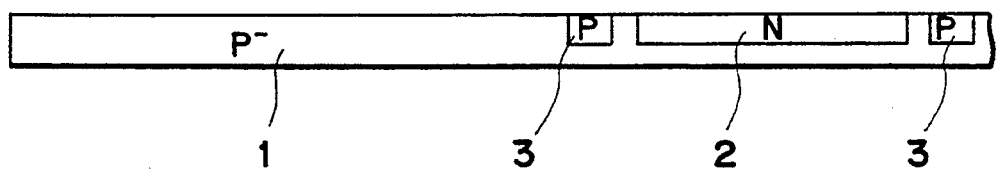
FIG. 9 is a schematic cross-sectional view illustrating an embodiment of a step of the manufacturing method of a substrate for a recording head according to the present invention.

(1) After forming a silicon oxide film with a thickness of about 8000 Å, on a silicon supporting member 1 (the impurity concentration of about $1\times10^{12}$ to $1\times10^{16}$ cm$^{-3}$), the silicon oxide film at the portion forming N type collector buried region 2 of each cell was removed by a photolithography processing. After forming the silicon oxide film, N type impurity (for example P, As and etc.) was ion implanted and N type collector buried region 2 having impurity concentration of at least $1\times10^{18}$ cm$^{-3}$ as formed to a thickness of 2 to 6 μm by thermal diffusion method to make the sheet resistance of 30 ohm/□ or less. Subsequently the silicon oxide film at the region forming P type isolation buried region 3 was removed and after forming the silicon oxide film with a thickness of about 1000 Å. P type impurity (for example B and etc.) was ion implanted and P type isolation buried region 3 having impurity concentration of at least $1\times10^{15}$ to $1 \times 10^{17}$ cm$^{-3}$ as formed to a thickness of 2 to 6 μm by thermal diffusion method. (The above is shown in FIG. 9.)

Figure 10:
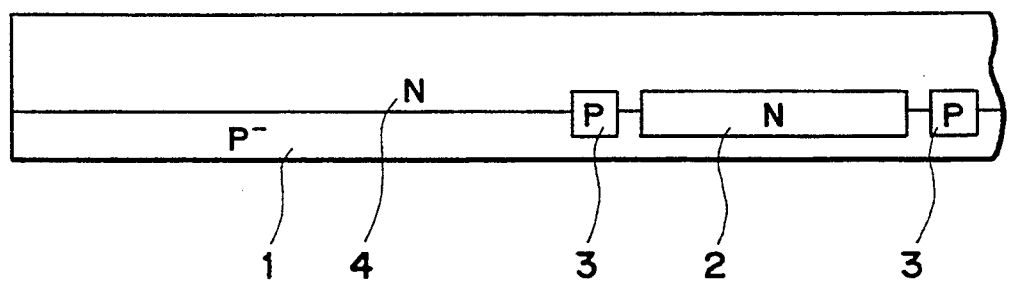
FIG. 10 is a schematic cross-sectional view illustrating an embodiment of a step of the manufacturing method of a substrate for a recording head according to the present invention.

(2) The silicon oxide film entirely was removed and N type epitaxial region 4 (impurity concentration of at least about $1 \times 10^{13}$ to $1 \times 10^{15}$ cm$^{-3}$) was grown epitaxially to have a thickness about 5-20 μm. (FIG. 10)

Figure 11:
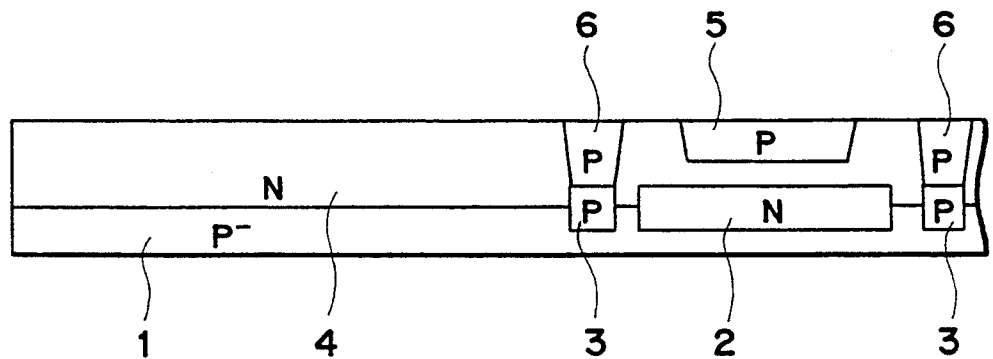
FIG. 11 is a schematic cross-sectional view illustrating an embodiment of a step of the manufacturing method of a substrate for a recording head according to the present invention.

(3) A silicon oxide film with a thickness of about 1000 Å was formed on the surface of the N type epitaxial region 4, thereon a resist was coated and pattern forming was conducted and P type impurity was ion implanted only at the portion to be formed a low concentration P type base region 5. After removing the resist the low concentration P type base region 5 (impurity concentration of at least about $1 \times 10^{14}$ to $1 \times 10^{17}$ cm$^{-3}$) was grown by thermal diffusion method to have a thickness about 5-10 μm. Then, the silicon oxide film entirely was removed and further a silicon oxide film with a thickness of about 8000 Å was formed the silicon oxide film at the portion to be formed a P type isolation buried region 6 was removed, and then BSG film was coated entirely on the surface by CVD method and then P type isolation buried region 6 having impurity concentration of about $1 \times 10^{18}$ to $1 \times 10^{20}$ cm$^{-3}$ formed to a thickness of about 10 μm by thermal diffusion method. In this example, P type isolation buried region 6 can be formed employing BBr$_3$ as the diffusion source (FIG. 11).

(4) After removing the BSG film, an oxidized silicon film with a thickness of about 8000 Å was formed, and after the oxidized silicon film at only the portion for forming a N-type collector region 7 was removed, a N-type collector region 7 ( impurity concentration of about $1 \times 10^{18}$ to about $1 \times 10^{20}$ cm$^{-3}$) was formed by N-type solid phase diffusion and P ion-implantation or by thermal diffusion so that the sheet resistance has 10 ohm/□ or less and it reaches to the collector buried region 5.

In this case, the-thickness of the N-type collector region was about 10 μm. Succeedingly, an oxidized silicon film with a thickness of about 12500 Å was formed and after forming a heat accumulating layer 101 (See FIG. 13), the oxidized silicon film at the cell region was removed selectively and again an oxidized silicon film with a thickness of about 2000 Å was formed.

Figure 12:
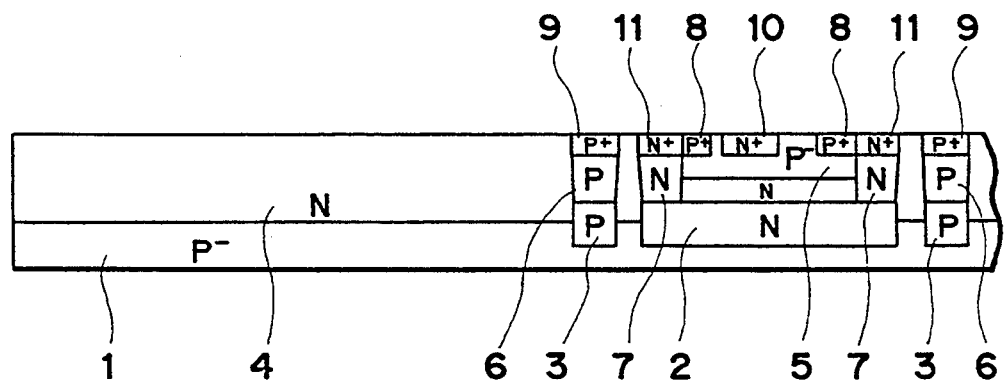
FIG. 12 is a schematic cross-sectional view illustrating an embodiment of a step of the manufacturing method of a substrate for a recording head according to the present invention.

After resist patterning, ion implanting of P-type impurity was conducted into only portion for forming a high concentration base region 8 and a high concentration isolation region 9. After removed the resist, the oxidized silicon film at regions for forming N-type emitter region 10 and a high concentration N-type collector region 11 was removed and then thermal oxidized film was formed entirely, after N-type impurity implantation, N-type emitter region 10 and a high concentration N-type collector region 11 were formed simultaneously by thermal diffusion method. The thicknesses of both the N-type emitter region 10 and the high concentration N-type collector region 11 were 1.0 μm or less and the impurity concentration were about $1 \times 10^{18}$ to about $1 \times 10$ cm$^{-3}$ (FIG. 12).

(5) Further, after removing the oxided silicon film at connecting portion of a part of electrode. Al, etc. were deposited entirely and Al, etc. except a part of the electrode region was removed. The removing of Al was conducted by method for etching while etching back a photoresist which differs from a conventional wet etching method to make an inclined side wall.

Figure 13:
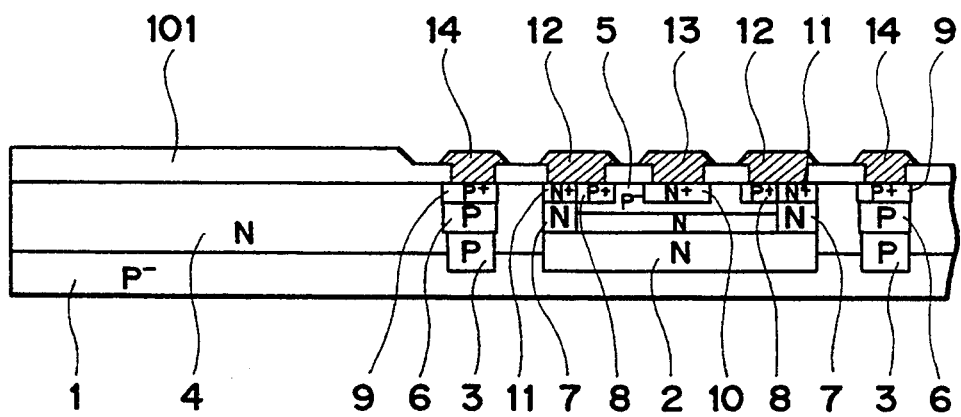
FIG. 13 is a schematic cross-sectional view illustrating an embodiment of a step of the manufacturing method of a substrate for a recording head according to the present invention.

As etchant, an aqueous solution comprising TMAH (tetramethyl ammonium hydroxide) which is used as developer for patterning a resist was employed and the desirable result was obtained, that is, side wall of wiring inclined at about 60 degree to the normal line was formed stably (FIG. 13).

(6) And then, SiO$_2$ film as an interlaminar film 102 also acting as a heat accumulating layer was formed entirely on the surface by spattering method to a thickness of about 0.6 to about 1.0 μm. The interlaminar film 102 can be formed by CVD method. There is not limited only SiO$_2$ but SiO or SiN are available.

Next, for forming an electrical connection, through hole (TH) was formed by opening a part of the interlaminar film 102 corresponding to upper part of the emitter region and the base collector region by photolithography method.

(7) Next, HfB$_2$ as a heat generating resistance layer was deposited on the electrodes 12 and 13 through the through hole (TH) corresponding the upper portions of the emitter region and the base collector region to a thickness of about 1000 Å to obtain an electrical connection.

Figure 15:
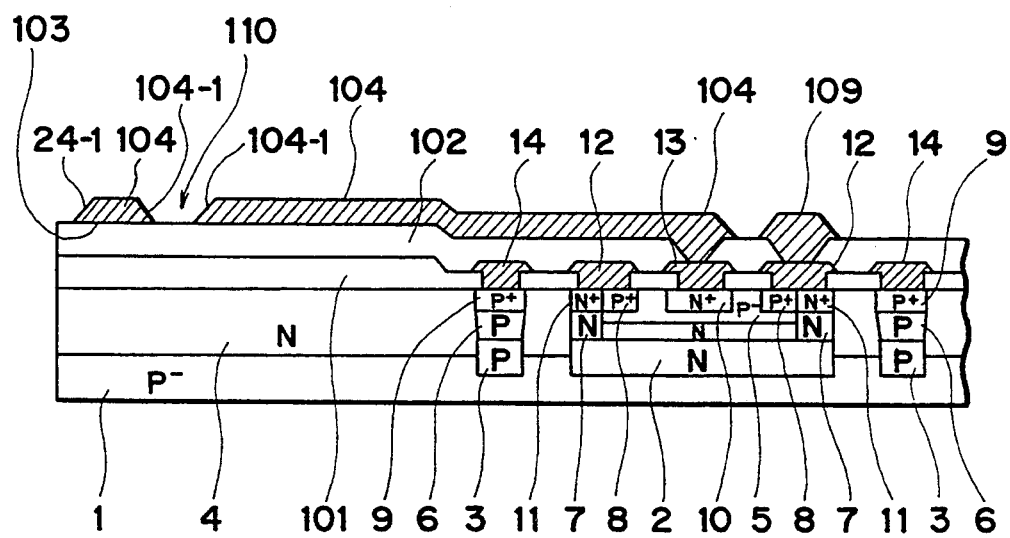
FIG. 15 is a schematic cross-sectional view illustrating an embodiment of a step of the manufacturing method of a substrate for a recording head according to the present invention.

(8) A layer made of Al material was deposited on the heat generating resistance layer 103 as a pair of wiring electrodes 104 of the electric-thermal converting element, a cathode wiring electrode for a diode and an anode wiring electrode 109 for a diode to a thickness about 5000 Å. By patterning Al and HfB$_2$ (the heat generating resistance layer 103), the electric-thermal converting element and the other wiring were simultaneously formed wherein the patterning was conducted similarly by the above method (FIG. 15).

(9) After that, SiO$_2$ layer 105 as a protecting layer for the electric-thermal converting element and as an insulating layer of wiring of Al, etc. was deposited by a spattering method or CVD method to a thickness of about 6000 Å and then Ta as a protecting layer 106 for anticavitation was deposited upon the heating portion of the electric-thermal converting element to a thickness of about 2000 Å.

Figure 16:
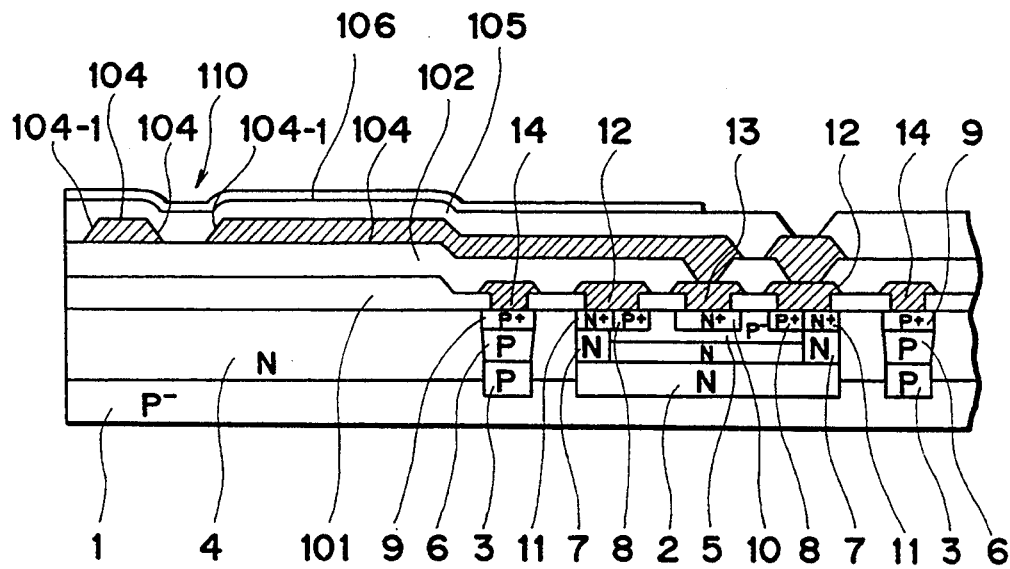
FIG. 16 is a schematic cross-sectional view illustrating an embodiment of a step of the manufacturing method of a substrate for a recording head according to the present invention.

(10) The electric-thermal converting element and Ta and SiO$_2$ film 105 prepared as mentioned above were removed partly to form a pad 107 for bonding. The protecting layer 105 may be made of SiON or SiN as well as SiO$_2$ (FIG. 16).

Figure 17:
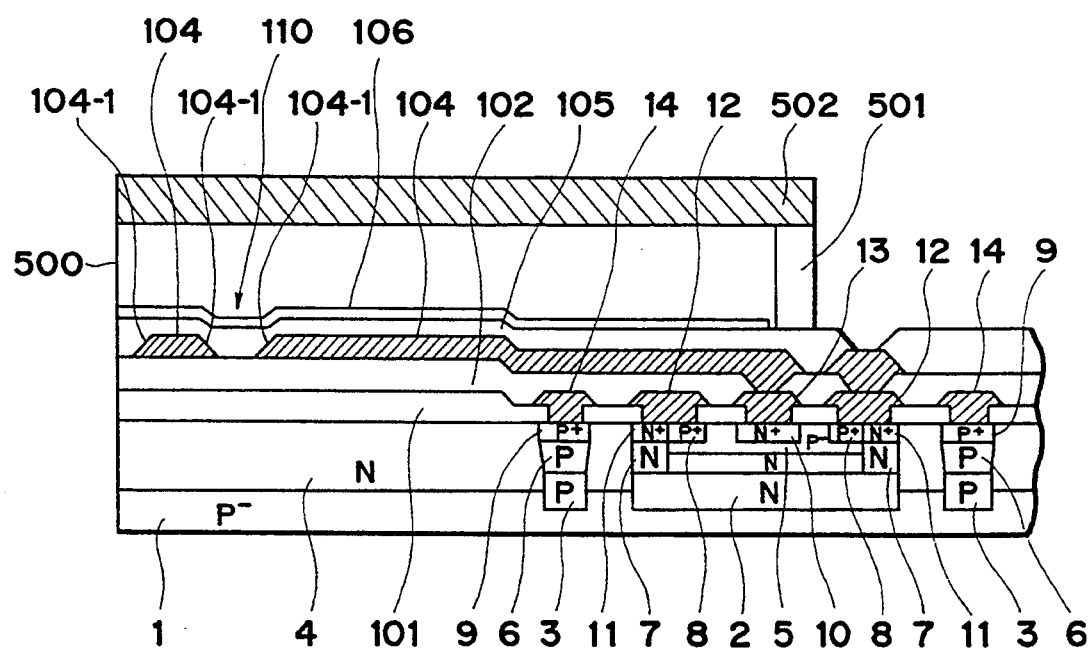
FIG. 17 is a schematic cross-sectional view illustrating an embodiment of a step of the manufacturing method of a substrate for a recording head according to the present invention.

(11) Next on the substrate having a semiconductor element thereon, a liquid path forming member for an ink discharging part 500 and a ceiling plate 502 were disposed and a recording head formed ink path inside them was produced (FIG. 17).

On a plurality of recording heads produced by changing the angle of the edge part to the normal line while controlling the temperature of the etching liquid for tapered etching of Al wiring electrode, examinations of driving by the electric-thermal converting element, recording and operating were conducted. In the operation test, eighth semiconductor diodes were connected for one segment and current of 300 mA (totaly 2.4 A) was flown in each diode. Other semiconductor diodes acted without malfunction and sufficient discharging was obtained. Since the above recording head has good heat conductive efficiency, the driving power was 80% of a conventional one and the high frequency responsibility is excellent. Also, excellent characteristics regarding life time and uniformity were obtained. Dimensional accuracy of wiring, variation of wiring resistance, the ratio of initial good products and durability test were determined. The results are shown in Table 1. The head made of the edge having angle of 30-75 degree to the normal line exhibits particularly excellent results on every test. The head made of the edge having angle of 5 and 28 degree to the normal line exhibited a good result in the durability test and the one having 80 degree of the angle showed moderately good results on dimensional accuracy of wiring and the variation of the wiring resistance.

In this example, wiring electrode 104 having an edge part 104-1 inclined to a heat generating resistance layer and at the same time having side wall 104-2 inclined along to a longitudinal direction of the wiring electrode 104 can be formed (see FIG. 5).

However, taking into consideration the object to relieve the concentration of the current density in the edge part of the heat generating resistance layer, a wiring electrode having a connecting edge surface inclined at 30-75 degree to the normal line is particularly effective but inclined side wall along to the longitudinal direction is not always necessary.

By the manner as described below, the structure having only a connecting edge surface of a wiring electrode inclined and the side wall along the longitudinal direction having near perpendicular inclination as 0-30 degree can be achieved.

Referring to FIG. 18 to FIG. 21 the manner will be described.

Figure 18:
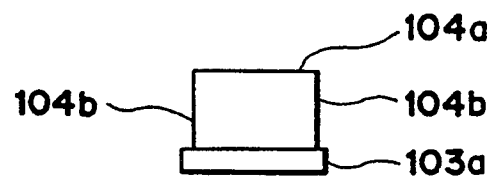
FIG. 18 is a schematic cross-sectional view illustrating another embodiment of a manufacturing method of a substrate for a recording head according to the present invention.

After depositing $HfB_2$ as the heat generating resistance layer 103a and a material layer made of Al for forming a wiring electrode 104a, the heat generating resistance layer 103a and a wiring electrode 104a were formed by repeatedly twice times of the conventional photolithography processing. Etching for a wiring electrode 104 can be conducted by the conventional wet etching method or dry etching method as RIE utilizing Cl based gas. By these methods the side wall 104b along the longitudinal direction of wiring electrode 104a being near perpendicular to the normal line can be obtained (FIG. 18).

Figure 19:
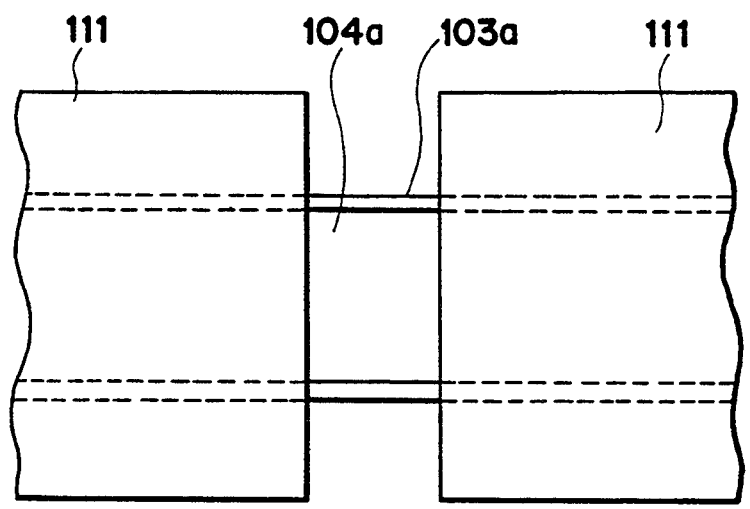
FIG. 19 is a schematic plan view illustrating another embodiment of a manufacturing method of a substrate for a recording head according to the present invention.
Figure 20:
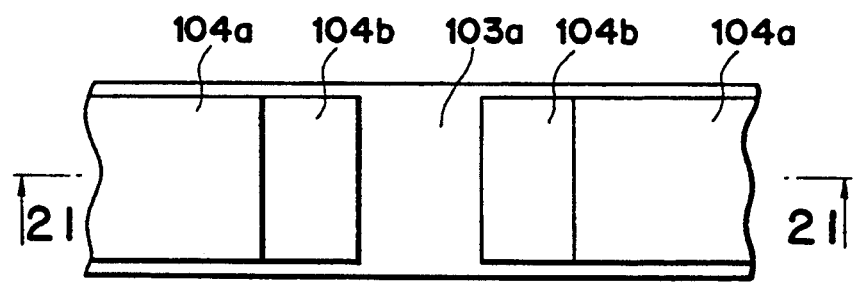
FIG. 20 is a schematic plan view illustrating another embodiment of a manufacturing method of a substrate for a recording head according to the present invention.
Figure 21:
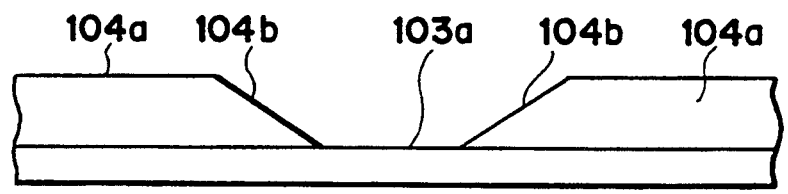
FIG. 21 is a schematic cross-sectional view illustrating another embodiment of a manufacturing method of a substrate for a recording head according to the present invention.

Next, as shown in FIG. 19, regions except the heat generating resistance layer 103a were covered with resist 111 (photoresist for masking) by the conventionally known manner. And a wiring electrode 104a was etched by the same manner as that of forming the emitter electrode, that is, the resist 111 was formed on the wiring electrode 104a so that the resist 111 should not reach to both side surfaces of the wiring electrode 104a when the etching was finished even if the resist 111 was etched back at the etching of wiring electrode 104a. In this case, the etching of the wiring electrode 104a may be conducted by spraying reciprocally two kinds of alkaline liquid comprising TMAH as the main component and being at different temperature. Thus the structure having inclined edge part 104b at only connecting part with the heat generating resistance layer 103 can be obtained (FIGS. 20 and 21).

Another example of a method of producing a substrate for a recording head according to the present invention will be described referring to FIGS. 22A to 22E. These figures are schematic views of processes of etching a material layer 234 for wiring electrode.

Figure 22A:
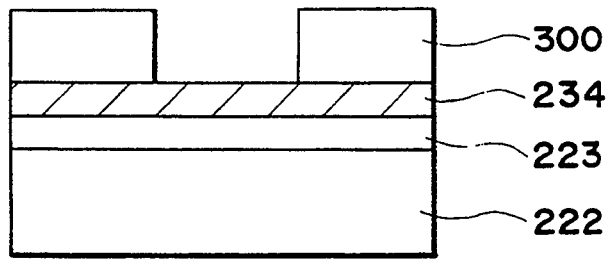
FIGS. 22A to 22E are schematic cross-sectional process views illustrating further another embodiment of a manufacturing method of a substrate for a recording head according to the present invention.
Figure 22B:
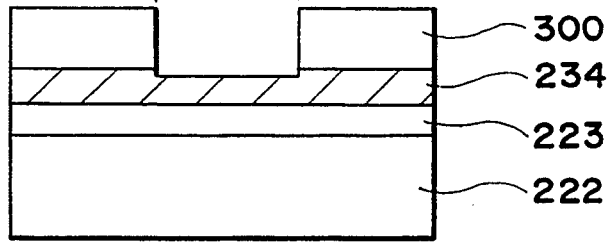
Figure 22C:
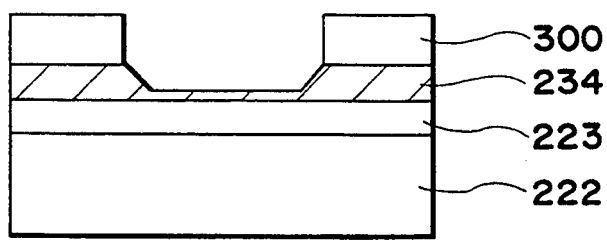
Figure 22D:
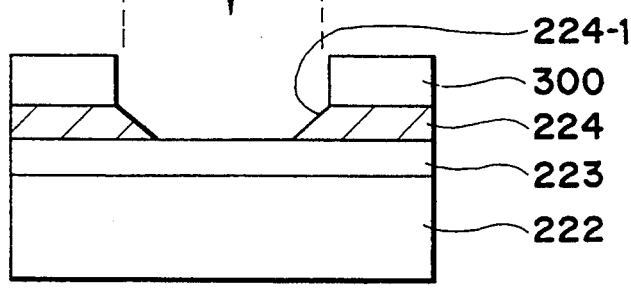
Figure 22E:
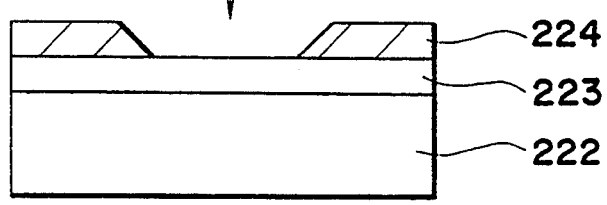

A material layer 234 made of aluminum was formed entirely on a heat generating resistance layer 223. A photoresist for masking (positive type) 300 was coated entirely on the material layer 234. After exposing the photoresist layer 300 with a mask by light and by developing the photoresist 300, the photoresist 300 corresponding to the portion of the material layer for wiring electrode to be etched was removed (FIG. 22A). Then for removing a solvent including in photoresist for masking 300 and for improving the adhesion between the material layer 234 and the photoresist 300, the baking is conducted at 110° C. for 90 seconds and the etching of the material layer for wiring electrode 234 was started by multi-wafer system wet etching. First, the mixture of phosphoric acid ($H_3PO_4$), nitric acid ($HNO_3$) and acetic acid ($CH_3COOH$) heated at 45° C. as etchant for wiring electrode (aluminum) was sprayed for 20 seconds. At this time, since the photoresist for masking 300 acts as a masking material against to the etchant for wiring electrode and does not change the dimension, only the material layer 234 for wiring electrode was etched (FIG. 22B). Next, an alkaline solution comprising tetramethyl ammonium hydroxide (TMAH) as a main component was sprayed for 60 seconds. At this time, since the photoresist for masking 300 was etched by the alkaline solution, the photoresist for masking 300 was etched back. At this state, the above etching solution for wiring electrode was again sprayed for 20 seconds to etch the material layer for wiring electrode 234. At this time, since the material layer for wiring electrode 234 is an amphoteric metal, the material was etched, therefore the shape of etched part of the material 234 was not stepwise but nearly linear (FIG. 22C). Hereinafter by the similar manner, by several cycles of spraying alternatively the alkaline solution and the etchant for the material for wiring electrode, the wiring electrode 224 was formed so that the edge part 241-1 may have linear taper. As above mentioned, after completion of formation of the wiring electrode 224, the remained photoresist 300 was removed (FIG. 22E).

According to an experimental result, since the etching rate of the material for wiring electrode 234 by the above etchant was about 3000 Å/min. and the rate of etching (shift of pattern dimension) of the photoresist for masking 300 was about 1500 Å/min., on the other hand the rate of the etching of the material layer 234 by the above alkaline solution was 600 Å/min. The taper angle (angle of the surface of the wiring electrode to the normal line) $\theta$ of the edge part of the wiring electrode can be controlled desirably by changing the interval of sprayings. In the case of three cycles of alternatively spraying at the time interval as mentioned above, with the alkaline solution and the etchant for wiring electrode, the taper angle of the edge part 241-1 of the wiring electrode 241 was about 55 degree.

Also by etching the material for wiring electrode 234 as shown in FIG. 22, the shape of both side walls (before and backside of the paper) of the electrode 224 was formed as a linear taper as shown in FIG. 5.

Next, the steps of producing a substrate for an ink jet recording head according to the present invention will be described below.

As shown in FIG. 9, after forming an oxidized silicon film of thickness of about 8000 Å on the surface of a P-type silicon supporting member 1 (impurity concentration of about $1 \times 10^{12}$ to about $1 \times 10^{16} cm^{-3}$), a portion of the oxidized silicon film for forming N-type collector buried region 2 was formed for each cell (each bipolar transistor 30) was removed by photolithographic technique. After forming oxidized silicon film was formed, by implanting N-type impurity (for example, P, As, etc.) N-type collector buried region 2 having impurity concentration of at least $1 \times 10^{18}$ cm$^{-3}$ was formed by thermal diffusion method to make the low sheet resistance of 30 ohm/□ or less at a thickness of 2 to 6 μm. Subsequently, after the region of the oxidized silicon film for forming P-type isolation buried region 3 was removed, an oxidized silicon film with thickness of about 1000 Å was formed, and by ion-implanting of P-type impurity (for example B, etc.) a P-type isolation buried region 3 having impurity concentration of at least $1 \times 10^{15}$ to $1 \times 10^{17}$ cm$^{-3}$ by thermal diffusion method was formed.

As shown in FIG. 10, after removing the oxidized silicon film entirely on the surface, N-type epitaxial region 4 (impurity concentration of about $1 \times 10^{13}$ to about $1 \times 10^{15}$ cm$^{-3}$) was grown epitaxially to the thickness of 5 to 20 μm.

As shown in FIG. 11, an oxidized silicon film with a thickness of about 1000 Å was formed on the surface of the N-type epitaxial region 4, a resist was coated thereon and patterning was conducted and P-type impurity was ion-implanted only at the portion for forming a low concentration P-type base region 5. After removing the resist, the low concentration P-type base region 5 (impurity concentration of at least about $1 \times 10^{14}$ to about $1 \times 10^{17}$ cm$^{-3}$) was grown by thermal diffusion method to have a thickness about 5-10 μm. Then, the oxidized silicon film was entirely removed and further an oxidized silicon film with a thickness of about 8000 Å was formed, the oxidized silicon film at the portion for forming a P-type isolation buried region 6 was removed, and then BSG film was deposited entirely on the surface by CVD method and then P-type isolation buried region 6 having impurity concentration of about $1 \times 10^{18}$ to about $1 \times 10^{20}$ cm$^{-3}$ formed so as to reach to the P-type isolation buried region 3 to a thickness of about 10 μm by thermal diffusion method. In this example, P-type isolation buried region 6 can be formed employing BBr$_3$ as the diffusion source.

As shown in FIG. 12, after removing the BSG film, an oxidized silicon film with a thickness of about 8000 Å was formed. After the oxidized silicon film at only the portion for forming a N-type collector region 7 was removed, a N-type collector region 7 (impurity concentration of about $1 \times 10^{18}$ to about $1 \times 10^{20}$ cm$^{-3}$) was formed to a film thickness about 10 μm by N-type solid phase diffusion and P ion implantation or by thermal diffusion so that the sheet resistance may have 10 ohm/□ or less and it may reach to the collector buried region 2.

Succeedingly, an oxidized silicon film with a thickness of about 12500 Å was formed and after forming a heat accumulating region 101 (see FIG. 13), the oxidized silicon film at the cell region was removed selectively and again an oxidized silicon film with a thickness of about 2000 Å was formed.

After resist patterning, ion implanting of P-type impurity was conducted into only a portion for forming a high concentration base reion 8 and a high concentration isolation region 9. After removing the resist, the oxidized silicon film at portion for forming N-type emitter region 10 and a high concentration N-type collector region 11 was removed and then thermal oxidized film was formed entirely, after implanting with N-type impurity, N-type emitter region 10 and a high concentration N-type collector region 11 were formed simultaneously by thermal diffusion method. The thicknesses of both the N-type emitter region 10 and the high concentration N-type collector region 11 were 1.0 μm or less and the impurity concentration were about $1 \times 10^{18}$ to about $1 \times 10^{20}$ cm$^{-3}$.

As shown in FIG. 13, after removing oxidized silicon film at the portion for connecting a part of electrode. Al was deposited entirely and then Al was removed at regions other than regions of collector-base common electrode 12, emitter electrode 13 and isolation electrode 14. In this case the etching of Al was conducted while etching back the resist, so that the edge parts and both side faces of collector base common electrode 12, emitter electrode 13 and isolation electrode 14 may have angle of 30-75 degree to the normal line not perpendicular, as shown in FIG. 22.

Figure 14:
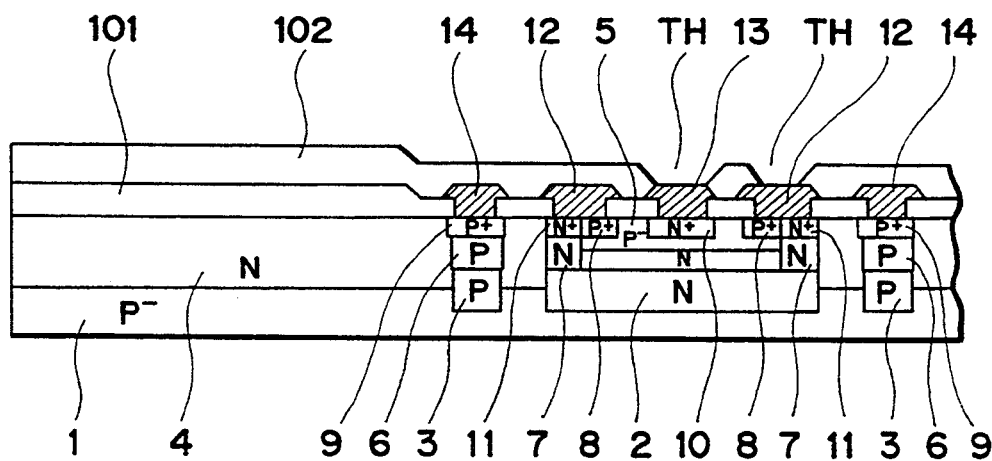
FIG. 14 is a schematic cross-sectional view illustrating an embodiment of a step of the manufacturing method of a substrate for a recording head according to the present invention.

As shown in FIG. 14, SiO$_2$ film as an interlaminar film 102 and also acting as a heat accumulating layer was formed entirely on the surface by spattering method to have a thickness of about 0.6 to 1.0 μm. The SiO$_2$ film may be formed by CVD method. There is not limited only SiO$_2$ but SiO or SiON are available. Next, for forming an electrical contact, through hole (TH) was formed by opening a part of the interlaminar film 102 corresponding to upper parts of the emitter electrode 13 and the collector base common electrode 12 by photolithography method.

Next, as shown in FIG. 15, HfB$_2$ as a heat generating resistance layer 103 was deposited to thickness of about 1000 Å on the collector-base electrodes 12 and the emitter electrode 13 and the interlaminar layer (SiO$_2$ film) through the through hole (TH).

After depositing Al layer on the heat generating resistance layer 103 to a thickness about 5000 Å as a material of wiring electrode for forming a pair of wiring electrode 104 of the electric-thermal converting element (corresponding to a cathode wiring electrode of a diode) and an anode wiring electrode 109, Al was etched while etching back the photoresist for masking as shown in FIG. 22, so that the shape of the edge part 104-1 with the both side faces of the wiring electrode 104 may have angle of 30-70 degree to the normal line.

Then, as shown in FIG. 16, a first protecting layer 105 (SiO$_2$ film) as a protecting layer for an electro-thermal converting element and an insulating layer for Al wirings was deposited by a spattering method or CVD method, to make a thickness of about 6000 Å, and T$_a$ as a second protecting layer 106 for anticavitation was deposited on upper part of a heat generating portion of an electro-thermal converting element 110 to make a thickness of about 2000 Å. Thus produced the electro-thermal converting element, T$_a$ and SiO$_2$ film were removed partly to make pad P for bonding. The first protecting layer 105 may be made of not SiO$_2$ but SiON or SiN.

Next, this example of producing a recording head of the present invention will be described as follows.

A step of a producing an ink discharging part having a plurality of openings for discharging an ink formed on the substrate for a recording head (as shown in FIG. 17, that is a step for providing a plurality nozzle walls 501 for forming a discharging opening 500 and a ceiling plate 502) and a step for providing a connector for an ink supply to a ceiling plate 502 (FIG. 18) were added.

Thus produced ink jet recording head was examined on block driving of the electro-thermal converting element, on the recording and operation. In the operation test, eight semiconductors were connected for one segment and although current of 300 mA was sent (totaly 2.4 A) for each semiconductor diode the other semiconductor operated without malfunction and the sufficient discharging was attained. Since the above recording head has good heat conductive efficiency, the driving power was 80% of that of the conventional one and the excellent high frequency responsibility was obtained. And also the excellent results on the life time and uniformity were obtained.

In Table 2, one example of evaluation results on the durability of ink jet recording head with edge parts of wiring electrode with various angle $\theta$ of the linear taper.

From the results shown in Table 2, it is found that the head having the edge of angle of 30-75 degree to the normal line exhibits improvement in the durability of ink jet recording head.

Next another example of producing a substrate for a recording head of the present invention will be described as follows.

In the example as shown in FIG. 22, by spraying alternatively an etchant for wiring electrode and the alkaline solution comprising TMAH as a main component, while etching back the photoresist for masking 300 for wiring material layer 234, the wiring electrode 224 was formed by etching the material layer 234. In this example, by spraying alternatively two kinds of alkaline solution at the different temperature, while etching back the photoresist for masking 300 for wiring material 234, the wiring electrode 224 was formed by etching the material layer 234, the wiring electrode 224 was formed by etching the material layer 234.

Namely, in the case of wiring electrode 234 made of aluminum, etching rate of aluminum by alkaline solution comprising TMAH as a main component is proportional to the liquid temperature of the alkaline solution (for example, by increasing 10° C. it becomes two times). While, the rate of etching back of the photoresist for masking to the alkaline liquid is in inverse proportion to the liquid temperature of the alkaline solution. Therefore, by spraying alternatively two kinds of alkaline solution at the different temperature, while etching back the photoresist for masking 300 for wiring electrode material 234, and by changing the combination of the temperature of the alkaline solution, the angle of the linear taper of the edge part 224-1 of the wiring electrode 224 to be formed can be controlled as desired easily. For example, by giving two cycles of the spraying two kind of the alkaline solution kept at 45° C. and 35° C. alternatively for 60 sec, the angle of the linear taper of the edge part 224-1 of the wiring electrode 224 was 60 degree.

Next another example of producing a substrate for a recording head of the present invention will be described as follows.

In the example shown in FIGS. 22A to 22E, the both side wall 224-2 of the electrode 224 (FIGS. 5 and 22A to 22E) was tapered, but for only reducing the current density of the heat generating portion, the shape of the both side wall 224-2 of the electrode 224 may be near perpendicular as shown in FIGS. 20 and 21.

In this case, the etching for the material layer for the wiring electrode and the etching for edge part of the wiring electrode to make linear taper were conducted separately. Namely, first by coating a resist entirely on the material layer for wiring electrode and by etching the material layer for wiring electrode utilizing the conventional wet etching method or a dry etching such as RIE employing a Cl-based gas, the wiring electrode was formed. In this case the side surface of the wiring electrode was formed as nearly perpendicular shape as the conventional one. A shown in FIG. 19, after coating a photoresist for masking except the portion of the heat generating portion, by etching wiring electrode by manners as shown in FIGS. 22A to 22E, the edge part of the wiring electrode having linear tapered shape was obtained as shown in FIGS. 20 and 21.

Next still another example of producing a substrate for a recording head of the present invention referring to FIGS. 22A to 22E will be described as follows.

A material layer 234 composed of aluminum was formed entirely on a heat generating resistance layer 223, a photoresist for masking (positive type) 300 was coated entirely to a thickness of 1.2 $\mu$m on the material layer 234, after exposing the photoresist layer 300 with a mask by light and by developing the photoresist 300, the photoresist for masking corresponding to the portion of the material layer for wiring electrode to be etched was removed (FIG. 22A). Then for removing a solvent including in photoresist for masking 300 and for improving the adhesion between the material layer 234 for wiring electrode and the photoresist 300 for masking, the baking was conducted at 125° C. for 225 seconds and the etching of the material layer for wiring electrode 234 was conducted. In this case, the mixture of phosphoric acid ($H_3PO_4$), nitric acid ($HNO_3$) and acetic acid ($CH_3COOH$) heated as etchant for wiring electrode made of aluminum was known well, but the photoresist for masking can not be etched by this mixture. At this time, since aluminum of the material layer for wiring electrode 234 is amphoteric metal and soluble in an alkaline solution, and a positive type photoresist for masking comprising typically alkaline soluble phenolic resin and naphtoquinone-azide is also soluble in strong alkaline solution. In this case, an alkaline solution comprising mainly TMAH was used to etch the material layer for wiring electrode. At the beginning of etching, only the material layer for wiring electrode 234 was etched mainly (FIG. 22B) and with time the photoresist 300 for masking also was etched, therefore the material layer 234 was etched by etching back the photoresist (FIG. 22C). Since the etching rate in the area of removed the photoresist changed on linearly, at the time when the electrode 234 was formed after completion of etching, the shape of the edge part 224 of the wiring electrode 224 became linear taper as shown in FIG. 22D. As the above, after the wiring electrode 224 was formed the remained photoresist 300 was removed. (FIG. 22E). According to an experimental result, in the case of etching the material layer for electrode 234 employing the above alkaline solution kept at 34° C. for 10 min., the etching-back rate (shift of pattern) of the photoresist for masking 300 was about 1.3 $\mu$m and the taper angle of the edge part of the electrode was 65 degree.

If the material layer 234 for wiring electrode is etched as shown in FIG. 22, the both side surfaces (this side and backside of the paper) of the electrode 224 formed will be linear tapered as shown in FIG. 5.

Next this example of a process for manufacturing a substrate for an ink jet recording head of the present invention will be described as follows.

As shown in FIG. 9, after forming an oxidized silicon film of thickness of about 8000 Å on the surface of a P-type silicon supporting member 1 (impurity concentration of about $1 \times 10^{12}$ to $1 \times 10^{16}$ cm$^{-3}$), portion of the oxidized silicon film for forming thereon N-type collector buried region 2 for each cell (each bipolar transistor 30) was removed by photolithographic technique. After forming oxidized silicon, by implanting N-type impurity (for example, P, As, etc.), N-type collector buried region 2 having impurity concentration of at least $1\times10^{18}$ cm$^{-3}$ was formed by thermal diffusion method to make the low sheet resistance of 30 ohm/□ or less to form a thickness of 2 to 6 μm. Subsequently, the portion of the oxidized silicon film for forming P-type isolation buried region 3 was removed and after an oxidized silicon film with a thickness of about 1000 Å P-type impurity (for example, B, etc.) was ion-implanted to form a P-type isolation buried region 3 having impurity concentration of up to $1\times10^{15}$ to $1\times10^{17}$ cm$^{-3}$ by thermal diffusion method.

As shown in FIG. 10, after removing the oxidized silicon film entirely on the surface, N-type epitaxial region 4 (impurity concentration of about $1\times10^{13}$ to $1\times10^{15}$ cm$^{-3}$) was grown epitaxially to a thickness of 50 to 20 μm.

As shown in FIG. 11, an oxidized silicon film with a thickness of about 1000 Å was formed on the surface of N-type epitaxial region 4 to coat with a resist and conduct pattern and P-type impurity was ion-implanted only at the portion for forming a low concentration P-type base region 5. After removing the resist the low concentration P-type base region 5 (impurity concentration of about $5\times10^{14}$ to $5\times10^{17}$ cm$^{-3}$) was formed by thermal diffusion method to a thickness about 5-10 μm. Then, the oxidized silicon film was entirely removed and after an oxidized silicon film with a thickness of about 8000 Å was formed the oxidized silicon film at the portion for forming a P-type isolation buried region 6 was removed, and then BSG film was deposited entirely on the surface by CVD method and then P-type isolation buried region 6 having impurity concentration of about $1\times10^{18}$ to $1\times10^{20}$ cm$^{-3}$ was formed to a thickness of about 10 μm so that it reached to the P-type isolation buried region 3 by thermal diffusion method. In this example, P-type isolation buried region 6 can be formed employing BBr$_3$ as the diffusion source.

As shown in FIG. 12 after removing the BSG film, an oxidized silicon film with a thickness of about 8000 Å was formed, and the oxidized silicon film only at the portion for forming a N-type collector region 7 was removed and a N-type collector region 7 (impurity concentration of about $1\times10^{18}$ to $1\times10^{20}$ cm$^{-3}$) was formed to the thickness of about 10 μm by N-type solid phase diffusion and P ion-implantation or by thermal diffusion so that the sheet resistance has 10 ohm/□ or less and it reaches to the collector buried region 2.

Succeedingly, an oxidized silicon film with a thickness of about 12500 Å was formed and after forming a heat accumulating layer 101 (see FIG. 13), the oxidized silicon film at the cell region was removed selectively and again an oxidized silicon film with a thickness of about 2000 Å was formed. After resist patterning, ion-implantation of P-type impurity was conducted into only portion for forming a high concentration base region 8 and a high concentration isolation region 9. After removing the resist, the oxidized silicon film at the portion for forming N-type emitter region 10 and a high concentration N-type collector region 11 was removed and then thermal oxidized film was formed entirely, after N-type impurity implanting, N-type emitter region 10 and a high concentration N-type collector region 11 were simultaneously by thermal diffusion method. The thickness of both the N-type emitter region 10 and the high concentration N-type collector region 11 were 1.0 μm or less and the impurity concentrations were about $1\times10^{18}$ to $1\times10^{26}$ cm$^{-3}$.

As shown in FIG. 13, after removing an oxidized silicon film at the portion for connecting a part of electrode. Al was deposited entirely and then Al was removed except portions of collector-base common electrode 12, emitter electrode 13 and isolation electrode 14. In this case, the etching of Al was conducted while etching back the resist, so that the edge part and both side faces of collector base common electrode 12, emitter electrode 13 and isolation electrode 14 may have angle of 30-75 degree to the normal line not perpendicular as shown in FIG. 22.

As shown in FIG. 14, SiO$_2$ film as an interlaminar film 102 and also acting as a heat accumulating layer was formed entirely on the surface by spattering method to a thickness of about 0.6 to 1.0 μm. The SiO$_2$ film can be formed by CVD method. There is not limited only SiO$_2$ but SiO or SiON is available.

Next, for gaining an electrical connection, through hole (TH) was formed by opening a part of the interlaminar film 102 corresponding to upper parts of the emitter electrode 13 and the collector base common electrode 12 by photolithography method.

Next, as shown in FIG. 15, HfB$_2$ as a heat generating resistance layer 103 was deposited on the electrodes 12 and 13 through the through hole (TH) corresponding the upper portion of the emitter electrode and the base-collector electrode to a thickness of about 1000 Å. An Al layer was deposited to a thickness about 5000 Å on the heat generating resistance layer 103 as a pair of wiring electrodes 104 of the electric-thermal converting element (corresponding to a cathode wiring electrode for a diode) and an anode wiring electrode 109 of a diode. Al was etched while etching back the photoresist for masking as shown in FIG. 22, so that the shape of the edge part 104-1 and the both side faces of the wiring electrode of 104 may have angle of 30-70 degree to the normal line.

Then, as shown in FIG. 16, a first protecting layer 105 (SiO$_2$ film) as a protecting layer for an electro-thermal converting element and an insulating layer for Al wirings was deposited by a spattering method or CVD method, to a thickness of about 6000 Å and Ta as a second protecting layer 106 for anti-cavitation was deposited on the upper part of a heat generating portion of an electro-thermal converting element 110 to a thickness of about 2000 Å. This produced the electro-thermal converting element, Ta, and SiO$_2$ film were removed partly to make a pad P for bonding. The first protecting layer 105 may be made of not SiO$_2$ but SiON or SiN.

Next, a process for manufacturing for a recording head of the present invention will be described as follows.

A step of manufacturing an ink discharging part having a plurality of openings for discharging an ink formed on the above substrate for a recording head (as shown in FIG. 17, a step for forming a plurality of nozzle walls 501 for forming a discharging opening 500 a step for disposing a ceiling plate) and a step for disposing a connector for supplying a ink to a ceiling plate 502 (FIG. 18) were added.

Thus manufactured ink jet recording head was examined on block driving the electro-thermal converting element, on the recording and operation. On the operation test, eight semiconductor diodes were disposed for one segment and current of 300 mA (totally 2.4 A) was flown in each diode. Other semiconductor diodes operated without malfunction and excellent discharging was obtained. Since the above recording head has good heat conductive efficiency, it consumes a driving power of only about 80% of that of a conventional one and showed good high frequency responsibility and still further provided excellent characteristics on the life and uniformity of the products.

The results of evaluation of the durability of the ink jet recording heads with edge of the wiring electrode having various angles of linear taper are shown in Table 3.

From the above results, it was found that the durability of an ink jet recording head is remarkably improved by providing the angle of linear taper of the edge part of the wiring electrode to make 30 to 70 degree.

Experimental results on the relationship between the concentration of TMAH in an alkaline solution comprising mainly TMAH and angle of taper of the edge part of the wiring electrode are shown.

From the results shown in Table 4, it was found that by changing the concentration of TMAH in the alkaline solution comprising mainly TMAH, the angle $\theta$ of taper of the edge part of the wiring electrode can be controlled as desired and by keeping the concentration of TMAH to 1.5–3.0%, the angle $\theta$ of the taper of the edge part of the wiring electrode can be controlled to 30 to 75 degree.

Next another example of manufacturing a substrate for a recording head of the present invention will be described as follows.

In the example shown in FIGS. 22A to 22E, the both side walls 224-2 of the wiring electrode 224 (see FIG. 5) was tapered but for only reducing the current density of the heat generating portion 220, the shape of the both side walls 224-2 of the wiring electrode 224 may be near perpendicular as shown in FIGS. 20 and 21.

In this case, the etching for the material layer for wiring electrode and the etching for edge part of wiring electrode to make linear taper were conducted separately. Namely, first by coating with a resist entirely on the material layer for wiring electrode and by etching utilizing the conventional wet etching method or a dry etching by RIE employing a Cl based gas, the wiring electrode was formed. In this case, the side wall of the electrode was formed as nearly perpendicular shape as conventional one. As shown in FIG. 19, after coating with a photoresist for masking except the portion of the heat generating portion, by etching wiring electrode by manners as shown in FIGS. 22A to 22E, the edge part of the wiring electrode having linear tapered shape was obtained as shown in FIGS. 20 and 21.

Next still another example of manufacturing a substrate for a recording head of the present invention referring to FIGS. 22A to 22E will be described as follows. These figures are schematic views showing steps for etching the material layer 234 of wiring electrode.

A material layer 234 made of aluminum was formed entirely on a heat generating resistance layer 223, a photoresist for masking (positive type) 300 was coated entirely to a thickness of 1.2 μm on the whole material layer 234. After exposing the photoresist layer 300 with a mask by light, by developing the photoresist 300, the photoresist 300 corresponding to the portion of the material layer for wiring electrode to be etched was removed (FIG. 22A). Then for removing a solvent included in the photoresist for masking 300 and for improving the adhesion between the material layer 234 and the photoresist 300, the baking is conducted at 125° C. for 225 seconds and the etching of the material layer for wiring electrode 234 was conducted. In this case, the mixture of phosphoric acid (H$_3$PO$_4$), nitric acid (HNO$_3$) and acetic acid (CH$_3$COOH) heated at 45° C. as etchant for wiring electrode made of aluminum was well known, but the photoresist for masking can not be etched by this mixture. At this time, since aluminum is amphoteric metal and soluble in an alkaline solution, and a positive type photoresist for masking comprising typically an alkaline soluble phenolic resin and naphtoquinone-azide is also soluble in strong alkaline solution, in this example, an alkaline solution comprising mainly TMAH and kept at a solution temperature of 35° C. was used to etch the material layer 234 of wiring electrode. Firstly, only the material for wiring electrode 234 was etched mainly (FIG. 22B) and with time the photoresist 300 also was etched. Therefore, the material layer 234 was etched while etching back the photoresist (FIG. 22C). Since the etching rate of material layer 234 in the area where the photoresist was removed was changed linearly, at the time when the wiring electrode 234 was formed after etching is completed, the shape of the edge part 224-1 of the electrode 224 became linear taper as shown in FIG. 22D. As the above, after the wiring electrode 224 was formed the residual photoresist 300 was removed (FIG. 22E). In according to an experimental result, wherein the etching employing the above alkaline solution containing 2.38% of TMAH kept at 34° C. for 10 min. was conducted for the material layer for wiring electrode 234, the amount of removing (shift of pattern) of the photoresist for masking 300 was about 1.3 μm and the taper angle (angle of surface of wiring electrode to the normal line) $\theta$ of the edge part of the electrode was about 60 degree, as shown in FIG. 4.

If the etching of material layer for electrode 234 is conducted as shown in FIGS. 22A to 22E, the both side faces (this side and the backside of the paper) of the electrode 224 formed will be linear tapered as shown in FIG. 5.

Next, a process for manufacturing a substrate for a recording head of the present invention will be described as follows.

As shown in FIG. 9, after forming an oxidized silicon film of thickness of about 8000 Å on the surface of a P-type silicon supporting member 1 (impurity concentration of about $1 \times 10^{12}$ to $1 \times 10^{16}$ cm$^{-3}$), a portion of the oxidized silicon film for forming N-type collector buried region 2 for each cell (each bipolar transistor 30) was removed by photolithographic technique. After forming oxidized silicon film was formed, by implanting N-type impurity (for example, P, As, etc.), N-type collector buried region 2 having impurity concentration of at least $1 \times 10^{18}$ cm$^{-3}$ was formed by thermal diffusion method to make the low sheet resistance of 30 ohm/□ or less and to form a thickness of 2 to 6 μm. Subsequently, the portion of the oxidized silicon film for forming P-type isolation buried region 3 was removed and after as oxidized silicon film with thickness of about 1000 Å was formed and by ion implanting of P-type impurity ( for example B, etc.) a P-type isolation buried region 3 having impurity concentration of up to $1 \times 10^{15}$ to $1 \times 10^{17}$ cm$^{-3}$ by thermal diffusion method was formed.

As shown in FIG. 10, after removing the oxidized silicon film entirely on the surface, N-type epitaxial region 4 (impurity concentration of about $1 \times 10^{13}$ to $1 \times 10^{15}$ cm$^{-3}$) was grown epitaxially to a thickness of 5 to 20 μm.

As shown FIG. 11, an oxidized silicon film with a thickness of about 1000 Å was formed on the surface of the N-type epitaxial region 4, thereon a resist was coated and pattern forming was conducted, and P-type impurity was ion implanted only at the portion for forming a low concentration P-type base region 5. After removing the resist, the low concentration P-type base region 5 (impurity concentration of about $5 \times 10^{14}$ to $1 \times 10^{17}$ cm$^{-3}$) was grown by thermal diffusion method to a thickness about 5–10 μm. Then, the oxidized silicon film entirely was removed again and further an oxidized silicon film with a thickness of about 8000 Å was formed. The oxidized silicon film at the portion for forming a P-type isolation buried region 6 was removed, and then BSG film was coated entirely on the surface by CVD method and then P-type isolation buried region 6 having a impurity concentration of about $1 \times 10^{18}$ to $1 \times 10^{20}$ cm$^{-3}$ was formed to a thickness of about 10 μm by thermal diffusion method. In this example, P-type isolation buried region 6 can be formed employing BBr$_3$ as the diffusion source.

As shown in FIG. 12, after removing the BSG film, an oxidized silicon film with a thickness of about 8000 Å was formed, and the oxidized silicon film at only the portion for forming a N-type collector region 7 was removed and a N-type collector region 7 (impurity concentration of about $1 \times 10^{18}$ to $1 \times 10^{20}$ cm$^{-3}$) was formed to a thickness of the film about 10 μm, by N-type solid phase diffusion and P ion-implantation or by thermal diffusion, so that the sheet resistance has 10 ohm/□ or less and it reaches to the collector buried region 5.

Succeedingly, an oxidized silicon film with a thickness of about 12500 Å was formed, and after forming a heat accumulating portion 101 (see FIG. 13), the oxidized silicon film at the cell region was removed selectively and again an oxidized silicon film with a thickness of about 2000 Å was formed.

After resist patterning, ion-implantation of P-type impurity was conducted into only portion for forming a high concentration base region 8 and a high concentration isolation region 9. After removing the resist, the oxidized silicon film portion for forming N-type emitter region 10 and a high concentration N-type collector region 11 was removed, and then thermal oxidized film was formed entirely, after N-type impurity implanting, N-type emitter region 10 and a high concentration N-type collector region 11 were formed simultaneously by thermal diffusion method. The thicknesses of both the N-type emitter region 10 and the high concentration N-type collector region 11 were 1.0 μm or less and the impurity concentrations were about $1 \times 10^{18}$ to $1 \times 10^{20}$ cm$^{-3}$.

As shown in FIG. 13, after removing a part of oxidized silicon film at the portion for connecting electrode, Al was deposited entirely and then Al was removed except portions of collector base common electrode 12, emitter electrode 13 and isolation electrode 14. In this case the etching was conducted while removing back the resist, so that the edge part and both side faces of collector base common electrode 12, emitter electrode 13 and isolation electrode 14 may have angle of 30–75 degree to the normal line not perpendicular as shown in FIGS. 22A to 22E.

As shown in FIG. 14, SiO$_2$ film as an interlaminar film 102 and also acting as a heat accumulating layer was formed entirely on the surface by spattering method to a thickness of about 0.6 to 1.0 μm. The SiO$_2$ film can be formed by CVD method. There is not limited only SiO$_2$ but SiO or SiON is available. Next, for gaining an electrical connection, through hole (TH) was formed by opening a part of the interlaminar film 102 corresponding to upper parts of the emitter electrode 13 and the collector-base common electrode 12 by photolithography method.

Next, as shown in FIG. 15, HfB$_2$ as a heat generating resistance layer 103 was deposited to a thickness of about 1000 Å on the electrodes 12 and 13 and the interlaminar layer 102 (SiO$_2$ film) through the through hole (TH).

A Al layer was deposited to a thickness about 5000 Å on the heat generating resistance layer 103 as a pair of wiring electrodes 104 of the electric-thermal converting element (corresponding to a cathode wiring electrode for a diode) and an anode wiring electrode 109 for a diode. Then Al was etched while etching back the photoresist for masking as shown in FIG. 22, so that the shape of the edge part 104-1 and the both side faces of the wiring electrode of 104 may have angle of 30–70 degree to the normal line.

Then, as shown in FIG. 16, a first protecting layer 105 (SiO$_2$ film) as a protecting layer for an electro-thermal converting element and an insulating layer for Al wiring was deposited by a spattering method or CVD method, to make a thickness of about 6000 Å and Ta as a second protecting layer 106 for anti-cavitation was deposited on the upper part of a heat generating portion of an electro-thermal converting element 110 to make a thickness of about 2000 Å. This produced electro-thermal converting element, Ta and SiO$_2$ film were removed partly to make a part P for bonding. The first protecting layer 105 may be made of not SiO$_2$ but SiON or SiN.

Next, a process for manufacturing for a recording head of the present invention will be described as follows.

Figure 8:
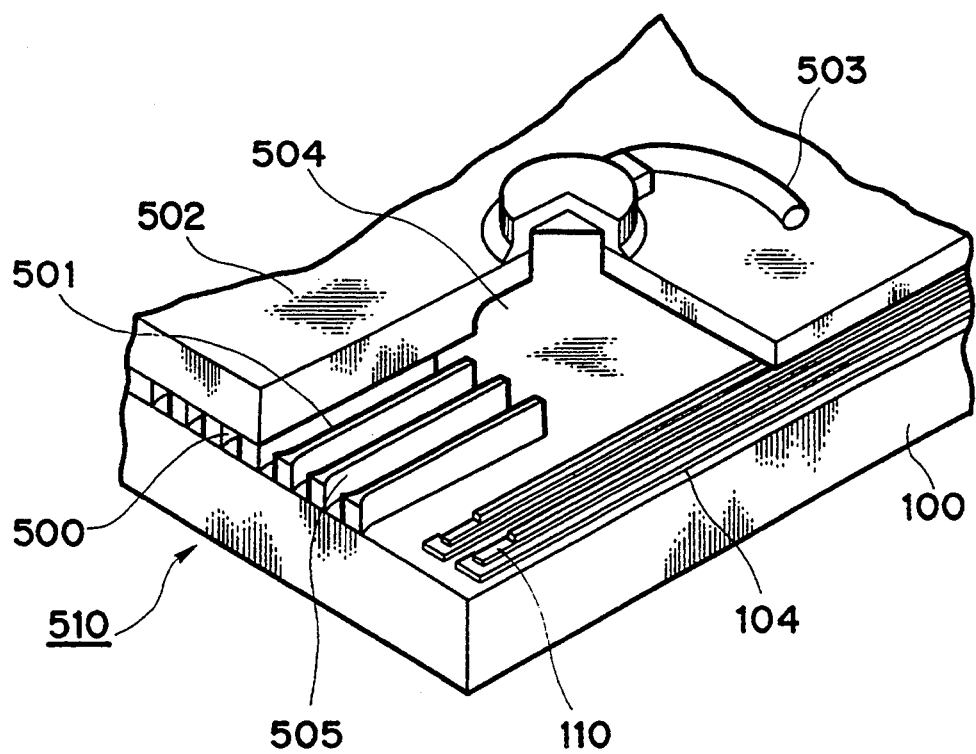
FIG. 8 is a perspective view illustrating an external view of a recording head manufactured according to the present invention.

For manufacturing an ink jet recording head, a step of forming an ink discharging part having a plurality of openings for discharging an ink formed on the substrate for an ink jet recording head (as shown in FIG. 17, steps for forming plural nozzle walls 501 for forming a discharging opening 500 and for disposing a ceiling plate 502) and a step for disposing a connector for supplying an ink in a ceiling plate 502 (FIG. 8) were added.

Thus manufactured ink jet recording head was examined on block driving the electro-thermal converting element, on the recording and operation. On the operation test, eight semiconductor diodes were disposed for one segment and current of 300 mA (totaly 2.4 A) was flown in each diode. Other semiconductor diodes did not act malfunctionally and the sufficient discharging was obtained. Further, since the above ink jet recording head has improved thermal conductive efficiency, the driving power was 80% of that by conventional one and the high frequency responsibility was satisfied. The sufficient characteristics on the life time and uniformity of products were attained.

The durability test on ink jet recording heads with edge of the wiring electrode having various angles θ of linear taper are shown in Table 5.

From the results as shown in Table 5, it was found that the durability of an ink jet recording head is remarkably improved by providing the angle of linear taper of the edge part of the wiring electrode to make 30 to 70 degree.

Experimental results on the relationship between the solution temperature of an alkaline solution comprising mainly TMAH and the angle of the taper of the edge part of the electrode.

From the results shown in Table 6, it was found that by changing the solution temperature of the alkaline solution comprising mainly TMAH, angle of the taper of the edge part of the electrode can be controlled as desired and by keeping the temperature of the solution to be 30°–55° C. the angle of the taper of the edge part of the electrode can be controlled to 30 to 75 degree.

In the method for manufacturing a substrate for a recording head in this example, taking notice that the alkaline solution comprising mainly TMAH can be useful for developer for a positive type resist, after developing the photoresist for masking 300 and when removing the photoresist for the portion of the wiring electrode 234 as shown in FIG. 22A, an alkaline solution comprising mainly TMAH kept at 30° to 55° C. is used for a developer. Therefore, in the example, since the developing step of a photoresist for masking and the etching step of wiring electrode can be conducted successively, the process of manufacturing the substrate is shortened and the improvement of through put can be expected.

After developing the photoresist for masking 300 utilizing the alkaline solution comprising mainly TMAH at 40° C. subsequently the material layer for wiring electrode 234 was etched while etching back the photoresist for masking 300, and the angle θ of the linear taper of the edge part of the electrode was made to about 70 degree.

Next, another example of manufacturing a substrate for a recording head of the present invention will be described as follows.

In example shown in FIGS. 22A to 22E, the both side walls of the electrode 224 (see FIGS. 5 and 22A–22E) were tapered but for only reducing the current density of the heat generating portion 220, the shape of the both side walls 224-2 of the electrode 224 may be nearly perpendicular as shown in FIGS. 20 and 21.

In this case, the etching for the material layer for the wiring electrode and the etching for edge part of the electrode to make linear taper were conducted separately. Namely, first by coating a resist entirely on the material layer for electrode and by etching utilizing the conventional wet etching method or a dry etching such as RIE employing a Cl based gas, the wiring electrode was formed. In this case the side wall of the electrode was formed as nearly perpendicular shape as conventional one. Then as shown in FIG. 19, after coating a photoresist for masking except the portion of the heat generating portion, by etching electrode portion by manners as shown in FIGS. 22A to 22E, the edge part of the wiring electrode having linear tapered shape was obtained as shown in FIGS. 20 and 21.

Next, another example of the process for manufacturing a recording head according to the present invention will be described as follows.

(1) After forming an oxidized silicon film with a thickness of about 8000 Å, on a P-type silicon supporting member 1 (the impurity concentration of about $1 \times 10^{12}$ to $1 \times 10^{16}$ cm$^{-3}$), the oxidized silicon film at the portion for forming N-type collector buried region 2 of each cell was removed by a photolithography processing. After forming the oxidized silion film, N-type impurity (for example P, As, etc.) was ion-implanted and N-type collector buried region 2 having impurity concentration of at least $1 \times 10^{18}$ cm$^{-3}$ was formed to a thickness of 2 to 6 μm by thermal diffusion method and to make the sheet resistance of 80 ohm/□ or less. Subsequently the oxidized silicon film at the portion for forming P-type isolation buried region 3 was removed and after forming the oxidized silicon film with a thickness of about 1000 Å, P-type impurity (for example B, etc.) was ion-implanted and P-type isolation buried region 3 having impurity concentration of at least $1 \times 10^{15}$ to $1 \times 10^{17}$ cm$^{-3}$ was formed to a thickness of 2 to 6 μm by thermal diffusion method (see FIG. 9).

(2) An oxidized silicon film entirely was removed and N-type epitaxial region 4 (impurity concentration of at least about $1 \times 10^{13}$ to $1 \times 10^{15}$ cm$^{-3}$) was grown epitaxially to a thickness about 5–20 μm (FIG. 10).

(3) An oxidized silicon film with a thickness of about 1000 Å was formed on the surface of the N-type epitaxial region 4, a resist was coated and patterning was conducted and P-type impurity was ion implanted only to the portion for forming a low concentration P-type base region 5. After removing the resist, the low concentration P-type base region 5 (impurity concentration of at least about $1 \times 10^{14}$ to $1 \times 10^{17}$ cm$^{-3}$) was grown by thermal diffusion method to a thickness about 5–10 μm.

The P-type base region 5 can be formed after a step (1) and removing the oxidized film, by growing low concentration P-type epitaxial layer having $5 \times 10^{14}$ to $5 \times 10^{17}$ cm$^{-3}$ to a thickness of 3 to 10 μm.

Then, the oxidized silicon film was entirely removed and further an oxidized silicon film with a thickness of about 8000 Å was formed. The oxidized silicon film at the portion for forming a P-type isolation buried region 6 was removed, and then BSG film was coated entirely on the surface by CVD method and then P-type isolation buried region 6 having impurity concentration of about $1 \times 10^{18}$ to $1 \times 10^{20}$ cm$^{-3}$ was formed to a thickness of about 10 μm by thermal diffusion method. In this example, P-type isolation buried region 6 can be formed employing BBr$_3$ as the diffusion source (FIG. 11).

As above-mentioned, if P-type epitaxial layer was used, since the structure that does not need above P-type isolation buried region 3 and P-type isolation region 6 can be possible, the photolithographic steps and impurity diffusion steps at a high temperature can be deleted.

(4) After removing the BSG film, an oxidized silicon film with a thickness of about 8000 Å was formed, and the oxidized silicon film only at the portion for forming a N-type collector region 7 was removed and a N-type collector region 7 (impurity concentration of about $1 \times 10^{18}$ to $1 \times 10^{20}$ cm$^{-3}$) was formed by N-type solid phase diffusion and P ion-implantation or by thermal diffusion so that the sheet resistance has 10 ohm/□ or less and it reaches to the collector buried region 5.

In this case, the thickness of the N-type collector region 7 was about 10 μm. Succeedingly, an oxidized silicon film with a thickness of about 12500 Å was formed and after forming a heat accumulating layer 101

(see FIG. 13), the oxidized silicon film at the cell region was removed selectively. Formation of a heat accumulating layer 101 may be conducted by forming a film of BPSG (silicate glass containing B and P), PSG (silicate glass containing P), $SiO_2$, SiON, SiN, etc. by CVD method, PCVD method or spattering method, after forming N-type collector region 7 and forming thermal oxidized silicon film of thickness of 1000 to 3000 Å. After that an oxidized silicon film of thickness of about 2000 Å was formed.

After resist patterning, ion implantation of P-type impurity was conducted into only portion for forming a high concentration base region 8 and a high concentration isolation region 9. After removing the resist, the oxidized silicon film portion for forming N-type emitter region 10 and a high concentration N-type collector region 11 was removed and then thermal oxidized film was formed entirely, after N-type impurity implanting, N-type emitter region 10 and a high concentration N-type collector region 11 was simultaneously by thermal diffusion method. The thicknesses of both the N-type emitter region 10 and the high concentration N-type collector region 11 were 1.0 μm or less and the impurity concentrations were about $1 \times 10^{18}$ to $1 \times 10^{20}$ cm$^{-3}$ (FIG. 12).

(5) Further after removing a part of the oxidized silicon film for the connecting portion of the electrode, aluminum was deposited entirely over the surface and then aluminum except the portion of the electrode was removed (FIG. 13).

(6) A $SiO_2$ film for an interlaminar film 102 and also acting as a heat accumulating layer was deposited entirely over the surface by PCVD method to a thickness of about 0.6 to 2.0 μm. In this case, after depositing at a low temperature of 150° to 250° C. to a thickness of about 1000 to 3000 Å, the film was grown at 250° to 450° C. to the predetermined thickness. At that time, the film grown at a lower temperature has suppressing capability for hillrock growth at rising the temperature of the substrate to 250° to 450° C. The experimental results on the growth of hillock, the temperature of the substrate and the film quality were shown in Table 7.

In the Table 7, in the term of substrate temperature numeral of 200-350 stands for the process that after deposition at 200° C., further deposition was carried out at 350° C., and numeral of 100 or 450 stands for the deposition at constant temperature of 100° or 450° C. respectively. In the term of hillock suppression, △ shows observation of hillrock, ▲ shows observation of a little hillock and ○ shows no observation of hillock. In the term of the film quality, △ shows roughness, ▲ shows a little roughness and ○ shows denseness. When the growth was conducted at 100° to 250° C., hillock growth was not observed. Namely, both number and size (the density and height of the existent hillock) of hillock were small and the growth was suppressed. However, the film deposited to form at a lower temperature exhibits relatively "roughness" in film quality and therefore the substrate and recording head employing this film may bring the lowering of the reliability. At lower temperature than 150° C., the control of temperature is difficult according to the construction of CVD apparatus. From the above situation, the film firstly deposited at 200° C. to a thickness of 1500 Å and successively deposited additionally at 350° C. to 8500 Å has a good film quality suppressing hillock. On the other hand, a film deposited at higher temperature than 300° C. showed a good quality of the film but relatively but hillock was observed.

Figure 23:
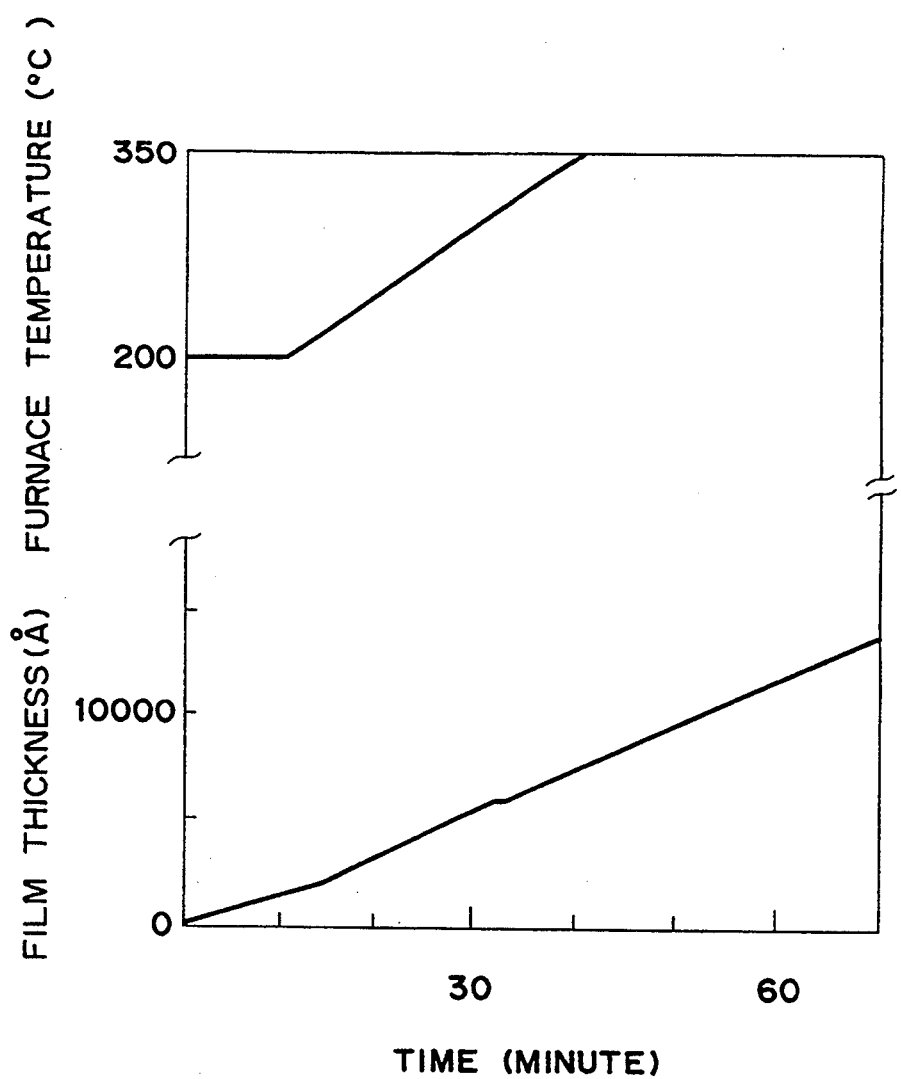
FIGS. 23 and 24 are both charts showing the change of the film thickness with the time by changing the temperature of a furnace.

Not only the above two staged CVD method, to change the furnace temperature to more three stages separatedly or to change continuously so that the temperature of the substrate may be 150° to 250° C. at the initial stage and 250° to 450° C. at the final stage are preferably effective to suppress the growth of hillock. In FIG. 23, the change of the film thickness with time by the CVD method when changing continuously the furnace temperature to 200° to 350° C. is shown. After 60 minutes from the start of the growing by CVD method, the film with thickness exceeding 10000 Å was obtained.

The interlaminar film 102 may be obtained also by normal pressure CVD method. It may be not only $SiO_2$ but SiON, SiO or SiN.

Next, for electrically connecting, a part of the interlaminar film corresponding to the upper parts of the emitter region and the base collector region was opened by photolithographic method and through hole (TH) was formed (FIG. 14).

When etching the interlaminar film 102 and the protecting layer 105, a mixed etching solution such as $NH_4F+CH_3COOH+HF$, etc. was employed and by immersing the etchant into the interface of the resist (photoresist for masking) and the insulation film, the cross-sectional shape of the etched part can be make to taper (preferably 30 to 75 degree to the normal line). This method provides the film with sufficient step coverage formed on the interlaminar film and is effective to stabilize the manufacturing process and to improve the productivity.

(7) Next, $HfB_2$ as a heat generating resistance layer 103 was deposited on an interlaminar film and the electrodes 12 and 13 through the through hole TH corresponding the upper portion of the emitter region and the base-collector region to a thickness of about 1000 Å to obtain an electrical connection.

(8) A layer made of Al material was deposited to a thickness about 5000 Å on the heat generating resistance layer 103 as a pair of wiring electrodes 104 of the electric-thermal converting element, a cathode wiring electrode 104 for a diode and an anode wiring electrode 109 for the diode. By patterning Al and $HfB_2$ (the heat generating resistance layer 103), the electric-thermal converting element and the other wiring were simultaneously formed wherein the patterning was conducted similarly by the above method (FIG. 15).

(9) After that, $SiO_2$ layer 105 as a protecting layer for the electric-thermal converting element and as a insulating layer between wirings of Al, etc. was deposited by a spattering method or CVD method to a thickness of about 10000 Å. First the film growth was conducted at relatively low temperature of 150° to 250° C. to suppress hillock growing similarly as the above. Then Ta as a protecting layer 106 for anti-cavitation was deposited on the upper part of heat generating portion of the electric-thermal converting element to make a thickness of about 2000 Å.

(10) The electric-thermal converting element and Ta and $SiO_2$ film 105 prepared as above mentioned were removed partly to form a pad 107 for bonding. The protecting layer 105 may be made of SiON or SiN other than $SiO_2$ (FIG. 16).

(11) Next on the substrate having a semiconductor element thereon, a liquid path wall member and a ceiling plate 502 for forming an ink discharging part 500 were disposed and a recording head having the ink path inside them was manufactured (FIG. 17).

In the aforementioned steps for manufacturing, a P-type isolation buried region 3 was formed and then a N-type region 4 was formed by epitaxial growing and thus a low concentration base region 5 and a P-type isolation region 6 were formed.

Contrary to those, if a P-type semiconductor layer containing impurity of $5 \times 10^{14}$ to $5 \times 10^{17}$ cm$^{-3}$ is formed to a thickness of 5 to 20 $\mu$m, and is used replacing of a region 4, since it can be commonly usable for the low concentration base region 5 and the P-type isolation region 6 and the P-type isolation buried region 3, the steps of formation of these regions (photolithography and heat treatment at high temperature) in the manufacturing can be deleted.

Namely, three masks are saved in this case contrary to the case of the use of N-type epitaxial layer.

Thus manufactured plural recording heads were examined on block driving the electro-thermal converting element, on the recording and operation. On the operation test, eight semiconductor diodes were disposed for one segment and current of 300 mA (totaly 2.4 A) was flown in each diode. Other semiconductor diodes did not act malfunctionally and the sufficient discharging was obtained.

Next, another example of the steps for manufacturing a recording head according to the present invention will be described as follows.

(1) After forming an oxidized silicon film with a thickness of about 8000 Å, on a P-type silicon supporting member 1 (the impurity concentration of about $1 \times 10^{12}$ to $1 \times 10^{16}$ cm$^{-3}$), the oxidized silicon film at the portion for forming N-type collector buried region 2 of each cell was removed by a photolithography processing. After forming the oxidized silicon film, N-type impurity (for example P, As, etc.) was ion-implanted and N-type collector buried region 2 having impurity concentration of at least $1 \times 10^{18}$ cm$^{-3}$ was formed to a thickness of 2 to 6 $\mu$m by thermal diffusion method to make the sheet resistance of 80 ohm/□ or less. Subsequently the oxidized silicon film at the portion for forming P-type isolation buried region 3 was removed and after forming the oxidized silicon film with a thickness of about 1000 Å, P-type impurity (for example B, etc.) was ion-implanted and P-type isolation buried region 3 having impurity concentration of at least $1 \times 10^{15}$ to $1 \times 10^{17}$ cm$^{-3}$ was formed to a thickness of 2 to 6 $\mu$m by thermal diffusion method (see FIG. 9).

(2) The oxidized silicon film entirely was removed and N-type epitaxial region 4 (impurity concentration of at least about $1 \times 10^{13}$ to $1 \times 10^{15}$ cm$^{-3}$) was grown epitaxially to a thickness about 5-20 $\mu$m (FIG. 10).

(3) An oxidized silicon film with a thickness of about 1000 Å was formed on the surface of the N-type epitaxial region 4, a resist was coated and patterning was conducted and P-type impurity was ion-implanted only at the portion for forming a low concentration P-type base region 5. After removing the resist the low concentration P-type base region 5 (impurity concentration of at least about $1 \times 10^{14}$ to $1 \times 10^{17}$ cm$^{-3}$) was grown by thermal diffusion method to a thickness about 5-10 $\mu$m.

The P-type base region 5 can be formed by growing low concentration P-type epitaxial layer containing impurity of $5 \times 10^{14}$–$5 \times 10^{17}$ cm$^{-3}$ after the step (1) and removing the oxidized film.

Then, the oxidized silicon film was entirely removed and further an oxidized silicon film with a thickness of about 8000 Å was formed the oxidized silicon film at the portion for forming a P-type isolation buried region 6 was removed, and then BSG film was coated entirely on the surface by CVD method and then P-type isolation region 6 having impurity concentration of about $1 \times 10^{18}$ to $1 \times 10^{20}$ cm$^{-3}$ was formed to a thickness of about 10 $\mu$m by thermal diffusion method so that it reached to the P-type buried region 3. In this example, P-type isolation region 6 can be formed employing BBr$_3$ as the diffusion source (FIG. 11).

(4) After removing the BSG film, an oxidized silicon film with a thickness of about 8000 Å was formed, and the silicon oxide film at only the portion forming a N type collector region 7 was removed and a N type collector region 7 (impurity concentration of about $1 \times 10^{18}$ to $1 \times 10^{20}$ cm$^{-3}$) was formed by N type solid phase diffusion and P ion implantation or by thermal diffusion so that the sheet resistance has 10 ohm/□ or less and it reaches to the collector buried region 5. In this case, the thickness of the N type collector region was about 10 $\mu$m. Succeedingly, an oxidized silicon film with a thickness of about 12500 Å was formed and after formed a heat accumulating layer 101 (Refer to FIG. 13), the oxidized silicon film at the cell region was removed selectively.

Formation of a heat accumulating layer 101 may be conducted by forming a film of BPSG (silicate glass containing B and P), PSG (silicate glass containing P), SiO$_2$, SiON or SiN and etc. by CVD method, PCVD method or spattering method, after forming N type collector region 7 and forming thermal oxidized silicon film of thickness of 1000 to 3000 Å. After that an oxidized silicon film of thickness of about 3000 Å was formed.

After resist patterning, ion implanting of P type impurity was conducted into only portion forming a high concentration base region 8 and a high concentration isolation region 9. After removed the resist, the oxidized silicon film portion to be N type emitter region 10 and a high concentration N type collector region 11 was removed and then thermal oxidized film was formed entirely, after N type impurity implanting, N type emitter region 10 and a high concentration N type collector region 11 were formed simultaneously by thermal diffusion method. The thickness of both the N type emitter region 10 and the high concentration N type collector region 11 were 1.0 $\mu$m or less and the impurity concentration were about $1 \times 10^{18}$ to $1 \times 10^{20}$ cm$^{-3}$ (FIG. 12).

(5) Further after removing a part of the oxidized silicon film for the connecting portion of the electrode, aluminum was deposited entirely over the surface and then aluminum except the portion of the electrode was removed. In this case, the removing the aluminum was conducted by etching method removing the photoresist differentiating from a conventional etching method and so the wiring shape with inclined side face was obtained.

As the etching liquid, aqueous solution containing TMAH which is used for resist patterning conventionally was used and good result, that is, the shape of both side walls of wiring inclined to the normal line was obtained stably (FIG. 13).

(6) A SiO₂ film to become an inter layer film 102 and also acting as a heat accumulating layer was formed entirely over the surface by PCVD method to make a thickness of about 0.6 to 2.0 μm. In this case, after deposition at low temperature of 150 to 250° C. till a thickness of about 1000 to 3000 Å was conducted, the film was grown at 250° to 450° C. till the predetermined thickness. At that time, the film grown at lower temperature has suppressing capability for hillock growth at rising the temperature of the substrate to 250° to 450° C. The experimental results on the growth of hillock vs the temperature of the substrate were tabulated in Table 8.

In the Table 8, in the term of substrate temperature, numerals 200–350 stands for the process that after lamination at 200° C., further the deposition was carried out at 350° C., and numerals 100 or 450 stands for the lamination at constant temperature of 100° to 450° C. respectively. In the term of hillock suppression, hillock observed one is open triangle △, fairly observed one is doubled triangle ▲, and hardly observed one is open circle ○. In the term of the film quality, rough one is triangle △, failr rough is double triangle ▲ densely one is open circle ○. When the growth was conducted at 100°–250° C., hillock growth was not observed so clearly. Namely, both number and size (the density and height of the existent hillock) of hillock and were small and the suppression effect is confirmed from these results. However, the film deposited at lower temperature exhibits relatively rough film quality and therefore the substrate and recording head employing such a film may bring the lowering of the reliability. At lower temperature than 150° C., the temperature control is difficult due to the construction of CVD apparatus. From the above situation, the film firstly deposited at 200° C. till thickness of 1500 Å successively deposited additionally at 350° C. till 8500 Å has a good quality of film suppressing hillock. On the otherhand, a film deposited at higher temperature than 300° C. showed a good quality of the film but hillock was observed thereon.

Figure 24:
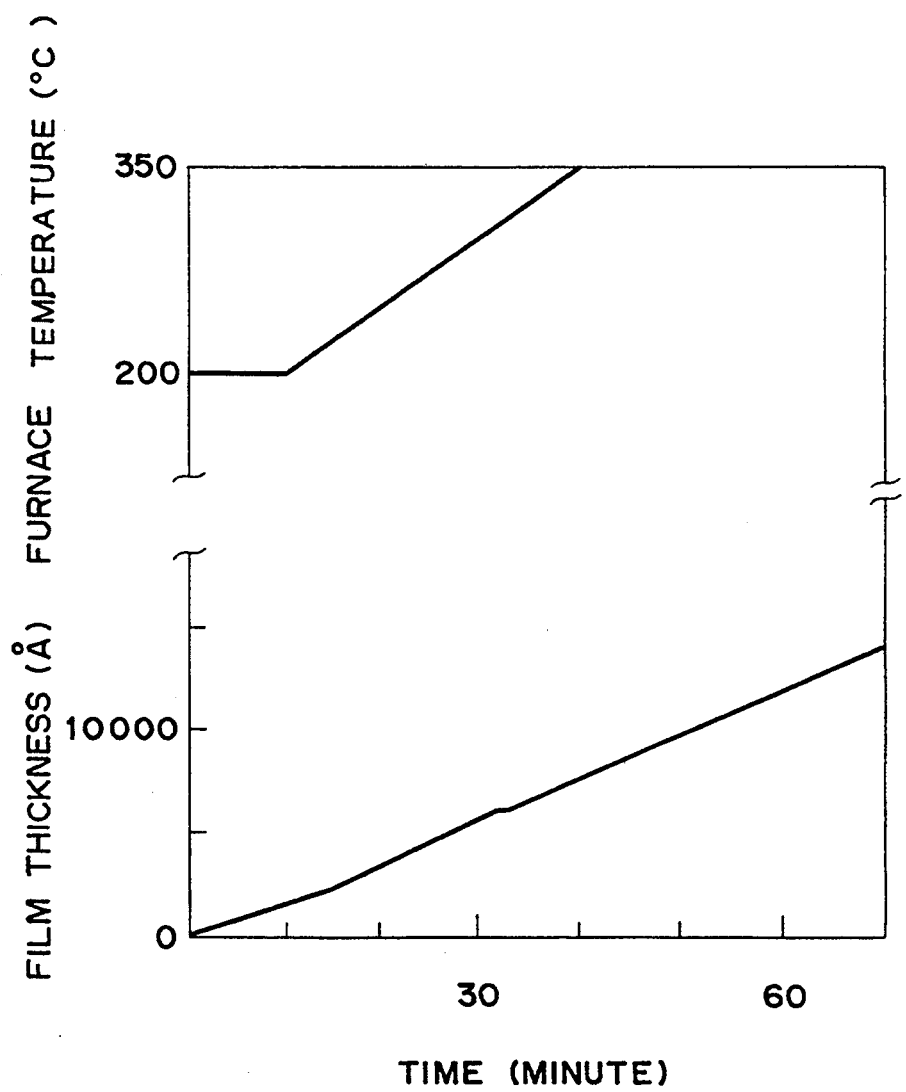
Figure 25:
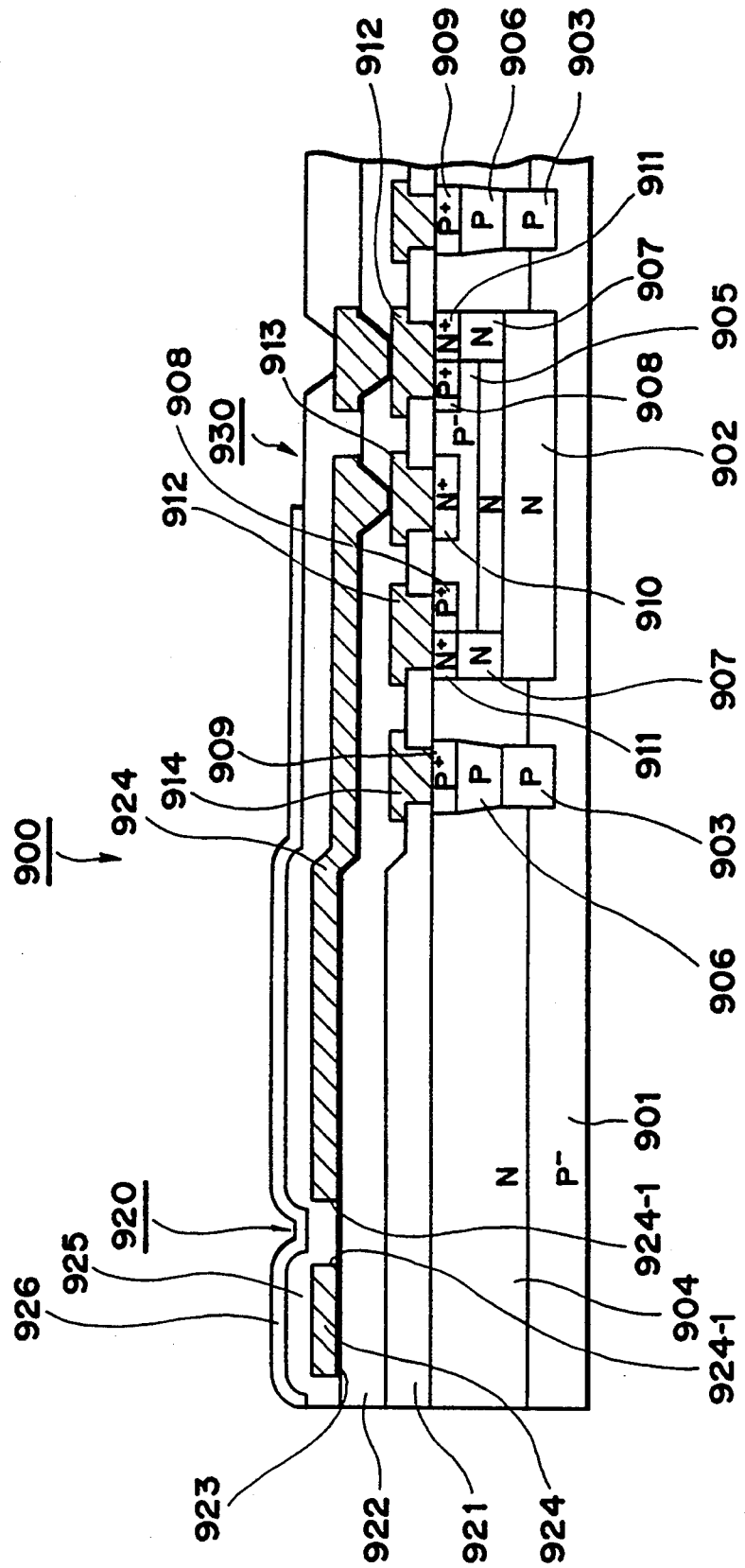
FIG. 25 is a schematic cross-sectional view of a part of a substrate for a conventional recording head.
Figure 26A:
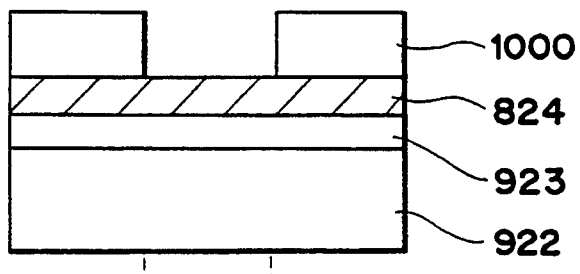
FIGS. 26A to 26E are schematic cross-sectional process views illustrating a step of a conventional etching process of a material layer of wiring electrode at a heat generating portion.
Figure 26B:
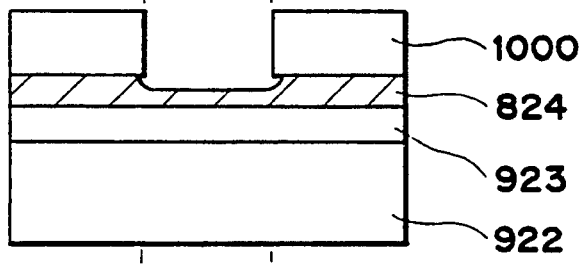
Figure 26C:
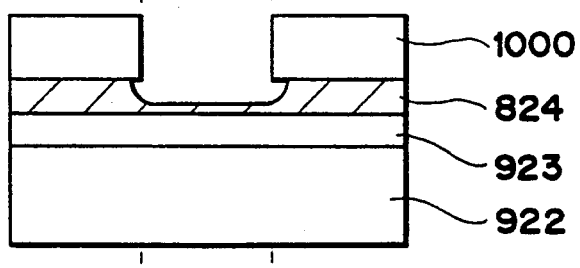
Figure 26D:
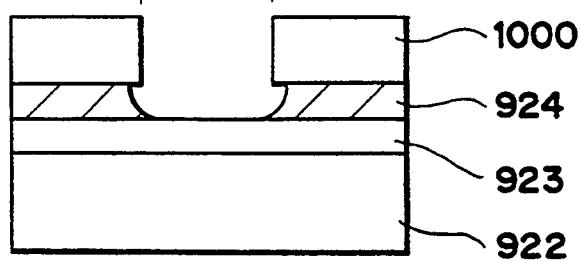
Figure 26E:
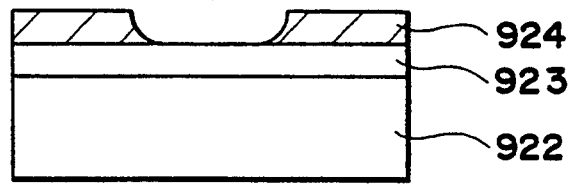
Figure 27:
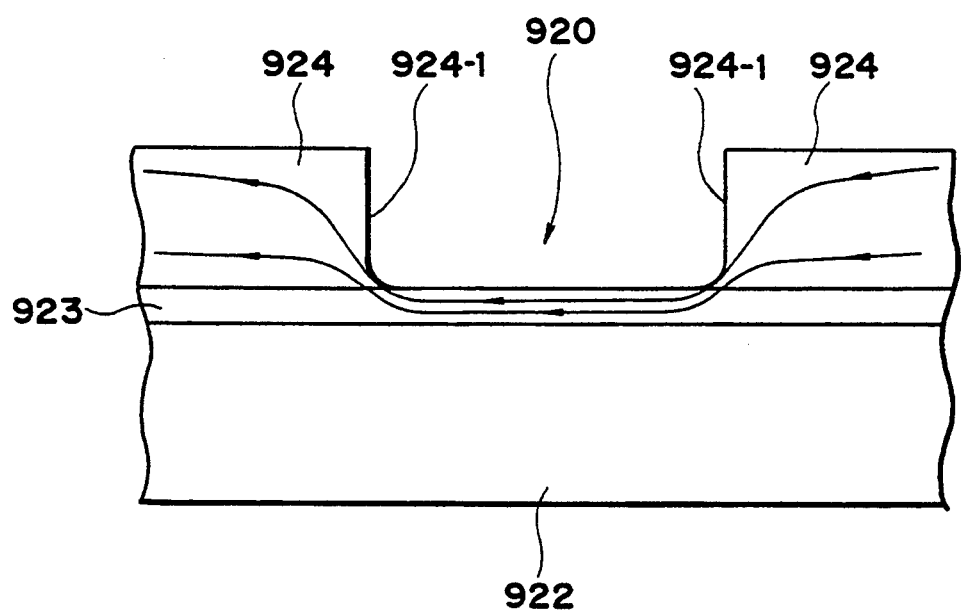
FIG. 27 is a schematic cross-sectional view illustrating a flow of electric current in a heat-generating resistance member of a conventional substrate for a recording head.

Not only the two stage CVD method as above, to vary the furnace temperature to more three stage separatedly or to vary continuously so that the temperature of the substrate may be 150° to 250° C. at the initial stage and 250° to 450° C. at the final stage are preferably effective to suppress the growth of hillock. In FIG. 24, the change of the film thickness to time at the CVD growing with varying continuously the furnace temperature to 200° to 350° C. is shown. After 60 minutes from the start of the growing by CVD method the film with thickness exceeding 10000 Å was obtained.

The interlayer film 102 may be obtained also by normal pressure CVD method. The material may be not only SiO₂ film but SiON film, SiO film or SiN film.

Next, for electrically connecting, a part of the interlayer film corresponding to the upper part of the emitter region and the base collector region was opened by photolithographic method and through hole TH was formed (FIG. 14).

In the etching of the inter-layer film 102 and the protecting layer 105, a mixed acid etching solution such as NH₄F+CH₃COOH+HF and etc. was employed and by immersing the etching liquid into the resist (photoresist for masking) and the interface of the electrical isolation film, the cross-sectional shape of the etched portion can be make to taper (preferably 30 to 75 degree or less to the normal line). This method provides the film with sufficient step coverage formed on the interlayer film and is effective to stabilize the manufacturing process and to improve the yield of manufacturing.

(7) Next, HfB₂ as a heat generating resistance layer 103 was deposited on an interlayer film 102 and the electrodes 12 and 13 through the through hole TH corresponding the upper portion of the emitter region and the base collector region to have thickness of about 1000 Å to gain an electrical connection.

(8) A layer made of Al material was deposited on the heat generating resistance layer 103 as a pair of wiring electrode 104, 104 of the electric-thermal converting element, a cathode wiring electrode of a diode 104 and an anode wiring electrode 109 so as to have a thickness about 5000 Å and by patterning Al and HfB₂ (the heat generating resistance layer 103), the electric-thermal converting element and the other wiring were simultaneously formed wherein the patterning of Al was conducted as the above method (FIG. 15).

(9) After that, SiO₂ layer 105 as a protecting layer for the electric-thermal converting element and as an electrical isolation layer of wiring of Al was deposited by PCVD method to make the thickness of about 1000 Å. In a similar manner as described above, first, film was grown at relatively lower temperature (150°–250° C.) to suppress the growth of hillock. The protecting film 105 may be made of not only SiO₂ but SiO, SiN or SiON. Then Ta as a protecting layer 106 for anti-cavitation was deposited upon the heating generating portion of the electric-thermal converting element to make a thickness of about 2000 Å.

(10) The electric-thermal converting element and Ta and SiO₂ film 105 prepared as above mentioned were removed partly to form a pad 107 for bonding (FIG. 16).

(11) Next on the substrate bearing a semiconductor element thereon, a liquid path wall member for forming an ink discharging portion 500 and a lid 502 were disposed and a recording head in which an ink path was formed was manufactured (FIG. 17).

On plural recording heads manufactured by changing the angle of the edge part to the normal line varying the temperature of the etching liquid for tapered etching of Al wiring electrode, electro-thermal converting element were block-driven and recording and operating were examined. On the operation test, eight semiconductor diodes were connected to one segment and current of 300 mA (totaly 2.4 A) was flown in each diode. Other semiconductor diodes did not act wrong and sufficient discharging was obtained. Since the above recording head has good heat conductive efficiency, the driving electricity was 80% of a conventional one and the high frequency responsibility is improved. Furthermore, life of the head and uniformity were improved. Dimensional accuracy of wiring, scattering of wiring resistance, the initial non-defect ratio of the products and durability were determined. The results are shown in Table 9. The head made of the edge having angle of 30–75 degree to the normal line exhibits particularly sufficient results on every test term and also on the final judgement. The head made of the edge having angle of 5 and 28 degree to the normal line exhibits relatively good results in the durability and the one having 80 degree of the angle showed a moderately good results on the dimensional accuracy of wiring and the scattering of the wiring resistance.

In this example, wiring electrode 104 having an edge part 104-1 inclined to a heat generating resistance layer and at same time having side face 104-2 inclined along to longitudinal direction of the wiring electrode 104 can be obtainable.

However taking into consideration the object to relax the concentration of the current density in the edge part of the heat generating resistance, a wiring electrode having a connecting surface inclined at 30–75 degree to the normal line is particularly effective but inclined side wall along to the longitudinal direction is not always necessary.

By the manner as described below, the structure having only a connecting surface of a wiring electrode inclined and the side wall along the longitudinal direction having near perpendicular inclination as 0–30 degree can be achieved.

Referring FIG. 18 to FIG. 21 the manner will be described.

After depositing $HfB_2$ as the heat generating resistance layer 103 and Al material layer for forming a wiring electrode 104, the heat generating resistance layer 103 and a wiring electrode 104 were formed by repeatedly twice times of a conventional photolithography processing. Etching for a wiring electrode 104 can be conducted by a conventional wet etching method or dry etching method as RIE utilizing gas such as Cl type (FIG. 18). By these method the side wall 104b along the longitudinal direction of wiring electrode 104a being near perpendicular to the normal line can be obtained.

Next, as shown in FIG. 19, resist 111 (a photoresist for masking) was coated except a heat generating resistance layer 103a by a known manner. And the resist 111 was formed on a wiring electrode 104a by a similar manner as forming an emitter electrode and etc. that is, when the etching for the electrode 104a even if the resist 111 was removed backward so that the resist 111 does not reach to the both faces of the electrode 104a and the electrode 104a was etched. In this case, etching for the wiring electrode 104 may be conducted by spraying alternatively two kinds of alkaline solution containing mainly TMAH at different temperature and thus the structure having inclined edge part 104b at only connecting portion of the heat generating resistance layer 103 can be achieved.

Figure 28:
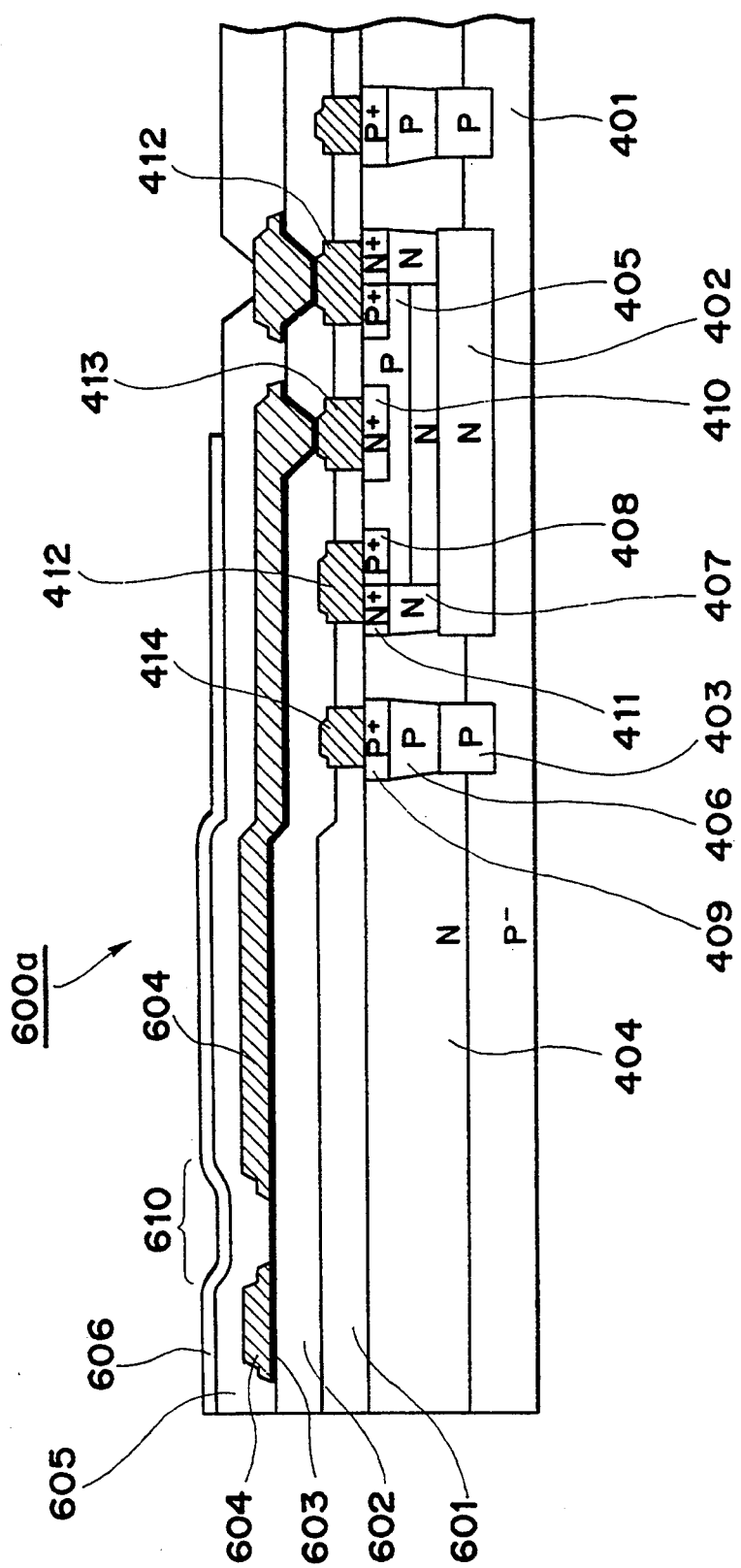
FIG. 28 is a schematic cross-sectional view of an embodiment of a substrate for ink jet recording head of the present invention.

FIG. 28 is a schematic cross-sectional view of a substrate for ink jet recording head 600a in still another embodiment according to the present invention.

The substrate 600a was constituted by covering a P-type silicon substrate 401 bearing a functional element comprising NPN transistor of P-type base regions 405, 408, N-type collector buried region 407 and N-type emitter regions 410, 411 thereon with a heat accumulating layer 601 comprising oxidized film formed a collector base common electrode 412, emitter electrode 413 and isolation electrode 414 thereon and further by forming interlayer film 602 comprising oxidized silicon film etc. by PCVD method or spattering method on the upper layer.

Figure 29A:
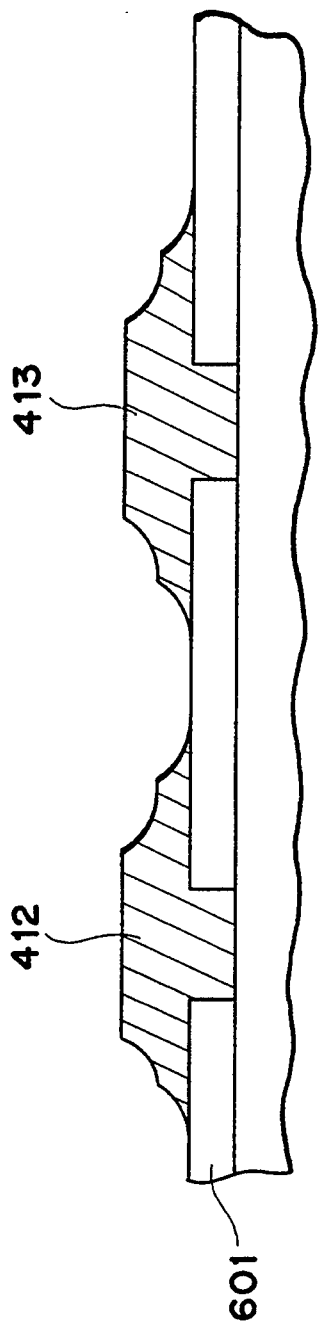
FIGS. 29A and 29B are schematic views of an embodiment of an electrode of a substrate for ink jet recording head of the present invention and FIG. 29A is a cross-sectional view and FIG. 29B is a plan view.
Figure 29B:
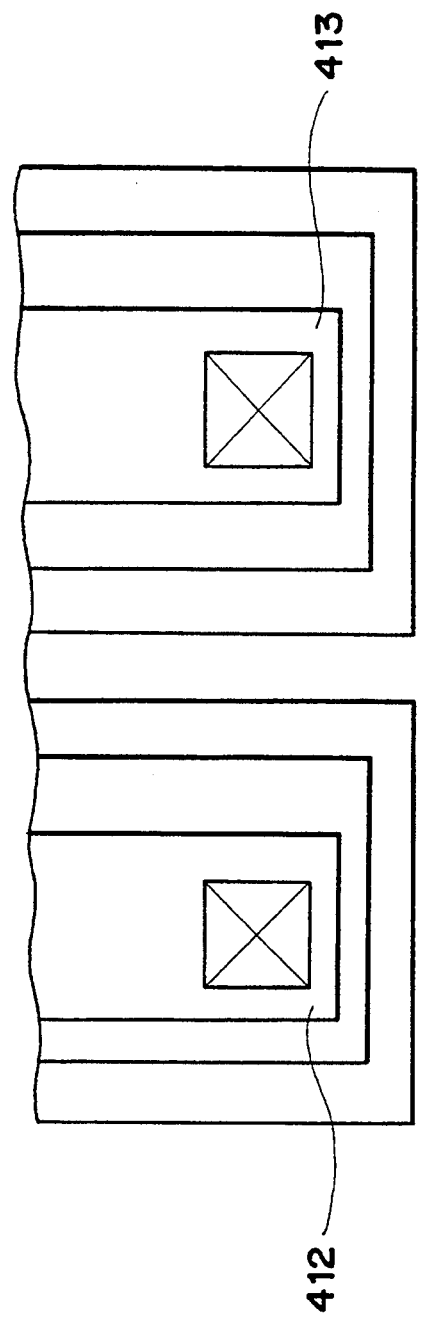

The aforementioned each electrode 412, 413 and 414 was made of aluminum and etc. as shown in FIGS. 29A and B, the edge part and the side face, that is, all of side faces are formed stepwise (414 not shown in FIG. 29).

Since the aluminum forming electrode 412, 413, 414 has steps on the side surface, step coverage of the interlayer film 602 is very much improved and the thickness of the interlayer film 602 can be formed to be thinner than that by a conventional method in the range that the heat accumulating effect should lose. Further by opening partly the interlayer film 602, electrical connections between the collector base common electrode 412, emitter electrode 413 and isolation electrode 412 were subjected, and a wiring 604 as a wiring electrode made of Al and etc., was provided on the interlayer film 602. That is, after partly through holing the interlayer 602, a heat generating portion 610 as an electrical-thermal converting element consisting a heat generating resistance layer 603 made of $HfB_2$ by spattering method and wiring 604 made of Al and etc. by deposition method or spattering method was provided.

Figure 30A:
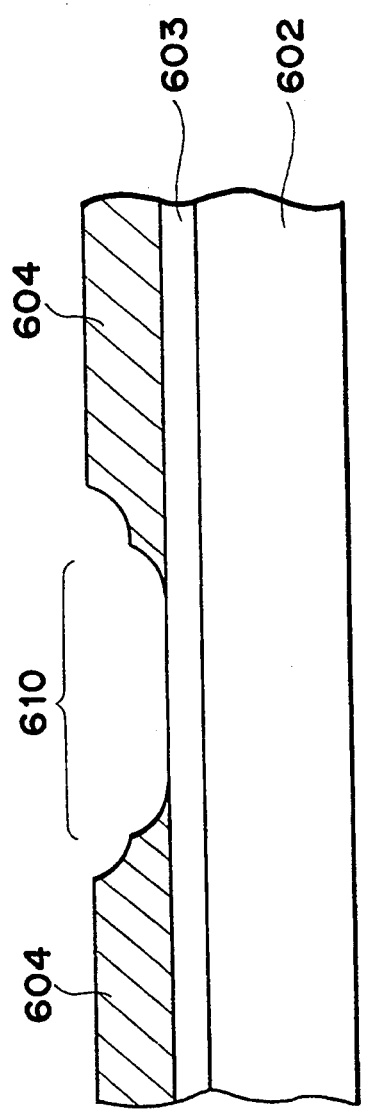
FIGS. 30A and 30B are schematic views of an embodiment of a heat generating portion of a substrate for ink jet recording head of the present invention and FIG. 30A is a cross-sectional view and FIG. 30B is a plan view.
Figure 30B:
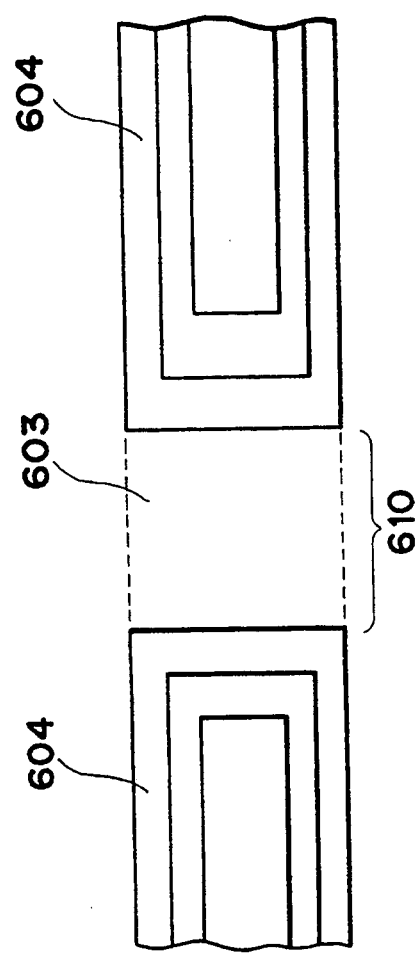

FIGS. 30A and 30B are enlarged view of the heat generating portion 610.

And also the edge part and side wall along the longitudinal direction in the wiring 604 composing heat generating portion 610 was formed to be step wise as similar as the above electrode.

The material for forming heat generating resistance layer 603 includes Ta, $ZrB_2$, Ti—W, Ni—Cr, Ta—Al, Ta—Si, Ta—Mo, Ta—W, Ta—Cu, Ta—Ni, Ta—Ni—Al, Ta—Mo—Al, Ta—Mo—Ni, Ta—W—Ni, Ta—Si—Al, Ta—W—Al—Ni and etc.

Furthermore, a protecting layer 605 made of $SiO_2$, SiN or SiON and a protecting layer 606 made of Ta by spattering method or CVD method as shown in FIG. 28 were provided.

As aforementioned, since the edge surface and side wall of the wiring 604 were formed to be stepwise, coverage characteristic of the protecting film 605 is excellent, and the thickness of 10000 Å of conventional one can be reduced to 6000 Å, and heat generated at the heat generating portion 610 can be conducted effectively and at high speed. The through put of deposition apparatus for a protecting layer was achieved to about two times. Still further as aforementioned the concentration of driving current 401A and 401B in the edge part of the heat generating resistance layer 603 as shown in FIG. 31 could be reduced to $8.2 \times 10^7$ A/cm$^2$ for a conventional head from $3.2 \times 10^7$ A/cm$^2$ and subsequently the durability of the head was improved.

Next, the principle action of the aforementioned functional element will be described referring to FIG. 5.

Figure 32:
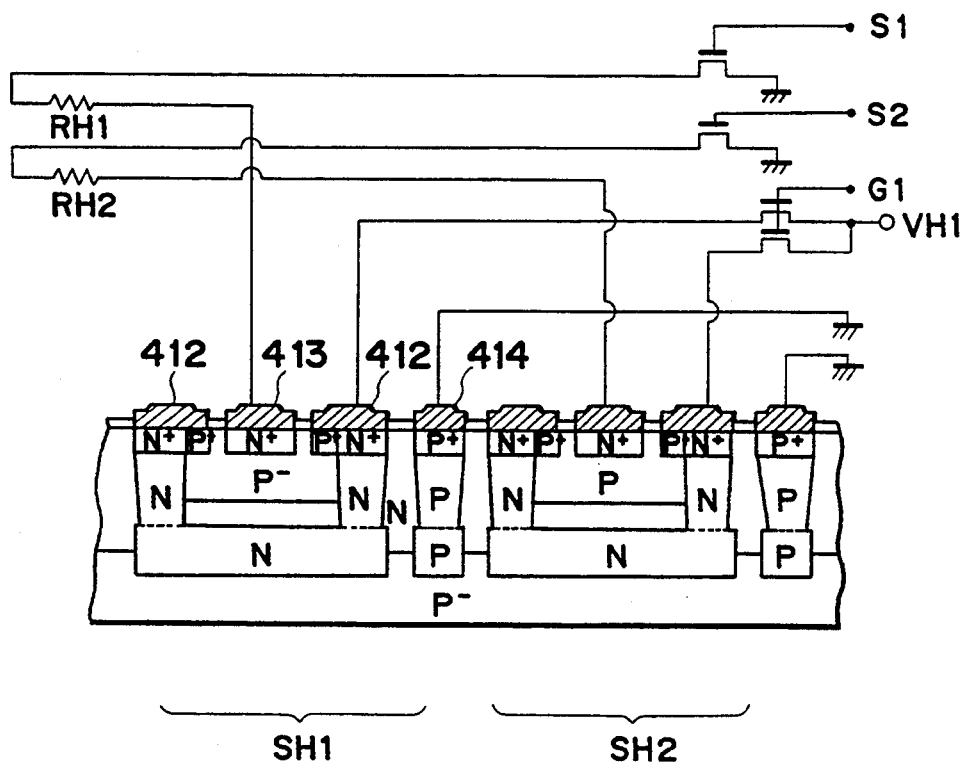
FIG. 32 is a schematic cross-sectional view illustrating the action of a substrate for a recording head according to the present invention.

FIG. 32 is a schematic view illustrating driving method of the heat generating portion 610 of the substrate 600a shown in FIG. 28.

In this example, the collector-base common electrode 412, as shown in FIG. 28 and FIG. 32, corresponds to the anode electrode of the diode and the emitter electrode 413 corresponds to the cathode electrode of the diode. Namely, by applying the collector-base common electrode 412 with positive bias potential ($V_{H1}$) NPN transistor in the cell (SH1, SH2) turns on and the bias current as a collector current and a base current flow from the emitter electrode 413. By the short circuited constitution of the base and the collector, the heat rising and falling characteristics of the electro-thermal converting element (RH1 and RH2) are improved and subsequently the occurrence of film boiling thereby controlling of the growth and contract of bubble is also improved and consequently the ink discharging is conducted stably. This fact suggests that the relevancy between the characteristics of transistor and the characteristics of film boiling is strong in a ink jet recording head utilizing thermal energy and since accumulation of minor carrier in a transistor is less, the switching characteristics becomes to faster and the rising characteristics are improved more than those expected. Also since a parastic effect is relatively low and scattering among elements is small, driving current is obtained stably.

In this example, furthermore the construction is provided so that by earthing the isolation electrode, 414 flowing of a charge into other neighbor cell and malfunction of the other element should be prevented.

In such semiconductor device, to keep the concentration of the N-type buried region 402 to be at least $1 \times 10^{18}$ cm$^{-3}$, to keep the concentration of the P-type base region 405 to be $5 \times 10^{14}$ to $5 \times 10^{17}$ cm$^{-3}$, and to keep the area of connection between the high concentration base region 408 and the collector base electrode 412 small are desired. By employing the construction as above described, a leakage of current from the NPN transistor to the P-type silicon substrate 401 and a leakage of current through the isolation region to the ground are prevented.

The driving method of the heat generating portion 610 will be described more in detail below.

Although only two semiconductor functional elements (cells) SH1 and SH2 are shown in FIG. 32, actually the same numbers of the functional elements like this corresponding to the number (for example 128) of the heat generating portion 610 are disposed at regular intervals and are matrix-connected electrically so as to enable a block driving. To brief explanation here the driving of the electric-thermal converting elements RH1 and RH2 as two segments for the same group will be described.

To drive the electric-thermal converting element RH1, by a switching signal G1 the group is selected and simultaneously the electric-thermal converting element RH1 is selected. Then the functional element cell SH1 comprising transistor constitution is supplied electric current by a positive bias consequently the electric-thermal converting element RH1 generates heat. This thermal energy gives rise the change of state of a liquid and makes bubble to discharge liquid through an orifice.

Similarly, to drive the electric-thermal converting element RH2, by switching signals G1 and S2 the electric-thermal converting element RH2 is selected and the diode cell SH2 is drived, consequently current is supplied to the electric-thermal converting element RH2.

In this case, the P-type silicon substrate 401 is provided through the isolation regions 403, 406 and 409. By disposing the isolation-regions 403, 406 and 409 of each semiconductor in this manner the wrong action by electric interference between each semiconductor is prevented.

The substrate 600a constructed in this manner is able to make a recording head comprising liquid path wall member 501 comprising a photosensitive resin and etc. to form liquid path 505 communicated to plural orifices 500 and a lid 502 having an ink supply opening 503. In this case ink supplied from the ink supply opening 503 is storaged in an inner common liquid chamber 504 and then the ink is supplied to each liquid path 505 and at the state by driving the heat generating portion 110 the ink is discharged from the orifice 500.

Next, the process of manufacturing of the recording head according to the present invention will be described referring to FIG. 33 et seq.

(1) After forming an oxidized silicon film with a thickness of about 8000 Å, on the surface of P-type silicon substrate 401 (the impurity concentration of about $1 \times 10^{12}$ to $1 \times 10^{16}$ cm$^{-3}$), the oxidized silicon film at the portion forming N-type collector buried region 2 of each cell was removed by a photolithography processing. After forming the oxidized silicon film, N-type impurity (for example P, As and etc.) was ion-implanted and N-type collector buried region 402 having impurity concentration of at least $1 \times 10^{18}$ cm$^{-3}$ as formed to a thickness of 2 to 6 μm by thermal diffusion method to make the sheet resistance of 30 ohm/□ or less.

Subsequently the silicon oxide film at the region forming P-type isolation buried region 403 was removed and after forming the silicon oxide film with a thickness of about 1000 Å, P-type impurity (for example B and etc.) was ion-implanted and P-type isolation buried region 403 having impurity concentration of at least $1 \times 10^{15}$ to $1 \times 10^{17}$ cm$^{-3}$ was formed by thermal diffusion method (FIG. 33).

(2) The silicon oxide film entirely was removed and N-type epitaxial region 404 (impurity concentration of at least about $1 \times 10^{13}$ to $1 \times 10^{15}$ cm$^{-3}$) was grown epitaxially to have a thickness of about 5-20 μm (FIG. 34).

Figure 35:
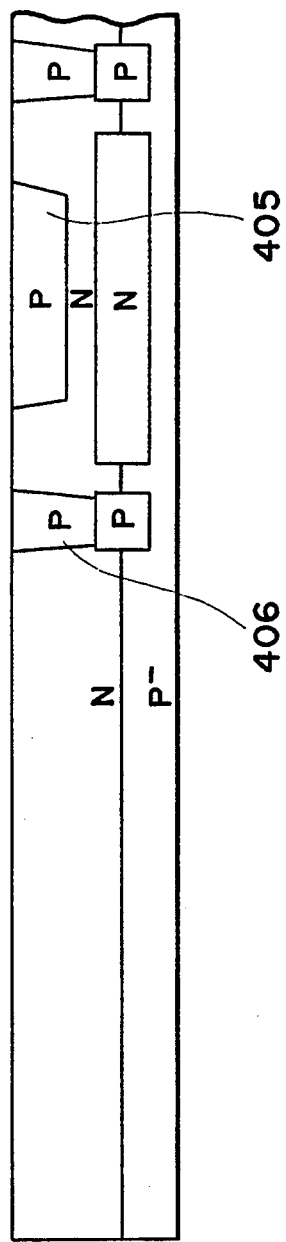
FIG. 35 is a schematic cross-sectional view illustrating an embodiment of a step of the manufacturing method of a substrate for an ink jet recording head and an ink jet recording head according to the present invention.

(3) An oxidized silicon film with a thickness of about 1000 Å was formed on the surface of the N-type epitaxial region 404, thereon a resist was coated and patterning was conducted and P-type impurity was ion-implanted only at the portion to be formed a low concentration P-type base region 405. After removing the resist the low concentration P-type base region 405 (impurity concentration of at least about $1 \times 10^{14}$ to $1 \times 10^{17}$ cm$^{-3}$) was grown by thermal diffusion to have a thickness about 5-10 μm. Then, the oxide film entirely was removed and further an oxidized silicon film with a thickness of about 8000 Å was formed, the oxidized silicon film at the portion to be formed a P-type isolation buried region 406 was removed, and then BSG film was coated entirely on the surface by CVD method and then P-type isolation buried region 406 having impurity concentration of about $1 \times 10^{18}$ to $1 \times 10^{20}$ cm$^{-3}$ formed to a thickness of about 10 μm by thermal diffusion (FIG. 35). In this example, P-type isolation buried region 406 can be formed employing BBr$_3$ as the diffusion source.

(4) After removing the BSG film, an oxidized silicon film with a thickness of about 8000 Å was formed, and the silicon oxide film at only the portion for formation of a N type collector region 407 was removed and a N type collector region 407 impurity concentration of about $1 \times 10^{18}$ to $1 \times 10^{20}$ cm$^{-3}$) was formed by N type solid phase diffusion and phosphoric ion-implantation or by thermal diffusion so that the sheet resistance has 10 ohm/□ or less and it reaches to the collector buried portion 402.

In this case, the thickness of the N type collector region 407 was about 10 μm. Succeedingly, an oxidized silicon film with a thickness of about 12500 Å was formed to form a heat accumulating layer 601, and, the oxidized silicon film at the cell portion was removed selectively and again a silicon oxide film with a thickness of about 2000 Å was formed.

Figure 36:
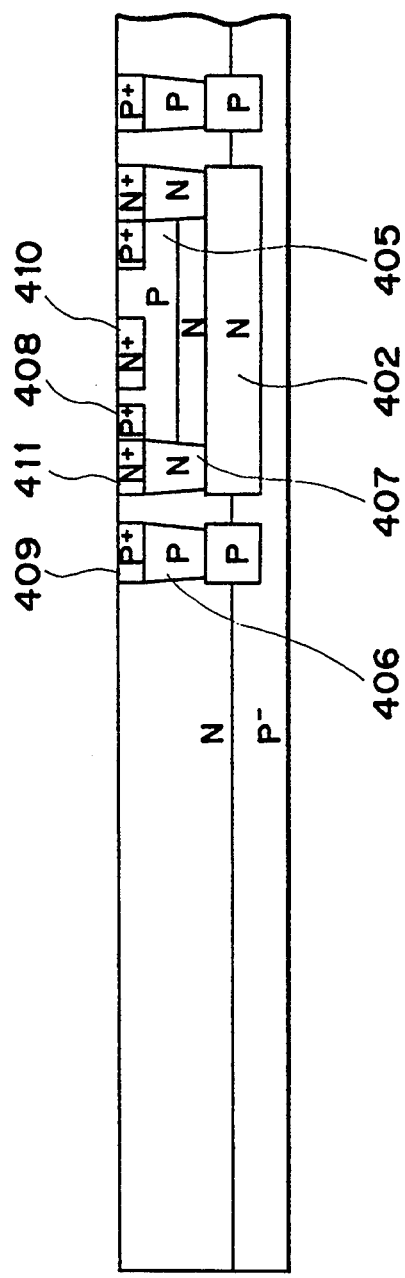
FIG. 36 is a schematic cross-sectional view illustrating an embodiment of a step of the manufacturing method of a substrate for an ink jet recording head and an ink jet recording head according to the present invention.

After resist patterning, ion-implanting of a P type impurity was conducted into only portion forming a high concentration base region 408 and a high concentration P type isolation region 409. After removing the resist, the oxidized silicon film portion to be N type emitter region 410 and a high concentration N type collector region 411 was removed and then a thermal oxidized film was formed entirely, after N type impurity implanting, N type emitter region 410 and a high concentration N type collector region 411 were formed simultaneously by thermal diffusion method. The thickness of both the N type emitter region 410 and the high concentration N type collector region 411 were 1.0 μm or less and the impurity concentration were about $1 \times 10^{18}$ to $1 \times 10^{20}$ $cm^{-3}$ (FIG. 36).

Figure 37:
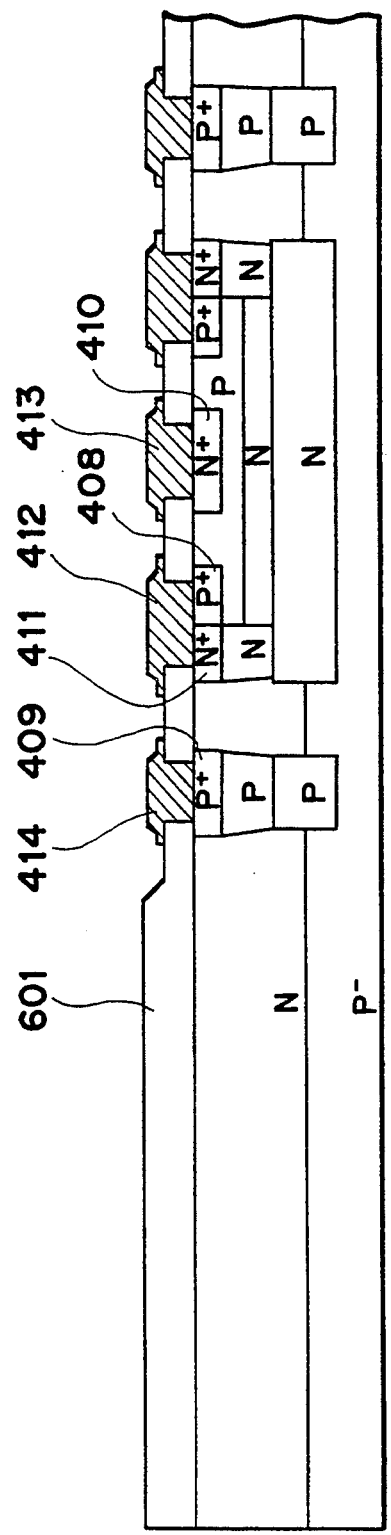
FIG. 37 is a schematic cross-sectional view illustrating an embodiment of a step of the manufacturing method of a substrate for an ink jet recording head and an ink jet recording head according to the present invention.

(5) Further, after removing the silicon oxide film at connecting portion of a part of electrode. A metal such as Al was deposited entirely and Al except a part of the electrode portion was removed (FIG. 37).

In this case, the removing of unnecessary part of the aluminum is conducted by etching so that the edge part of the aluminum electrode may not be perpendicular but may be stepwise. Since by ordinary wet etching method the shape of the edge part of aluminum becomes nearly perpendicular, the resist was also etched together with the aluminum.

Hereinafter, the method for removing aluminum will be described referring to FIG. 42.

Figure 42A:
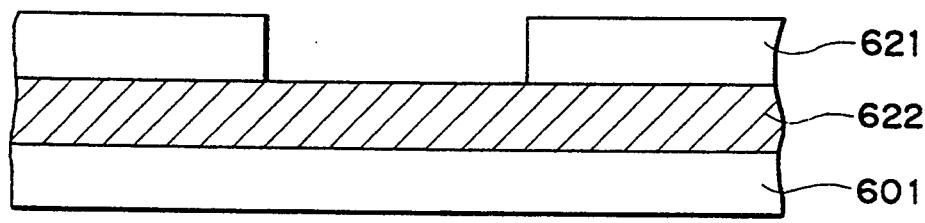
FIGS. 42A to 42E are schematic cross-sectional views illustrating an embodiment of a step of the manufacturing method of an electrode of a substrate for an ink jet recording head according to the present invention.
Figure 42B:
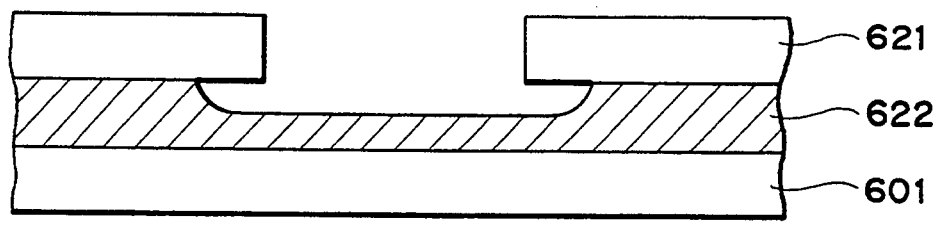
Figure 42C:
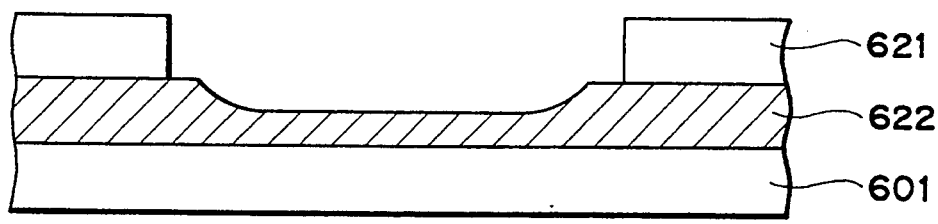
Figure 42D:
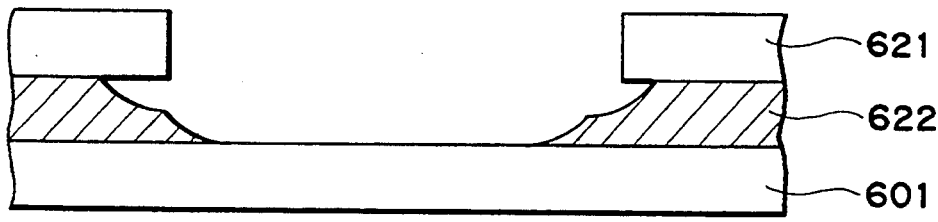

A positive photoresist 621 was coated on aluminum deposited entirely to have a thickness of 1.2 μm and patterning for formation of electrodes (FIG. 42A). Next Al portion was wet-etched by a mixture of phosphoric acid ($H_3PO_4$), nitric acid ($HNO_3$) and acteic acid ($CH_3COOH$) as well known at 30° to 50° C. The etching of Al was conducted till to about a half of the initial thickness of Al when the etching rate of Al was about 3000 Å/min. and the time to be required was calculated from the value of the half of the thickness of Al film divided by the etching rate (FIG. 42B).

Next for removing the positive resist 621, it was immersed in an aqueous solution of TMAH wherein the concentration of TMAH was 2–3% add the temperature was 30°–40° C. The removing rate of the resist was controllable in the range of 0.5–1.0 μm/min. by changing the liquid temperature.

And then the remaining Al was etched by the same etching liquid as above. The end point of etching can be determined by change of reflectance of the surface of the wafer (FIG. 42B).

Figure 42E:
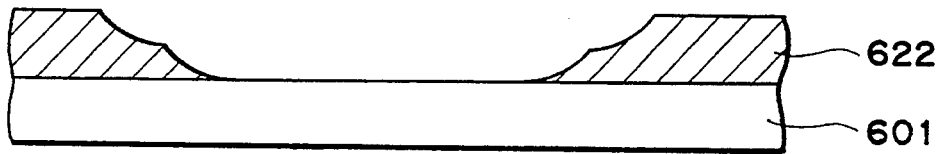

Next, the positive resist 621 was removed by an organic amine type releasing liquid (FIG. 42E).

As aforementioned, by repeating the operation of etching, resist removing and etching, the edge surface and side wall of Al electrode, that is, all of the side surfaces could be formed stepwise.

(6) A $SiO_2$ film as an interlayer film 602 having a function of a heat accumulating layer 601 was formed by spattering method entirely over the surface to a thickness of 0.6–1.0 μm. The $SiO_2$ film may be formed by CVD method and the film may be made of SiO or SiON.

Figure 38:
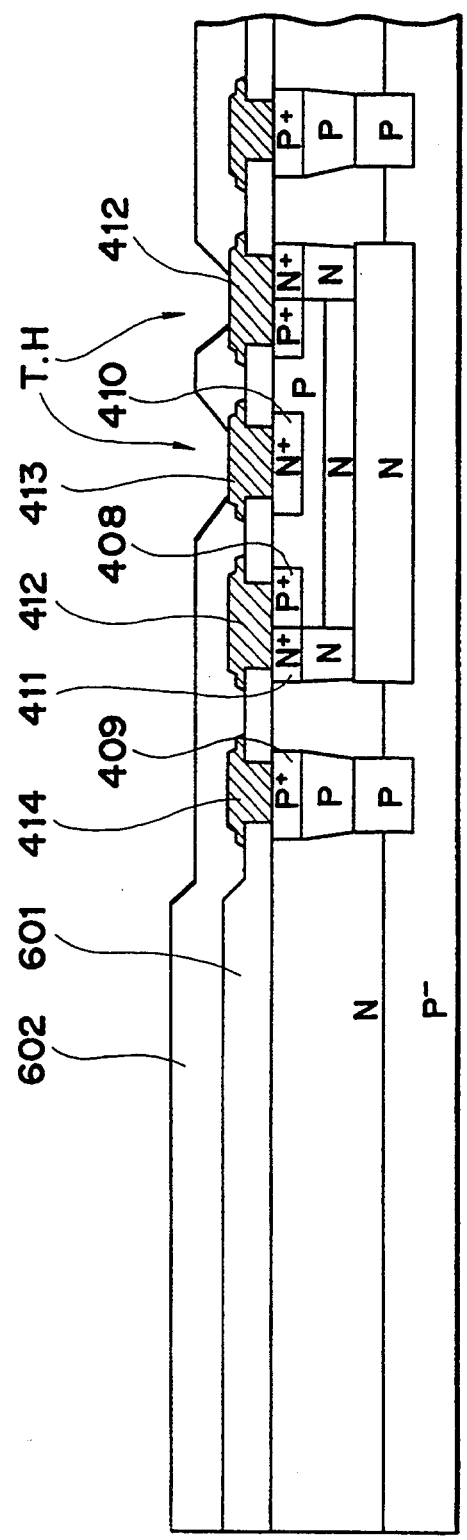
FIG. 38 is a schematic cross-sectional view illustrating an embodiment of a step of the manufacturing method of a substrate for an ink jet recording head and an ink jet recording ,head according to the present invention.

Next, for electrical connection, a part of the interlayer film 602 corresponding to the upper portion of the emitter region 410 and the base collector region 408 and 411 was opened by a photolithography method to make through hole TH (FIG. 38).

(7) $HfB_2$ as a heat-generating resistance layer 603 was deposited on the interlayer film 602 and on emitter electrode 413 and collector base common electrode 412 corresponding to the upper part of the emitter region 410 and the base collector region 408 and 411 respectively for electrical connection was deposited through TH to have a thickness of about 1000 Å.

Figure 39:
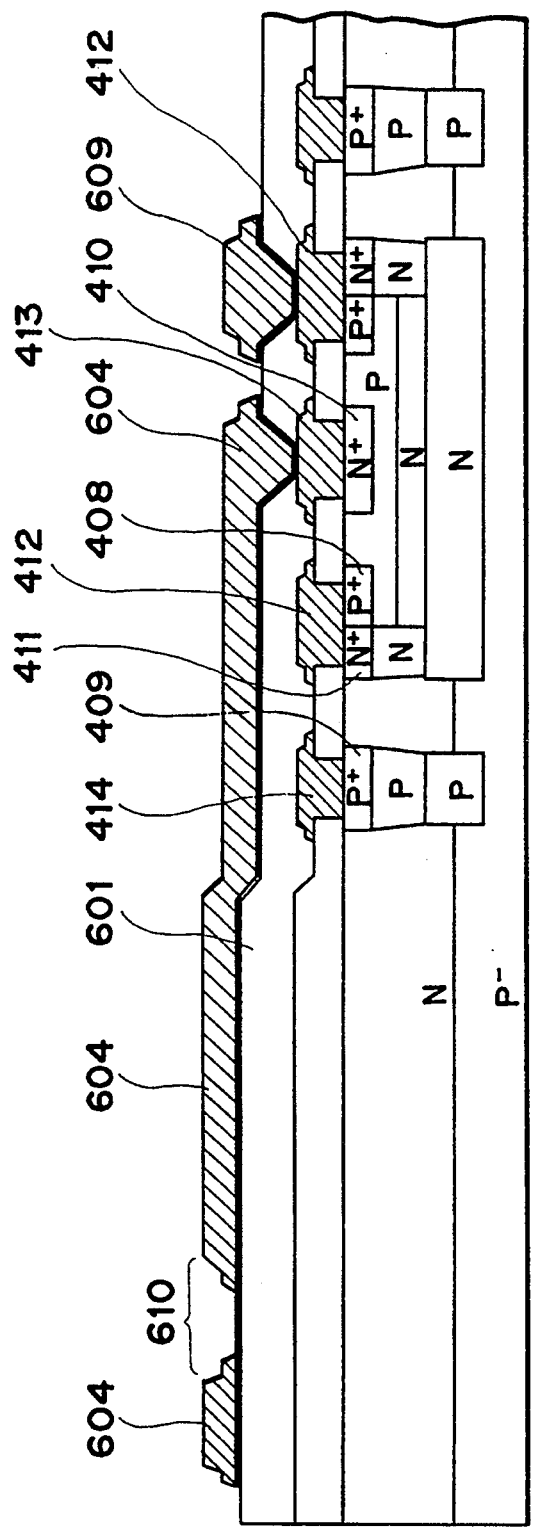
FIG. 39 is a schematic cross-sectional view illustrating an embodiment of a step of the manufacturing method of a substrate for an ink jet recording head and an ink jet recording head according to the present invention.
Figure 40:
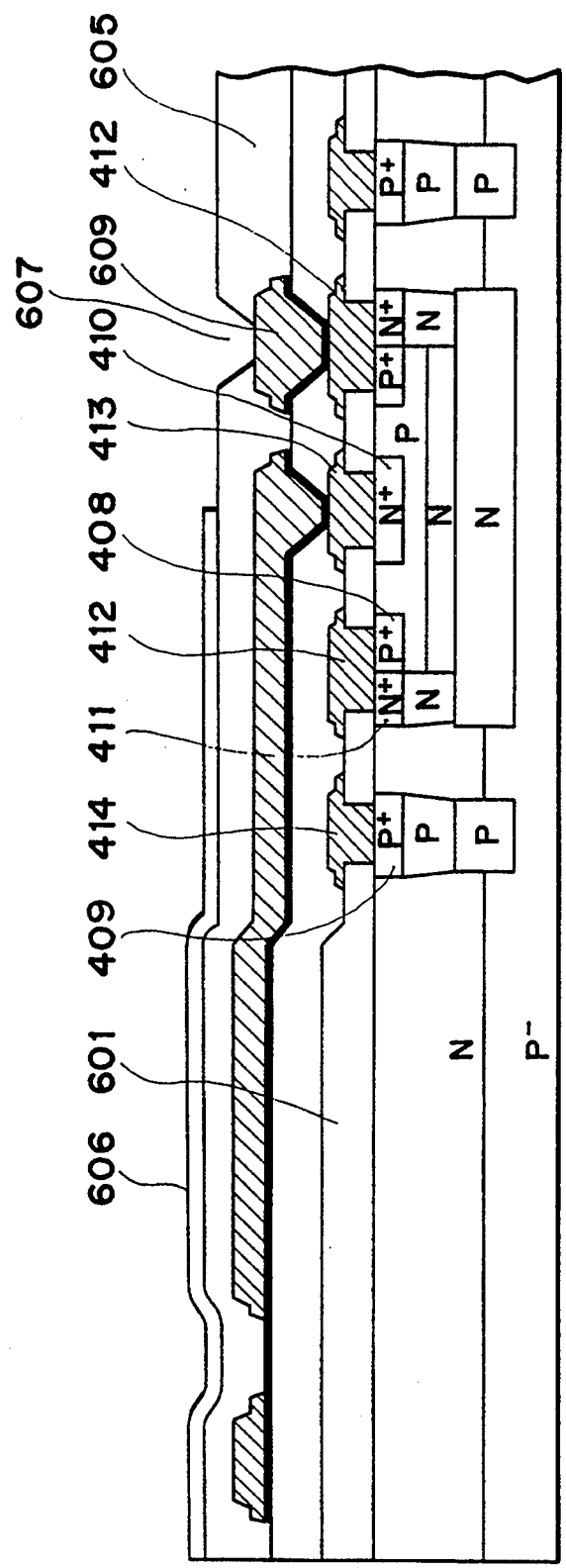
FIG. 40 is a schematic cross-sectional view illustrating an embodiment of a step of the manufacturing method of a substrate for an ink jet recording head and an ink jet recording head according to the present invention.

(8) Thereon, a material layer of Al was deposited for forming a pair of wirings 604 and 604 for the heat-generating portion 610, wiring 604 for the cathode, wiring 609 for the anode, to have a thickness of about 5000 Å, and by patterning Al and $HfB_2$ the heat-generating portion 610 and wiring 604 for wiring to connect to other portion were formed at the same time. The patterning of Al was conducted by the same method as that in (5) (FIG. 39).

(9) A protective layer 605 made of $SiO_2$ film as a protecting layer of the heat generating portion 610 and as an electrical isolation layer between Al wirings 604 was deposited by spattering method or CVD method to have a thickness of about 6000 Å, and after that Ta as a protective layer 606 having anti-cavitation property was deposited on the upper portion of the heat generating portion 610 to a thickness of about 2000Å. The thus formed heat generating portion 610, Ta and the protective film were partly removed to form a pad 607 for bonding. The protective layer 605 may be formed by SiON or SiN in place of $SiO_2$.

Figure 41:
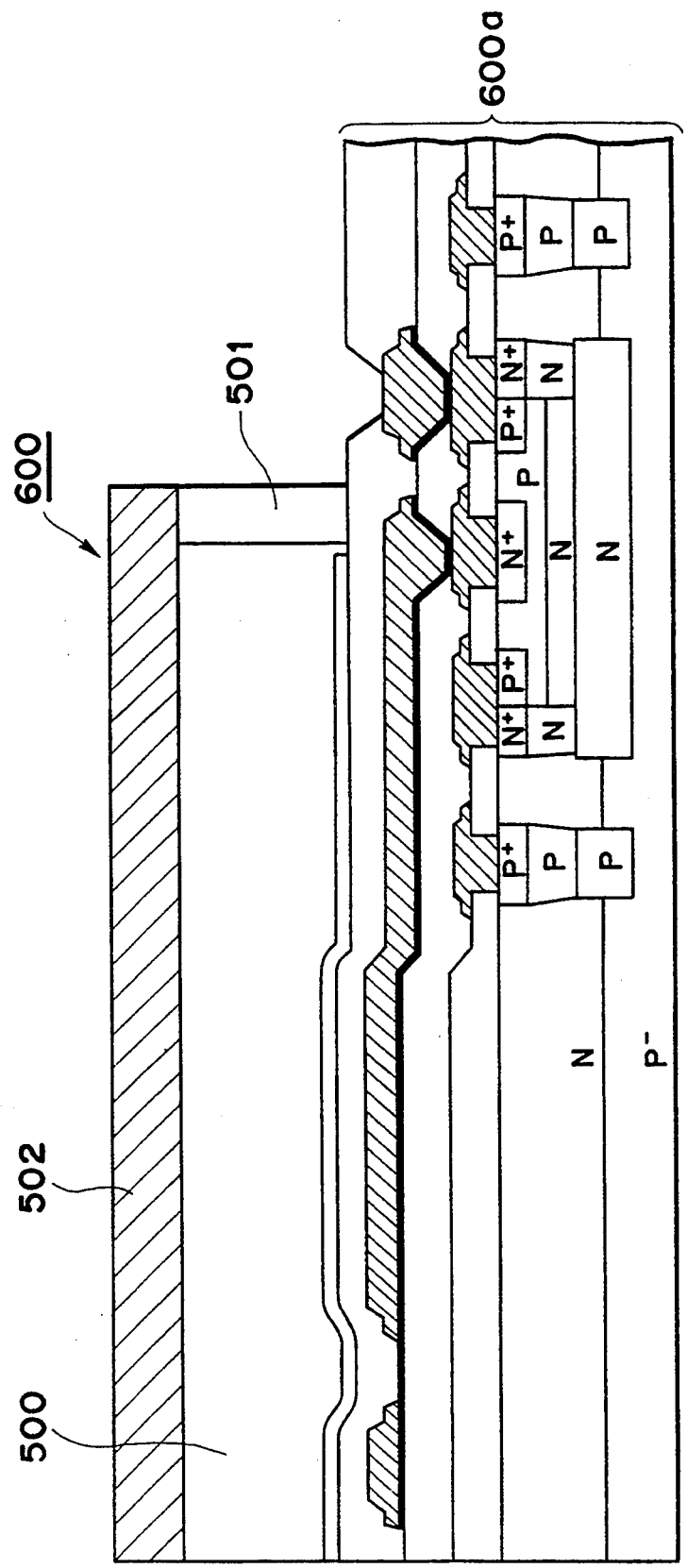
FIG. 41 is a schematic cross-sectional view illustrating an embodiment of a step of the manufacturing method of a substrate for an ink jet recording head and an ink jet recording head according to the present invention.

(10) On the substrate 600 bearing semiconductor functional elements made as aforementioned, a liquid path wall member 501 and a lid 502 for providing a discharging opening 500 were disposed, and a recording heat 600 having a liquid path 505 and a common chamber 504 was prepared (FIG. 41).

Thus manufactured recording head was subjected to recording—operation test by block driving the electrothermal converting portion 610. On the operation test, eight semiconductor diodes was connected to each segment and current of 300 mA (totally 2.4 A) was flown in each semiconductor diode. Other semiconductor diodes did not act mulfunctionally and a sufficient discharging was obtained. Since the above recording head has good heat conductive efficiency, it consumes a driving power of only about 80% of that of a conventional one and showed good high frequency responsibility and still further provided excellent characteristics on the life and uniformity of the products.

In the two times etching of Al as shown in the steps of (5) and (8), by controlling the thickness of etched film in the first etching and the second etching a best step coverage of the interlayer film 602 could be obtained. The results are tabulated in Table 10.

As seen from Table 10, the step coverage of the interlayer film 602 may be much better with a smaller difference in film thickness between the 1st etching and 2nd etching.

Figure 43:
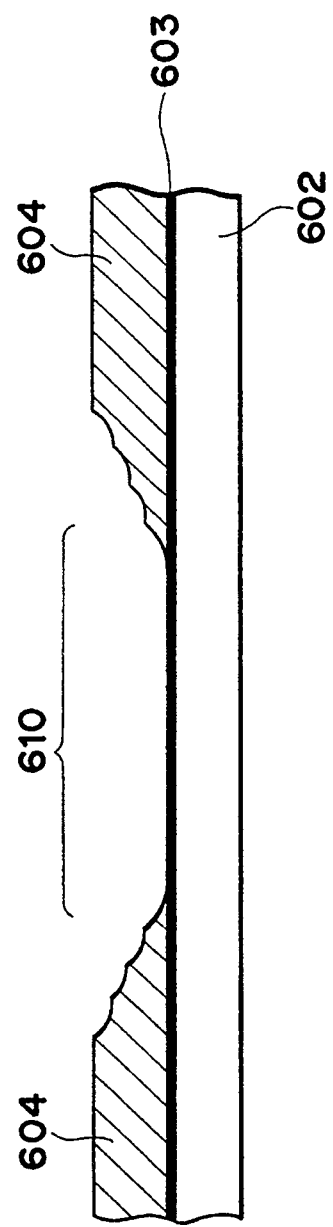
FIG. 43 is a schematic cross-sectional view illustrating another embodiment of a heat generating portion of a substrate for an ink jet recording head according to the present invention.

In the etching of Al in the steps of (5) and (8), by conducting the etching of at least two cycles of Al etching—resist removing—Al etching—resist removing—Al etching, the number of the steps formed on the Al edge surface and side wall can be increased as shown in FIG. 43, in which the cross-sectional view of Al wiring edge face as etched four times is shown. By the method the step coverage of the interlayer film 602 can be achieved much better.

In the case of the substrate 600 a of the above head 600, although all of the connecting face and side faces of wiring 604 made of Al and all side faces of each electrode were formed stepwise, it is not always necessary, if only the face which is perpendicular to the direction of the current flow (the connecting face of the heat-generating portion 610 in the wiring 604) is formed stepwise.

A method for forming such a stepwise edge face will be described below for the wiring 604 as an example by referring to FIG. 44A to E.

After depositing $HfB_2$ as the heat-generating resistance layer 603 and a layer made of Al material as the wiring 604, by repeating two times photolithographic steps the heat-generating resistance layer 603 and the wiring 604 were formed. In this case, as the method for etching the wiring 604, a conventional wet etching or dry etching by RIE utilizing Cl type gas may be usable. By utilizing these methods, the side face of the longitudinal direction of the wiring 604 formed becomes nearly perpendicular to the face of the heat-generating resistance layer 603.

Figure 44A:
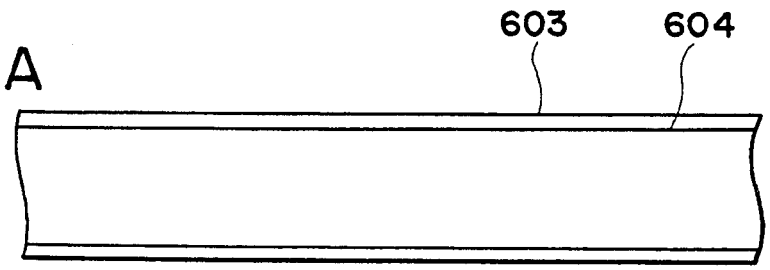
FIGS. 44A to 44E are schematic cross-sectional views and a schematic planar views illustrating another embodiment of a step of the manufacturing method of a heat generating portion of a substrate for an ink jet recording head according to the present invention.
Figure 44B:
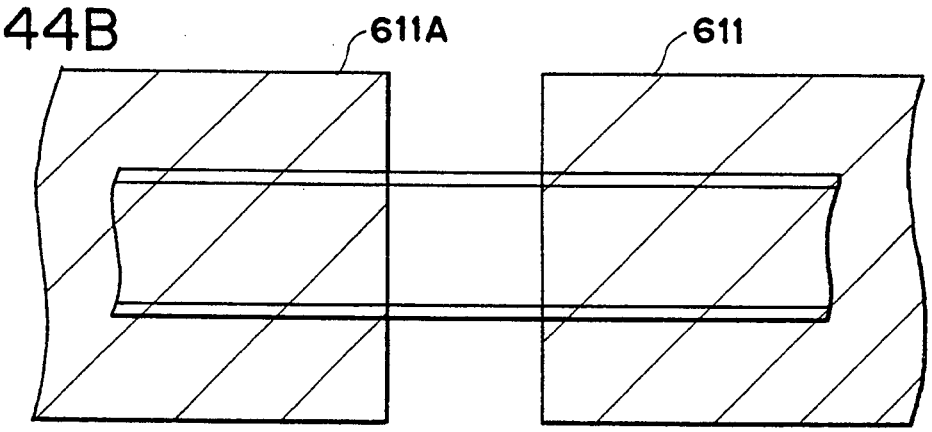
Figure 44C:
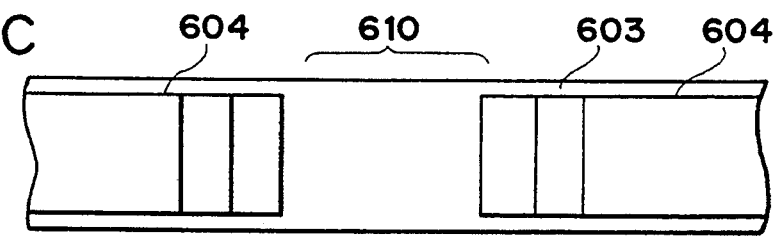
Figure 44D:
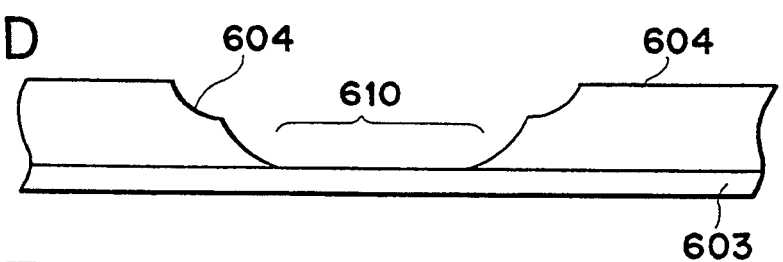
Figure 44E:
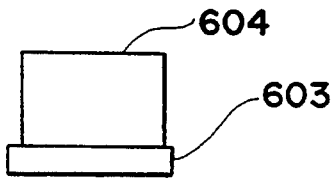

Next, a resist 611 and 611a was coated except a portion corresponding to the heat-generating portion 610 (FIG. 44B), it was immersed in a TMAH aqueous solution by the same manner as described in the manufacturing step (5) of the head 600, by repeating etching and resist removing the region corresponding to the heat-generating portion 610 of the wiring 604 was removed to form the heat-generating portion 610 (FIG. 44C). In this case, the two connecting faces of the heat-generating portion 610 of the wiring 604 were formed stepwise (FIG. 44D) while the side face is formed to be nearly perpendicular to the surface of the lower heat-generating resistance layer 603.

This method may be applicable to any electrode of the above functional elements and only connecting face of the electrode can be formed stepwise.

An ink jet recording apparatus capable of high speed recording with high image quality can be obtained by mounting the thus constituted recording head 510 on the main body of the recording apparatus and by applying a signal from the main body to the recording head 510.

Figure 45:
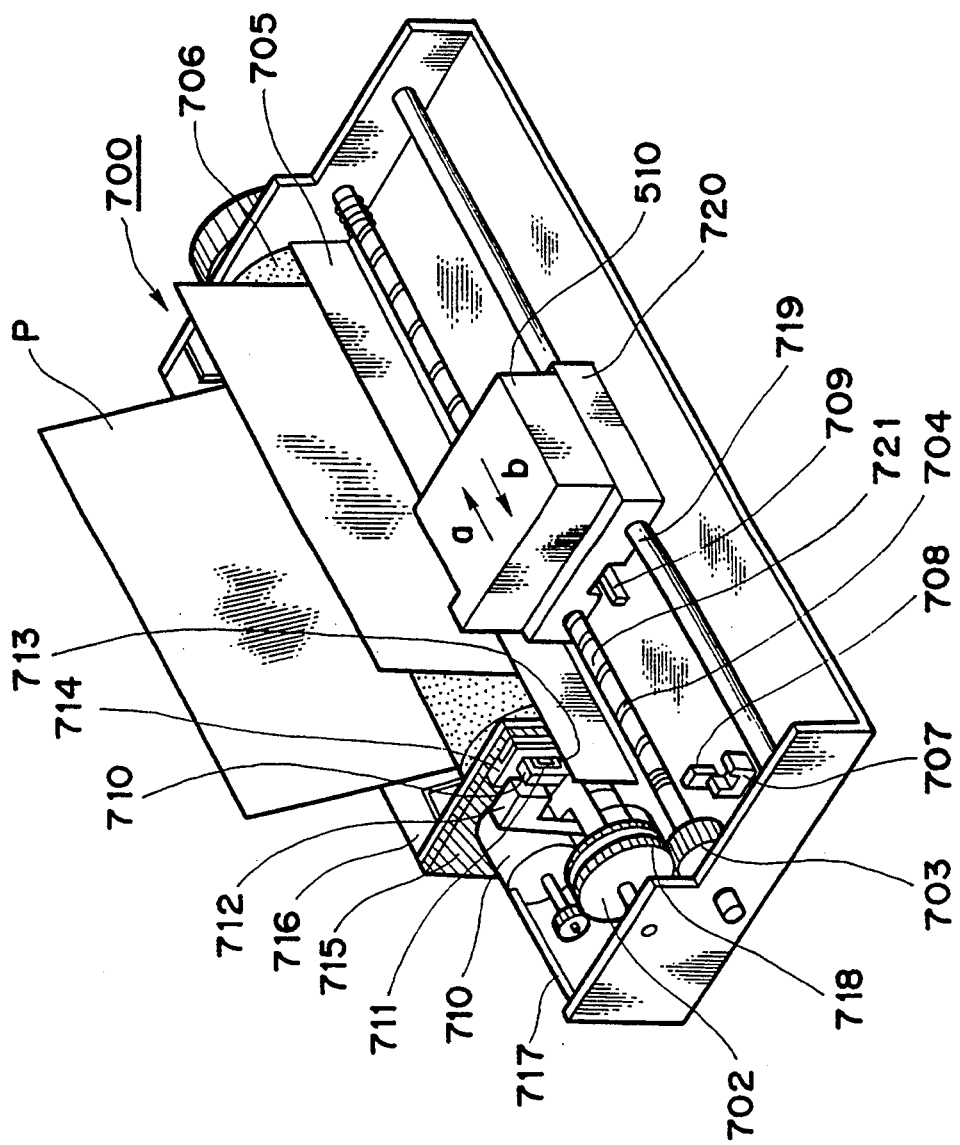
FIG. 45 is a perspective external view illustrating an embodiment of an ink jet recording apparatus capable of mounting a recording head manufactured according to the present invention.

Next, an ink jet recording apparatus employing a recording head according to the present invention will be described referring to FIG. 45. FIG. 45 is a schematic perspective view illustrating an ink jet recording apparatus 700 to which the present invention is applied.

The recording head 510 is mounted on a carriage 720 engaged to a screw groove 721 of a lead screw 704 driven through a driving power transferring gear 702 and 703 linked with reciprocally rotation of a driving motor 701 and the head together with the carriage 720 is driven reciprocally along a guide 719 to the direction of arrow "a" and "b" by the driving force of the motor 701. A pressing board 705 for recording paper P sent to a platen 706 by a recording medium supplying member (not shown), presses the recording paper P against to the platen 706, along the carriage-driven direction.

707 and 708 standing for a photocoupler function as means for detecting the home position by sensing the existence of a lever 709 of the carriage 720 in this region to change the direction of the rotation of the driving motor 701.

710 is a supporting member for supporting a capping member 711 for covering all over the above recording head 510, and 712 is a suction member for suction of the capping member 711 and plays recovering by suction of the recording head 510 through an opening in the cap 713. 714 is a cleaning blade, and 715 is a member capable of transferring the blade 714 back and forth carried on a main body supporting board 716. The cleaning blade 714 is not necessary to have the shape as shown, but a conventional blade naturally is applicable. 717 is a lever for starting the suction for recovery by suction and is transferred depending on the transfer of a cum 718 engaged to carriage 720 and its transfer is controlled by a known manner for transferring such as cratch changing of the driving force from the driving motor 701. The print controlling member for applying a signal to the heat-generating portion 110 or controlling the above mechanism mounted on the recording head 510 is built in the main body of the apparatus but not shown in Figure.

In the ink jet recording apparatus 700 constructed as mentioned above, since the recording head 510 is driven reciprocally over the entire width of the recording paper P sent to the platen 706 from the recording medium supplying apparatus, and since the recording head 510 is prepared made by the above mentioned method, a high speed recording with high accuracy can be achieved.

The present invention is particularly effective for a recording head and also a recording apparatus with ink discharging system utilizing thermal energy among ink jet recording systems.

A typical construction and principle of an ink jet method is disclosed in U.S. Pat. Nos. 4,723,129 and 4,740,796 are used preferably. This method is applicable to either so-called ondemand type or continuous type, and among them especially the ondemand type is effective, because by exposing an electrothermal converting element which is disposed corresponding to a sheet and liquid path retaining liquid (ink) by at least one drive signal corresponding to a recording information which gives rapid temperature rising over a nuclear boiling, thermal energy is generated in the electrothermal converting element and then film boiling takes place at a heat action surface of the recording head, consequently bubble formation corresponding one to one to the drive signal is occurred in the liquid (ink). The liquid (ink) is discharged depending on growing and contraction of the bubble from a discharging opening to form at least one droplet. If the signal is sent as a pulse shape, the growing and contraction is occurred instantaneously and appropriately, consequently a discharging of the liquid (ink) with high responsibility is preferably attained. A pulse shaped drive signal which is disclosed in U.S. Pat. Nos. 4,463,359 and 4,345,262 is preferably used. And also if taking a condition for a rate of temperature rising up on a heat action surface disclosed in U.S. Pat. No. 4,313,124 the more excellent recording is attained.

As a construction of a recording head, a combination of a discharging opening, a pathway and an electrothermal converting element (a linear liquid pathway or rectangular pathway) disclosed in the above mentioned patent descriptions and a construction of a heat action portion disposed at a flexible domain in disclosed in U.S. Pat. Nos. 4,558,333 and 4,459,600 are included in the present invention. In addition, a construction having a common slit to plural electrothermal converting element as a discharging opening of the electrothermal converting element disclosed in Japanese Laid-Open Patent Application No. 59-123670 and a construction having an opening which is capable of absorbing a pressure wave occurred by thermal energy corresponding to a discharging opening disclosed in Japanese Laid- Open Patent Application No. 59-138462 may include effectively in the present invention.

Furthermore, as a full line type recording head capable of simultaneous recording over the entire width of a recording medium, by either a combination of plural recording heads covering the entire width as disclosed in above patent descriptions or a construction of single recording head integrally formed, the more sufficient results can be attained by the method according to the present invention.

In addition, the present invention is effective in an interchangeable chip type recording head capable of receiving ink supply from the main body and electrically connecting therewith when it is mounted on the main body and also in the case of cartridge type recording head formed integrally with the recording head itself.

Also the recording apparatus is preferably provided with the emission recovery means and other auxiliary means for recording head, since the effects of the recording head of the present invention can be stabilized further. Example of such means include capping means, cleaning means, pressurizing or suction means, auxiliary heating means such as an electrothermal converting element, another heating device or a combination thereof and an idle discharging separately from the recording operation are effective for achieving stable recording operation according to the present invention.

Furthermore, the present invention is not limited to a recording head for recording mode for recording a single main color such as black, but is extremely effective also to the recording head for recording plural different colors or full color by color mixing, wherein the recording head is either integrally constructed or is composed of plural units.

Furthermore, the recording head of the present invention is applicable, not only to liquid ink, but also to ink which is solid below room temperature but softens or liquifies at room temperature or which softens or liquifies within a temperature control range from 30° to 70° C., which is ordinarily adopted in the ink jet recording. Thus, ink only needs to be liquidous when the recording signal is given. Besides, the recording head of the present invention can employ ink liquefied by thermal energy provided corresponding to the recording signal, such as the ink in which the temperature increase by thermal energy is intentionally absorbed by the state change from solid to liquid or the ink which remain solid in the unused state for the purpose of prevention of ink evaporation, or the ink which starts to solidify upon reaching the recording sheet. In these cases the ink may be supported as solid or liquid in recesses or holes of a porous sheet, as described in the Japanese Patent Laid-Open Application Nos. 54-56847 and 60-71260, and placed in an opposed state to the electrothermal converting element. The present invention is most effective when the above mentioned film boiling is induced in the ink as the above mentioned.

TABLE 1

Test results

| Angle $\theta$ | Dimensional accuracy of wiring | Variation of wiring resistance | Initial good product ratio | Results of durability test (good product ratio) | Final judgement |
| --- | --- | --- | --- | --- | --- |
| 5° | 16 ± 0.5 μm | 250 ± 4.2 Ω | 138/150 | 104/138 | Δ |
| 28° | ±0.5 μm | ±3.8 Ω | 142/160 | 121/142 | Δ |
| 30° | ±0.5 μm | ±4.1 Ω | 136/150 | 132/136 | ○ |
| 57° | ±0.6 μm | ±6.2 Ω | 140/150 | 140/140 | ○ |
| 70° | ±0.8 μm | ±10.8 Ω | 142/150 | 141/142 | ○ |
| 75° | ±2.4 μm | ±12.5 Ω | 128/150 | 128/128 | ○ |
| 80° | ±3.8 μm | ±81.0 Ω | 80/150 | 45/80 | Δ |

○: Excellent
Δ: Good

TABLE 2

Results of evaluation

| Angle $\theta$ | Dimensional accuracy of wiring | Variation of wiring resistance | Initial good product ratio | Results of durability test (good product ratio) | Final judgement |
| --- | --- | --- | --- | --- | --- |
| 5° | 16 ± 0.5 μm | 250 ± 4.2 Ω | 138/150 | 104/138 | Δ |
| 28° | ±0.5 μm | ±3.8 Ω | 142/150 | 121/142 | Δ |
| 30° | ±0.5 μm | ±4.1 Ω | 136/150 | 132/136 | ○ |
| 57° | ±0.6 μm | ±6.2 Ω | 140/150 | 140/140 | ○ |
| 70° | ±0.8 μm | ±10.8 Ω | 142/150 | 141/142 | ○ |
| 75° | ±2.4 μm | ±12.5 Ω | 128/150 | 128/128 | ○ |
| 80° | ±3.8 μm | ±81.0 Ω | 80/150 | 45/80 | Δ |

○: Excellent
Δ: Good

TABLE 3

Evaluation results

| Angle $\theta$ | Dimensional accuracy of wiring (μm) | Variation of wiring resistance (Ω) | Initial good product ratio | Durability test result (good product ratio) | Final judgement |
| --- | --- | --- | --- | --- | --- |
| 5° | 16 ± 0.5 | 250 ± 4.2 | 138/150 | 104/138 | Δ |
| 28° | ±0.5 | ±3.8 | 142/150 | 121/142 | Δ |

TABLE 3-continued

| | Evaluation results | | | | |
|---|---|---|---|---|---|
| Angle θ | Dimensional accuracy of wiring (μm) | Variation of wiring resistance (Ω) | Initial good product ratio | Durability test result (good product ratio) | Final judgement |
| 30° | ±0.5 | ±4.1 | 136/150 | 132/136 | ○ |
| 57° | ±0.6 | ±6.2 | 140/150 | 140/140 | ○ |
| 70° | ±0.8 | ±10.8 | 142/150 | 141/142 | ○ |
| 75° | ±2.4 | ±12.5 | 128/150 | 128/128 | ○ |
| 80° | ±3.8 | ±81.0 | 80/150 | 45/80 | Δ |

○: Excellent
Δ: Good

TABLE 4

| | Experimental results | | |
|---|---|---|---|
| Concentration (%) | Removed thickness of resist (μm) | Angle θ | Final judgement |
| 1.0 | 0.2 | 28° | ⊿ |
| 1.5 | 0.5 | 45° | ○ |
| 2.0 | 0.9 | 60° | ○ |
| 2.5 | 1.4 | 70° | ○ |
| 3.0 | 2.1 | 75° | ○ |
| 3.5 | 3.0 | 80° | ⊿ |
| 4.0 | 4.2 | 85° | Δ |
| 4.5 | — | — | Δ |
| 5.0 | — | — | Δ |

○: Excellent
⊿: Better
Δ: Good

TABLE 5

| | Evaluation results | | | | |
|---|---|---|---|---|---|
| Angle θ | Dimensional accuracy of wiring (μm) | Variation of wiring resistance (Ω) | Initial good product ratio | Durability test result (good product ratio) | Final judgement |
| 5° | 16 ± 0.5 | 250 ± 4.2 | 138/150 | 104/138 | Δ |
| 28° | ±0.5 | ±3.8 | 142/150 | 121/142 | Δ |
| 30° | ±0.5 | ±4.1 | 136/150 | 132/136 | ○ |
| 57° | ±0.6 | ±6.2 | 140/150 | 140/140 | ○ |
| 70° | ±0.8 | ±10.8 | 142/150 | 141/142 | ○ |
| 75° | ±2.4 | ±12.5 | 128/150 | 128/128 | ○ |
| 80° | ±3.8 | ±81.0 | 80/150 | 45/80 | Δ |

○: Excellent
Δ: Good

TABLE 6

| | | Experimental results | | | |
|---|---|---|---|---|---|
| Liquid temperature (°C.) | Etching rate (Å/min.) | Removed thickness of resist (μm) | Angle θ | Good product ratio (%) | Final judgement |
| 25 | 100 | 2.5 | 80° | 53 | Δ |
| 30 | 330 | 1.8 | 75° | 85 | ○ |
| 35 | 570 | 1.3 | 70° | 95 | ○ |
| 40 | 800 | 1.0 | 63° | 88 | ○ |
| 45 | 1020 | 0.8 | 57° | 93 | ○ |
| 50 | 1250 | 0.6 | 50° | 90 | ○ |
| 55 | 1470 | 0.4 | 38° | 91 | ○ |
| 60 | 1760 | 0.2 | 20° | 52 | Δ |

○: Excellent
Δ: Good

TABLE 7

| | Experimental results | | |
|---|---|---|---|
| | Substrate temperature (°C.) | Hillock suppression | Film quality |
| 1 | 200–350 | ○ | ○ |
| 2 | 100 | ○ | Δ |
| 3 | 150 | ○ | ⊿ |
| 4 | 200 | ○ | ⊿ |
| 5 | 250 | ⊿ | ⊿ |
| 6 | 300 | Δ | ○ |
| 7 | 350 | Δ | ○ |
| 8 | 400 | Δ | ○ |
| 9 | 450 | Δ | ○ |

○: Excellent
⊿: Better
Δ: Good

TABLE 8

| | Experimental results | | |
|---|---|---|---|
| | Substrate temperature (°C.) | Suppression of hillock | Film quality |
| 1 | 200–350 | ○ | ○ |
| 2 | 100 | ○ | Δ |
| 3 | 150 | ○ | ⊿ |
| 4 | 200 | ○ | ⊿ |
| 5 | 250 | ⊿ | ⊿ |
| 6 | 300 | Δ | ○ |
| 7 | 350 | Δ | ○ |
| 8 | 400 | Δ | ○ |
| 9 | 450 | Δ | ○ |

○: Excellent
⊿: Better
Δ: Good

TABLE 9

| | Evaluation results | | | | |
|---|---|---|---|---|---|
| Angle θ | Dimensional accuracy of wiring (μm) | Variation of wiring resistance (Ω) | Initial good product ratio | Durability test result (good product ratio) | Final judgement |
| 5° | 16 ± 0.5 | 250 ± 4.2 | 138/150 | 104/138 | Δ |

TABLE 9-continued

| | Evaluation results | | | | |
|---|---|---|---|---|---|
| Angle θ | Dimensional accuracy of wiring (μm) | Variation of wiring resistance (Ω) | Initial good product ratio | Durability test result (good product ratio) | Final judgement |
| 28° | ±0.5 | ±3.8 | 142/150 | 121/142 | Δ |
| 30° | ±0.5 | ±4.1 | 136/150 | 132/136 | ○ |
| 57° | ±0.6 | ±6.2 | 140/150 | 140/140 | ○ |
| 70° | ±0.8 | ±10.8 | 142/150 | 141/142 | ○ |
| 75° | ±2.4 | ±12.5 | 128/150 | 128/128 | ○ |
| 80° | ±3.8 | ±81.0 | 80/150 | 45/80 | Δ |

○: Excellent
Δ: Good

TABLE 10

| Ratio of film thickness of 1st etching and 2nd etching (The total thickness stands for as 10) | Film thickness of 1st etching | 2 | 4 | 5 | 6 | 8 |
|---|---|---|---|---|---|---|
| | Film thickness of 2nd etching | 8 | 6 | 5 | 4 | 2 |
| Step coverage of interlaminar film 102 | | Δ | ○ | ○ | ○ | Δ |

○: Excellent
Δ: Good

What is claimed is:

1. A method for producing a substrate for a recording head having a plurality of electro-thermal converting elements, a plurality of driving functional elements for respectively driving said electro-thermal converting elements, and a plurality of wiring electrodes for respectively connecting each of said driving functional elements and each of said electro-thermal converting elements, which are formed on a supporting member by photolithography, comprising the step of:
   forming said wiring electrodes by etching a material layer for said wiring electrodes while etchingwise removing a photoresist for masking said material layer for said wiring electrodes.

2. A method according to claim 1, wherein said wiring electrodes are formed by etching said material layer for said wiring electrodes while etchingwise removing said photoresist for masking said material layer for said wiring electrodes by spraying alternatively an etching liquid for said wiring electrodes and an alkaline solution comprising tetramethylammonium hydroxide.

3. A method according to claim 1, wherein said wiring electrodes are formed by etching said material layer for said electrode wiring while etchingwise removing said photoresist for masking said material layer for said wiring electrodes by spraying alternatively two kinds of alkaline solutions comprising tetramethylammonium hydroxide kept at different temperatures.

4. A method according to claim 1, wherein said material layer for said wiring electrodes is an aluminum layer.

5. A method according to claim 2, wherein a concentration of tetramethylammonium hydroxide in said alkaline solution is 1.5-3.0%.

6. A method according to claim 3, wherein a concentration of tetramethylammonium hydroxide in said alkaline solutions is 1.5-3.0%.

7. A method according to claim 2, further comprising a step of developing said photoresist for masking using an alkaline solution comprising tetramethylammonium hydroxide kept at 30°-55° C.

8. A method according to claim 3, further comprising a step of developing said photoresist for masking using an alkaline solution comprising tetramethylammonium hydroxide kept at 35°-55° C.

9. A method for producing a recording head including a substrate forming step of forming a substrate for said recording head by forming on a supporting member by photolithography a plurality of electro-thermal converting elements, a plurality of driving functional elements for respectively driving said electro-thermal converting elements and a plurality of wiring electrodes for respectively connecting each of said electro-thermal converting elements and each of said driving functional elements and an ink discharging portion forming step of forming an ink discharging portion having a plurality of ink discharging openings for discharging an ink on said substrate for said recording head, comprising the step of:
   forming said wiring electrodes by etching a material layer for said wiring electrodes while etchingwise removing a photoresist for masking said material layer for said wiring electrodes in the step of forming said substrate.

10. A method according to claim 9, wherein in the wiring electrode etching step, said wiring electrodes are formed by etching said material layer while etchingwise removing said photoresist for masking said material layer for said wiring electrodes by spraying alternatively an etching liquid for said wiring electrodes and an alkaline solution comprising tetramethylammonium hydroxide.

11. A method according to claim 9, wherein in the wiring electrode etching step, said wiring electrodes are formed by etching said material layer while etchingwise removing said photoresist for masking said material layer for said wiring electrodes by spraying alternatively two kinds of alkaline solutions comprising tetramethylammonium hydroxide kept at different temperatures.

12. A method according to claim 9, wherein said material layer for said wiring electrodes is an aluminum layer.

13. A method according to claim 10, wherein a concentration of tetramethylammonium hydroxide in said alkaline solution is 1.5-3.0%.

14. A method according to claim 11, wherein a concentration of tetramethylammonium hydroxide in said alkaline solution is 1.5-3.0%.

15. A method according to claim 10, further comprising a step of developing said photoresist for masking using an alkaline solution comprising tetramethylammonium hydroxide kept at 30°-55° C.

16. A method according to claim 11, further comprising a step of developing said photoresist for masking using an alkaline solution comprising tetramethylammonium hydroxide kept at 30°–50° C.

17. A method for producing a substrate for an ink jet recording head having a group of electro-thermal converting elements, a group of functional elements for respectively driving each of said group of electro-thermal converting elements, and a group of wiring electrodes for connecting each of said group of functional elements and said electro-thermal converting elements, which are formed on a supporting member by photolithography, comprising the step of:

forming stepwise the connecting face of each electrode of said group of wiring electrodes by etching plural times while etchingwise removing a photoresist for masking.

18. A method according to claim 17, wherein in the wiring electrode group etching step, the side face of each electrode of said group of wiring electrodes together with the connecting face of said electrode is etched plural times to be shaped stepwise.

19. A method according to claim 17, wherein in the wiring electrode group etching step, the etching is effected by immersing a material layer for said wiring electrodes alternatively in an etching liquid for said wiring electrodes and in an aqueous solution comprising tetramethyl ammonium hydroxide for etching said photoresist for masking.

20. A method according to claim 17, wherein said material for wiring electrodes is aluminum.

21. A method for producing an ink jet recording head including a substrate forming step of forming by photolithography a substrate by forming a group of electro-thermal converting elements, a group of functional elements for respectively driving each of said group of electro-thermal converting elements, and a group of wiring electrodes for connecting each of said group of functional elements and said electro-thermal converting elements on a supporting member and an ink discharge portion forming step of forming an ink discharging portion having a plurality of ink discharging openings for discharging an ink on said substrate comprising a step of:

forming stepwise the connecting face of each electrode of said group of wiring electrodes by etching plural times while etchingwise removing a photoresist for masking in the substrate forming step.

22. A method according to claim 21, wherein in the wiring electrode group etching step, the side face of each electrode of said group of wiring electrodes together with the connecting face of said electrode is etched plural times to be shaped stepwise.

23. A method according to claim 12, wherein in the wiring electrode group etching step, the etching is effected by immersing a material layer for said wiring electrodes alternatively in an etching liquid for said wiring electrodes and in an aqueous solution comprising tetramethyl ammonium hydroxide for etching said photoresist for masking.

24. A method according to claim 21, wherein said material for wiring electrodes is aluminum.

25. A method for producing a substrate for a recording head having a plurality of electro-thermal converting elements, driving functional elements for respectively driving said electro-thermal converting elements, a plurality of wiring electrodes for respectively connecting each of said driving functional elements and each of said electro-thermal converting elements and an electrical isolation film formed on said wiring elements, which are formed on a supporting member by photolithography, comprising the step of:

forming said electrical isolation film by depositing a material for said electrical isolation film on said wiring electrodes while changing a temperature of the supporting member from a low temperature to a high temperature.

26. A method according to claim 25, wherein the material for said electrical isolation film is deposited on said wiring electrodes while changing stepwise the temperature of the supporting member from a low temperature to a high temperature.

27. A method according to claim 25, wherein the material for said electrical isolation film is deposited on said wiring electrodes while changing the temperature of the supporting member continuously from a low temperature to a high temperature.

28. A method according to claim 25, wherein the material for said electrical isolation film is deposited on said wiring electrodes at a supporting member temperature of 150°–250° C. and then further deposited thereon at a supporting member temperature of 250°–450° C. of support temperature.

29. A method according to claim 25, wherein the deposition of the electrical isolation film is deposited by a CVD method.

30. A method according to claim 29, wherein the CVD method is a plasma CVD method.

31. A method according to claim 25, wherein said electrical isolation film is SiO.

32. A method according to claim 25, wherein said electrical isolation film is SiN.

33. A method according to claim 25, wherein said electrical isolation film is $SiO_2$.

34. A method according to claim 25, wherein said electrical isolation film is SiON.

35. A method for producing a substrate for a recording head comprising a plurality of electro-thermal converting elements and driving functional elements for driving each said electro-thermal converting elements, the method comprising the steps of:

forming a P-type semiconductor layer by epitaxial growth on a P-type semiconductor supporting member: and forming said driving functional elements utilizing said P-type semiconductor.

36. A method for producing recording head including a substrate forming step of forming a substrate for said recording head by forming a plurality of electro-thermal converting elements, driving functional elements for driving said each electro-thermal converting element, a plurality of wiring electrodes for connecting said each driving functional element and said electro-thermal converting element and an electrical isolation film provided on said wiring electrodes on a supporting member and an ink discharge portion forming step of forming an ink discharging portion having a plurality of ink discharging openings for discharging an ink on said substrate for said recording head, comprising the step of:

forming said electrical isolation film by depositing a material for said electrical isolation on said wiring electrodes while changing a temperature of the supporting member from a low temperature to a high temperature in the substrate forming step.

37. A method for producing utilizing a photolithography a support for a recording head according to claim 36, wherein the material for said electrical isolation film is deposited on said wiring electrodes while changing stepwise the temperature of the supporting member from a low temperature to a high temperature.

38. A method according to claim 36, wherein the material for said electrical isolation film is deposited on said wiring electrodes while changing the temperature of the supporting member continuously from a low temperature to a high temperature.

39. A method according to claim 36, wherein the material for said electrical isolation film is deposited on said wiring electrodes at a supporting member temperature of 150°–250° C. and then further deposited thereon at a supporting member temperature of 250°–450° C. of support temperature.

40. A method according to claim 36, wherein the deposition of the electrical isolation film is deposited by a CVD method.

41. A method according to claim 40, wherein the CVD method is a plasma CVD method.

42. A method according to claim 36, wherein said electrical isolation film is SiO.

43. A method according to claim 36, wherein said electrical isolation film is SiN.

44. A method according to claim 36, wherein said electrical isolation film is $SiO_2$.

45. A method according to claim 36, wherein said electrical isolation film is SiON.

46. A substrate for a recording head produced according to the method of claim 1, wherein the edge faces of said wiring electrodes have an angle of from 30 degree to 75 degree to the normal line of the surface of said electro-thermal converting element.

47. A recording head produced according to the method of claim 9, wherein, the edge faces of said wiring electrodes have an angle of from 30 degree to 75 degree to the normal line of the surface of said electro-thermal converting element.

48. A recording apparatus comprising the recording head of claim 47 and means for transferring a recording medium to be recorded by the ink discharged from said head while being opposed to said recording head.

49. A substrate for a recording head produced by the method according to claim 17, wherein the edge faces of said wiring electrodes are in the form of steps.

50. A substrate for a recording head produced by the method according to claim 21, wherein the edge faces of said wiring electrodes are in the form of steps.

51. A recording apparatus comprising the recording head of claim 50 and means for transferring a recording medium to be recorded by the ink discharged from said head while being opposed to said recording head.

52. A substrate for a recording head produced by the method according to claim 25.

53. A recording head produced by the method according to claim 36.

54. A recording apparatus comprising the recording head of claim 53 and means for transferring a recording medium to be recorded by the ink discharged from said head, while being opposed to said recording head.

* * * * *

UNITED STATES PATENT AND TRADEMARK OFFICE
CERTIFICATE OF CORRECTION

PATENT NO. : 5,376,231
DATED : December 27, 1994
INVENTOR(S) : SHIGEYUKI MATSUMOTO, ET AL.

It is certified that error appears in the above-indentified patent and that said Letters Patent is hereby corrected as shown below:

COLUMN 1

Line 13, "Particularly" should read --Particularly,--.
Line 57, "pathes" should read --paths--.

COLUMN 2

Line 62, "is" should read --is an--.

COLUMN 3

Line 1, "orates" should read --orate--.
Line 14, "an" should be deleted.
Line 19, "improvement" should read --improving--.
Line 22, "acts" should read --acts as--.
Line 23, "to" should read --the--.
Line 28, "of" should read --of the--.
Line 31, "is" should read --is the--.
Line 34, "tively" should read --tively,--.
Line 37, "as" should read --of--.
Line 39, "through put" should read --throughput-- and "bottle necking" should read --bottleneck--.
Line 44, "therefore" should read --therefore,--.
Line 49, "has prohibit" should read --prohibits--.

COLUMN 4

Line 1, "result" should read --result in--.

COLUMN 5

Line 63, "In according" should read --According--.

UNITED STATES PATENT AND TRADEMARK OFFICE
CERTIFICATE OF CORRECTION

PATENT NO. : 5,376,231
DATED : December 27, 1994
INVENTOR(S) : SHIGEYUKI MATSUMOTO, ET AL.

It is certified that error appears in the above-indentified patent and that said Letters Patent is hereby corrected as shown below:

COLUMN 6

Line 1, "also in" should read --also,--.
Line 6, "film" (first occurrence) should read --film,--.
Line 16, "in" should be deleted.
Line 26, "parastic" should read --parasitic--.

COLUMN 7

Line 62, "invention," should read --invention.--.

COLUMN 8

Line 39, ",head" should read --head--.

COLUMN 9

Line 9, "follows" should read --follows,--.
Line 57, "Further" should read --Further,--.

COLUMN 10

Line 4, "the" should be deleted.
Line 5, "electrodes" should read --electrodes 12,--.
Line 20, "the" (first occurrence) should be deleted.
Line 45, "$104_1$" should read --104-1-- and "$104_2$" should read --104-2--.
Line 64, "In according" should read --According--.

COLUMN 11

Line 11, "Consequently" should read --Consequently,--.
Line 13, "speedy" should read --speedily--.

UNITED STATES PATENT AND TRADEMARK OFFICE
CERTIFICATE OF CORRECTION

PATENT NO. : 5,376,231
DATED : December 27, 1994
INVENTOR(S) : SHIGEYUKI MATSUMOTO, ET AL.

It is certified that error appears in the above-indentified patent and that said Letters Patent is hereby corrected as shown below:

COLUMN 11

Line 25, "grow" should read --growth--.
Line 50, "consequentoy" should read --consequently--.
Line 56, "to faster" should read --faster--.
Line 57, "Also" should read --Also,-- and "parastic" should read --parasitic--.

COLUMN 12

Line 24, "rise" should read --rise to--.
Line 29, "drived," should read --driven,--.
Line 62, "Subsequently" should read --Subsequently,--.

COLUMN 13

Line 18, "thickness" should read --thickness of--.
Line 43, "Succeedingly," should read --Subsequently,--.
Line 52, "removed" should read --removing--.
Line 63, "$1 \times 10$ cm$^{-3}$" should read --$1 \times 10^{20}$cm$^{-3}$--.
Line 64, "oxided" should read --oxidized--.

COLUMN 14

Line 5, "(tetramethyl ammonium" should read --(tetramethylammonium--.
Line 15, "There is not limited" should read --This is not limited to--.
Line 24, "corresponding" should read --corresponding to--.

UNITED STATES PATENT AND TRADEMARK OFFICE
CERTIFICATE OF CORRECTION

PATENT NO. : 5,376,231
DATED : December 27, 1994
INVENTOR(S) : SHIGEYUKI MATSUMOTO, ET AL.

It is certified that error appears in the above-indentified patent and that said Letters Patent is hereby corrected as shown below:

COLUMN 15

Line 38, "by" should be deleted and "twice" should read --two--.
Line 54, "to" should be deleted.

COLUMN 16

Line 19, "to" should be deleted.
Line 23, "tetramethyl ammonium" should read --tetramethylammonium--.
Line 55, "degree" should read --degrees--.
Line 56, "Also" should read --Also,--.

COLUMN 17

Line 2, "forming" should be deleted.
Line 61, "reion" should read --region--.

COLUMN 18

Line 7, "electrode." should read --the electrode,--.
Line 15, "degree" should read --degrees--.
Line 34, "thickness" should read --thickness of--.
Line 42, "degree" should read --degrees--.
Line 58, "a" should be deleted.

COLUMN 19

Line 15, "degree" should read --degrees--.
Line 18, "Next" should read --Next,--.
Line 53, "Next" should read --Next,--.

UNITED STATES PATENT AND TRADEMARK OFFICE
CERTIFICATE OF CORRECTION

PATENT NO. : 5,376,231
DATED : December 27, 1994
INVENTOR(S) : SHIGEYUKI MATSUMOTO, ET AL.

It is certified that error appears in the above-indentified patent and that said Letters Patent is hereby corrected as shown below:

COLUMN 20

Line 10, "Next" should read --Next,--.
Line 22, "in" should be deleted.
Line 45, "the" (first occurrence) should be deleted.
Line 62, "Next" should read --Next,--.

COLUMN 21

Line 30, "thickness" should read --thickness of--.

COLUMN 22

Line 7, "trode." should read --trode,--.
Line 14, "degree" should read --degrees--.
Line 18, "spattering" should read --sputtering--.
Line 20, "There" should read --This--.
Line 21, "ited" should read --ited to-- and "is" should read --is also--.
Line 29, "corresponding" should read --corresponding to--.
Line 40, "degree" should read --degrees--.
Line 45, "spattering" should read --sputtering--.
Line 61, "500" should read --500,--.
Line 63, "a" (second occurrence) should read --an--.
Line 65, "Thus" should read --Thus, a--.

COLUMN 23

Line 16, "degree." should read --degrees.--.
Line 29, "degree." should read --degrees.--.
Line 30, "Next" should read --Next,--.
Line 54, "Next" should read --Next,--.

UNITED STATES PATENT AND TRADEMARK OFFICE
CERTIFICATE OF CORRECTION

PATENT NO. : 5,376,231
DATED : December 27, 1994
INVENTOR(S) : SHIGEYUKI MATSUMOTO, ET AL.

It is certified that error appears in the above-indentified patent and that said Letters Patent is hereby corrected as shown below:

COLUMN 24

Line 29, "In according" should read --According--.
Line 37, "degree," should read --degrees,--.
Line 55, "forming" should be deleted.

COLUMN 26

Line 1, "degree" should read --degrees--.
Line 5, "spattering" should read --sputtering--.
Line 28, "degree" should read --degrees--.
Line 32, "spattering" should read --sputtering--.
Line 57, "(totaly" should read --(totally--.

COLUMN 27

Line 5, "degree." should read --degrees.--.
Line 16, "degree." should read --degrees.--.
Line 20, "for" should read --for a--.
Line 33, "40°C." should read --40°C,--.
Line 37, "degree." should read --degrees.--.
Line 41, "In" should read --In the--.

COLUMN 28

Line 10, "quently" should read --quently,--.
Line 34, "a" should be deleted.

COLUMN 29

Line 6, "spattering" should read --sputtering--.
Line 20, "simultaneously" should read --simultaneously formed--.

UNITED STATES PATENT AND TRADEMARK OFFICE
CERTIFICATE OF CORRECTION

PATENT NO. : 5,376,231
DATED : December 27, 1994
INVENTOR(S) : SHIGEYUKI MATSUMOTO, ET AL.

It is certified that error appears in the above-indentified patent and that said Letters Patent is hereby corrected as shown below:

COLUMN 29

Line 26, "Further" should read --Further,--.

COLUMN 30

Line 1, "relatively but" should read --a--.
Line 3, "method," should read --methods,--.
Line 28, "make" should read --made--.
Line 29, "degree" should read --degrees--.
Line 55, "spattering" should read --sputtering--.

COLUMN 31

Line 27, "(totaly" should read --(totally--.
Line 46, "Subsequently" should read --Subsequently,--.

COLUMN 32

Line 31, "formed" should read --forming--.
Line 39, "spattering" should read --sputtering--.
Line 47, "removed" should read --removing--.
Line 63, "ing" should read --ing of--.

COLUMN 33

Line 22, "the term" should read --terms--.
Line 25, "the term" should read --terms--.
Line 26, "failr" should read --fairly--.

UNITED STATES PATENT AND TRADEMARK OFFICE
CERTIFICATE OF CORRECTION

PATENT NO. : 5,376,231
DATED : December 27, 1994
INVENTOR(S) : SHIGEYUKI MATSUMOTO, ET AL.

It is certified that error appears in the above-indentified patent and that said Letters Patent is hereby corrected as shown below:

COLUMN 34

Line 2, "make" should read --made-- and "degree" should read --degrees--.
Line 55, "(totaly" should read --(totally--.
Line 66, "degree" should read --degrees--.

COLUMN 35

Line 1, "degree" should read --degrees--.
Line 3, "degree" should read --degrees-- and "a" should be deleted.
Line 8, "at" should read --at the--.
Line 11, "However" should read --However,--.
Line 14, "degree" should read --degrees--.
Line 16, "to" should be deleted.
Line 22, "gree" should read --grees--.
Line 59, "formed a" should read --formed--.
Line 63, "spattering" should read --sputtering--.

COLUMN 36

Line 15, "spattering" should read --sputtering--.
Line 17, "spattering" should read --sputtering--.
Line 18, "view" should read --views--.
Line 22, "step wise" should read --stepwise--.
Line 31, "spattering" should read --sputtering--.
Line 41, "further" should read --further,--.

COLUMN 37

Line 1, "a" should read --an--.
Line 4, "to" should be deleted.

UNITED STATES PATENT AND TRADEMARK OFFICE
CERTIFICATE OF CORRECTION

PATENT NO. : 5,376,231
DATED : December 27, 1994
INVENTOR(S) : SHIGEYUKI MATSUMOTO, ET AL.

It is certified that error appears in the above-indentified patent and that said Letters Patent is hereby corrected as shown below:

COLUMN 37

Line 5, "Also" should read --Also,--.
Line 6, "parastic" should read --parasitic--.
Line 27, "numbers" should read --number--.
Line 32, "To brief" should read --As a brief--.
Line 38, "Then" should read --Then,--.
Line 40, "bias consequently" should read --bias, consequently,--.
Line 42, "rise" should read --rise to--.
Line 47, "drived, consequently" should read --driven, consequently,--.

COLUMN 38

Line 14, "Subsequently" should read --Subsequently,--.

COLUMN 39

Line 15, "electrode. A" should read --electrode, a--.
Line 57, "spattering" should read --sputtering--.

COLUMN 40

Line 18, "spattering" should read --sputtering--.
Line 38, "was" should read --were--.
Line 66, "a" should be deleted.

COLUMN 41

Line 50, "reciprocally" should read --reciprocal--.
Line 56, "to" should be deleted.

UNITED STATES PATENT AND TRADEMARK OFFICE
CERTIFICATE OF CORRECTION

PATENT NO. : 5,376,231
DATED : December 27, 1994
INVENTOR(S) : SHIGEYUKI MATSUMOTO, ET AL.

It is certified that error appears in the above-indentified patent and that said Letters Patent is hereby corrected as shown below:

COLUMN 42

Line 6, "cum" should read --cam--.
Line 30, "ondemand" should read --on-demand--.
Line 31, "ondemand" should read --on-demand--.
Line 39, "consequently" should read --consequently,--.
Line 46, "consequently" should read --consequently,--.
Line 50, "also" should read --also,--.
Line 59, "in" should read --is--.

COLUMN 43

Line 18, "Also" should read --Also,--.

COLUMN 44

Line 20, "remain" should read --remains--.
TABLE 1, "142/160" should read --142/150--.

COLUMN 49

Line 26, "tetramethyl ammonium" should read --tetramethylammonium--.
Line 57, "tetramethyl ammonium" should read --tetramethylammonium--.

COLUMN 50

Line 44, "member:" should read --member;--.
Line 47, "producing" should read --producing a--.
Line 66, "producing" should read --producing a recording head--.

UNITED STATES PATENT AND TRADEMARK OFFICE
CERTIFICATE OF CORRECTION

PATENT NO. : 5,376,231
DATED : December 27, 1994
INVENTOR(S) : SHIGEYUKI MATSUMOTO, ET AL.

It is certified that error appears in the above-indentified patent and that said Letters Patent is hereby corrected as shown below:

<u>COLUMN 52</u>

```
Line 1, "degree" (both occurrences) should read --degrees--.
Line 5, "degree" should read --degrees--.
Line 6, "degree" should read --degrees--.
```

Signed and Sealed this

Eighth Day of August, 1995

Attest:

BRUCE LEHMAN

*Attesting Officer*   Commissioner of Patents and Trademarks